(12) United States Patent
Feng et al.

(10) Patent No.: US 11,530,485 B2
(45) Date of Patent: Dec. 20, 2022

(54) ULTRALIMIT ALLOY AND PREPARATION METHOD THEREFOR

(71) Applicant: KUNMING UNIVERSITY OF SCIENCE AND TECHNOLOGY, Yunnan (CN)

(72) Inventors: Jing Feng, Yunnan (CN); Fushuo Wu, Yunnan (CN); Qi Zheng, Yunnan (CN); Kailong Yang, Yunnan (CN); Chao Li, Yunnan (CN); Peng Song, Yunnan (CN); Xiaoyu Chong, Yunnan (CN); Zhenhua Ge, Yunnan (CN); Lin Chen, Yunnan (CN); Jun Wang, Yunnan (CN)

(73) Assignee: KUNMING UNIVERSITY OF SCIENCE AND TECHNOLOGY, Yunnan (CN)

( * ) Notice: Subject to any disclaimer, the term of this patent is extended or adjusted under 35 U.S.C. 154(b) by 0 days.

(21) Appl. No.: 17/419,250

(22) PCT Filed: Nov. 12, 2019

(86) PCT No.: PCT/CN2019/117283
§ 371 (c)(1),
(2) Date: Jan. 30, 2022

(87) PCT Pub. No.: WO2020/134655
PCT Pub. Date: Jul. 2, 2020

(65) Prior Publication Data
US 2022/0154347 A1    May 19, 2022

(30) Foreign Application Priority Data

Dec. 29, 2018 (CN) .......................... 201811640624.4
Dec. 29, 2018 (CN) .......................... 201811640741.0
(Continued)

(51) Int. Cl.
C23C 28/00 (2006.01)
C23C 4/073 (2016.01)
(Continued)

(52) U.S. Cl.
CPC ............ C23C 28/3215 (2013.01); C23C 4/02 (2013.01); C23C 4/073 (2016.01); C23C 4/11 (2016.01);
(Continued)

(58) Field of Classification Search
CPC . C23C 28/3215; C23C 28/3455; C23C 28/30; C23C 28/32; C23C 28/321;
(Continued)

(56) References Cited

U.S. PATENT DOCUMENTS 5,942,337 A * 8/1999 Rickerby ............ C23C 28/3455
428/629
6,652,987 B2 * 11/2003 Allen .................... C23C 28/321
416/241 B
(Continued)

FOREIGN PATENT DOCUMENTS

CN        1986889 A     6/2007
CN     106435446 A     2/2017
(Continued)

Primary Examiner — Michael P Wieczorek
(74) Attorney, Agent, or Firm — Global IP Services; Tianhua Gu

(57) ABSTRACT

The present disclosure belongs to the field of preparation technology and provides an ultralimit alloy and a preparation method therefor. The ultralimit alloy comprises an alloy matrix. A bonding layer and a ceramic layer are successively deposited on a surface of the alloy matrix. The alloy matrix includes one of a magnesium alloy matrix, an aluminium alloy matrix, a titanium alloy matrix, an iron alloy matrix, a nickel alloy matrix, a copper alloy matrix, a zirconium alloy, and a tin alloy. For an ultralimit magnesium alloy, an
(Continued)

ultralimit aluminium alloy, an ultralimit nickel alloy, an ultralimit titanium alloy, an ultralimit iron alloy and an ultralimit copper alloy, the bonding layer is a composite bonding layer, the ceramic layer is a composite ceramic layer, and the outside of the composite ceramic layer is further successively deposited with a reflecting layer, a catadioptric layer, an insulating layer and a carbon foam layer.

17 Claims, 8 Drawing Sheets

(30) Foreign Application Priority Data

| Dec. 29, 2018 | (CN) | 201811640744.4 |
|---|---|---|
| Dec. 29, 2018 | (CN) | 201811640785.3 |
| Dec. 29, 2018 | (CN) | 201811645669.0 |
| Dec. 29, 2018 | (CN) | 201811645702.X |
| Dec. 29, 2018 | (CN) | 201811645718.0 |
| Dec. 29, 2018 | (CN) | 201811645724.6 |

(51) Int. Cl.
- *C23C 4/11* (2016.01)
- *C23C 4/02* (2006.01)
- *C23C 14/08* (2006.01)

(52) U.S. Cl.
CPC ........ *C23C 14/083* (2013.01); *C23C 28/3455* (2013.01)

(58) Field of Classification Search
CPC ..... C23C 28/341; C23C 28/343; C23C 28/42; C23C 4/073; C23C 4/11; C23C 4/02; C23C 30/00; C23C 30/005; C23C 26/00
See application file for complete search history.

(56) References Cited

U.S. PATENT DOCUMENTS

| 7,001,859 B2 | 2/2006 | Nasa | |
| 10,060,018 B2* | 8/2018 | Lahoda | C23C 28/341 |
| 2011/0142384 A1* | 6/2011 | Hofmann | C23C 28/048 |
| | | | 384/42 |

FOREIGN PATENT DOCUMENTS

| CN | 106497522 A | 3/2017 |
| CN | 106747670 A | 5/2017 |
| CN | 108441807 A | 8/2018 |
| CN | 109468639 A | 3/2019 |
| CN | 109487195 A | 3/2019 |
| CN | 109487196 A | 3/2019 |
| CN | 109554707 A | 4/2019 |
| CN | 109554708 A | 4/2019 |
| CN | 109609952 A | 4/2019 |
| CN | 109609953 A | 4/2019 |
| CN | 109719414 A | 5/2019 |
| RU | 2423551 A | 2/2010 |

* cited by examiner

ULTRALIMIT ALLOY AND PREPARATION METHOD THEREFOR

CROSS REFERENCE TO RELATED PATENT APPLICATION

The present application is the US national stage of PCT/CN2019/117283 filed on Nov. 12, 2019. The PCT/CN2019/117283 claims priorities of a Chinese Patent Applications No. 201811645702X, filed on Dec. 29, 2018, a Chinese Patent Applications No. 2018116406244, filed on Dec. 29, 2018, a Chinese Patent Applications No. 2018116407410, filed on Dec. 29, 2018, a Chinese Patent Applications No. 2018116407444, filed on Dec. 29, 2018, a Chinese Patent Applications No. 2018116407853, filed on Dec. 29, 2018, a Chinese Patent Applications No. 2018116456690, filed on Dec. 29, 2018, a Chinese Patent Applications No. 2018116457180, filed on Dec. 29, 2018, a Chinese Patent Applications No. 2018116457246, filed on Dec. 29, 2018; all referred applications are incorporated herein by reference.

TECHNICAL FIELD

The present disclosure relates to the field of alloy metal materials, in particular, to an ultralimit metal (magnesium, aluminum, nickel, titanium, iron, copper, zirconium or tin) alloy and a preparation method therefor.

BACKGROUND

With the development of technology and the actual needs of society, the requirements for the speed of aircraft are getting higher. The increase in the speed of the aircraft means that the operating speed and the service temperature of the engine will increase, which means the temperatures of the engine blades, gear casing, oil pump, and oil pipes will also increase. In the research process of improving the flight speed of the aircrafts, alloys with high melting point such as iron alloy are usually used as the main structural materials for the production of aircrafts to adapt to the increased engine temperature. However, iron alloys are heavy. Using iron alloys as raw materials for aircraft engines will result in a dramatic rise in the weight of aircraft engines, which will slow down the flight speed of the aircraft, making it unable to meet the actual needs. However, if the speed of the aircraft is increased without changing the materials, the service life of the aircraft will be shortened.

As an important metal material, magnesium alloy has the advantages of low density (about 1.8 $g/cm^3$), high strength, large elastic modulus, good heat dissipation ability, good shock-weakening capacity, high impact load capacity, and good corrosion resistance to organics and alkalis. Magnesium alloys are mainly used in industries such as aviation, aerospace, transportation, chemical industry and rockets. Magnesium alloys are the lightest metal structural materials used in manufacturing industries such as aircraft, spacecraft, rocket and missile, and are mainly used in the manufacture of low load-bearing components. Magnesium alloys are very stable in gasoline, kerosene and lubricating oil. Therefore, gear casings, oil pumps and oil pipes of engines are usually made of magnesium alloys. The melting point of magnesium alloy is about 650° C., and the service temperature is about 70% of its melting point. Magnesium alloy can be easily oxidized at high temperature. Therefore, when the aircraft speeds up, magnesium alloys cannot be used under conditions where the temperature of each part of the engine rises, i.e., the magnesium alloys cannot be used under an ultralimit temperature (the ultralimit temperature of magnesium alloy is a temperature beyond the melting point of the magnesium alloy).

Aluminum alloy is one of the most widely used non-ferrous metal structural materials in industry. Aluminum alloy has excellent properties such as low density, high strength, excellent plasticity, good electrical conductivity and good corrosion resistance. Aluminum alloy is widely used in aviation, aerospace, automobile, machinery manufacturing, shipbuilding and chemical industries, especially in the field of aviation and aerospace. The amount of high-strength aluminum alloy used in commercial aircraft has reached more than 80% of the structural mass of commercial aircraft due to its excellent comprehensive performance. Therefore, high strength aluminum alloy has been widely valued by the global aviation industry. All kinds of aircraft use aluminum alloy as the main structural material. The skins, spars, ribs, stringers, bulkheads and undercarriages on the aircraft can all be made of aluminum alloys. Currently, the melting point of aluminum alloy is about 650° C. The service temperature of aluminum alloy is about 70% of its melting point, which cannot meet the requirements for use at ultralimit temperature (the ultralimit temperature of aluminum alloy is a temperature beyond the melting point of the aluminum alloy) and cannot meet the requirements for use after the aircraft is accelerated. Therefore, the use of aluminum alloy is restricted during the development of aircraft.

Nickel alloy refers to an alloy composed of nickel as a matrix and added with other elements. Nickel has good mechanical, physical and chemical properties, and nickel alloys formed by adding suitable elements with nickel have strong oxidation resistance, corrosion resistance and high-temperature strength, and can improve certain physical properties. Therefore, nickel alloys are widely used in the fields of energy development, chemical industry, electronics, navigation, aviation and aerospace. Nickel alloys have played an irreplaceable role in the aerospace field due to their excellent comprehensive performance such as high strength, high hardness, shock resistance, corrosion resistance, oxidation resistance, high-temperature strength and certain physical properties. In the aerospace field, nickel alloys are commonly used to produce blades for aircraft engines. Engines are very important to aircraft and equivalent to the heart of the aircraft, and the blades are equivalent to the heart of the engine. Therefore, the requirements for the heat resistance of nickel alloys are very high. With the development of technology and the actual needs of society, the requirements for the speed of aircraft are getting higher. The increase in the speed of the aircraft means that the operating speed of the engine will increase, which leads to a gradual increase in the surface temperature of the engine blades. However, currently, the melting point of nickel alloy is about 1450° C. The service temperature of nickel alloy is about 70% of its melting point, which cannot meet the requirements for use after the aircraft is accelerated (that is, nickel alloy cannot be used in an ultralimit temperature (the ultralimit temperature of nickel alloy is a temperature beyond the melting point of the nickel alloy)). In other words, in order to increase the speed of aircraft, the service life of the aircraft has to be sacrificed. Therefore, the development of aircraft, and even the development of nickel alloys as a whole have been restricted. The use of nickel alloys has been restricted, reaching a bottleneck.

Titanium alloys have the characteristics of high strength, low specific gravity, good corrosion resistance, high heat resistance, high hardness and good biocompatibility. In the 20th century, titanium-based alloys were widely used in aviation, aerospace, submarine, medical and other fields. The first practical titanium alloy was the Ti-6Al-4V alloy successfully developed by the United States in 1954, which later became the ace alloy in the titanium alloy industry. The amount of Ti-6Al-4V alloy used has accounted for 75-85% of all titanium alloys. Many other titanium alloys may be regarded as modifications of Ti-6Al-4V alloy. Titanium alloys can maintain their mechanical properties at low and ultra-low temperatures. Titanium alloys have good low-temperature performance. Titanium alloys with extremely low interstitial elements, such as TA7, can maintain certain plasticity at −253° C. Titanium alloy is a new important structural material used in the aerospace industry. For example, titanium accounts for 93% of the weight of the aircraft structure in the US SR-71 high-altitude high-speed reconnaissance plane (flight Mach number: 3; flight altitude: 26212 meters; known as an "all-titanium" aircraft).

Although with many excellent performances, the current titanium alloy cannot be used in an ultralimit temperature (the ultralimit temperature of titanium alloy is a temperature beyond the melting point of the titanium alloy). The reason is that: the ultimate-use temperature of the titanium alloy is only 400~500° C., with the increasing demand for aero-engines with high thrust-weight ratio, more stringent requirements have been placed on the performance of various high-temperature component materials; further, softening of metals occurs when they are operated at temperatures above half of their melting points, that is, when the titanium alloy is working in an environment of about 840° C., softening will occur and the performance will be decreased.

Usually, when people think that a material cannot be used in a high-temperature environment, they will seek another material with a higher melting point. For example, people usually think that nickel alloy and iron alloy with higher melting points can replace titanium alloy to work at high temperature. However, such alloys have greater atomic weights, which means that in the case of a same thickness, nickel alloy or iron alloy will be heavier. Therefore, although such alloys can meet the requirements of high temperature, they cannot achieve the effect of light weight. The key to speeding up aircraft lies in the weight of the aircraft, which makes the speed-up of aircraft a bottleneck. Therefore, if the speed of the aircraft is increased without changing the materials, the service life of the aircraft will be shortened.

As an important metal material today, iron alloy is the most important and commonly used metal material in engineering technology. Iron alloy is widely used in machinery, shipbuilding, communications, agriculture, automobiles, transportation, railways, military industry, coal, mining, petroleum, chemical and other fields due to its excellent features such as high strength, numerous varieties and low cost. Iron alloy is known as the backbone of modern industry. Iron alloys have played an irreplaceable role in the aerospace field due to their excellent comprehensive performance such as high strength and hardness.

Though having many excellent performances, iron alloy has a melting point of about 1500° C. Applications of iron alloys under high temperature conditions are sharply limited since iron alloy can be easily oxidized at high temperature. Further, softening of metals occurs when they are operated at temperatures above half of their melting points, that is, when the iron alloy is working in an environment of about 750° C., softening will occur and the performance will be decreased. Therefore, the current iron alloy cannot meet the requirements for use after the aircraft is accelerated (that is, iron alloy cannot be used in an ultralimit temperature (the ultralimit temperature of iron alloy is a temperature beyond the melting point of the iron alloy)). In other words, in order to increase the speed of aircraft, the service life of the aircraft has to be sacrificed. Therefore, the development of aircraft, and even the development of iron alloys as a whole have been restricted. The use of iron alloys has been restricted, reaching a bottleneck.

As an important metal material today, copper alloy refers to an alloy composed of copper as a matrix and added with other elements. Copper has good mechanical, physical and chemical properties. Copper alloys formed by adding suitable elements have strong oxidation resistance, corrosion resistance and high-temperature strength, and can improve certain physical properties. Therefore, copper alloys are widely used in the fields of energy development, chemical industry, electronics, navigation, aviation and aerospace. Copper alloys have played an irreplaceable role in the aerospace field due to their excellent comprehensive performances such as high strength, high hardness, shock resistance, corrosion resistance, oxidation resistance, high-temperature strength and certain physical properties. For example, the lining of the combustion chamber and thrust chamber of a rocket engine can be cooled by the excellent thermal conductivity of copper to ensure that the temperature of the engine is within an allowable range. The combustion chamber lining of the Ariane 5 rocket is made of copper-silver alloy. 360 cooling channels are processed in this lining, and liquid hydrogen is introduced for cooling when the rocket is launched.

Though having many excellent performances, applications of copper alloys under high temperature conditions are sharply limited since copper alloy has a melting point of about 1080° C. and can be easily oxidized at high temperature. Further, softening of metals occurs when they are operated at temperatures above half of their melting points, that is, when the copper alloy is working in an environment of about 540° C., softening will occur and the performance will be decreased. Therefore, the current copper alloy cannot meet the requirements for use after the aircraft is accelerated (that is, copper alloy cannot be used in an ultralimit temperature (the ultralimit temperature of copper alloy is a temperature beyond the melting point of the copper alloy)). In other words, in order to increase the speed of aircraft, the service life of the aircraft has to be sacrificed. Therefore, the development of aircraft, and even the development of copper alloys as a whole have been restricted. The use of copper alloys has been restricted, reaching a bottleneck.

Zirconium alloy refers to an alloy composed of zirconium as a matrix and added with other elements. Zirconium alloy has a very low thermal neutron absorption cross section, high hardness, good ductility and good corrosion resistance. Zirconium alloy is usually used in the field of nuclear technology, such as the production of fuel rods in nuclear reactors. Due to the limitation of the use environment, zirconium alloys must have good high-temperature oxidation resistance and corrosion resistance, be difficult to fall off during use, be convenient for long-term maintenance, and have high stability under extreme environments (such as ultralimit temperatures (which is beyond the melting point)). The melting point of zirconium alloy is about 1850° C. The service temperature of zirconium alloy is about 70% of its melting point. Therefore, the current use of zirconium alloys in nuclear technology still has certain limitations, which makes fuel rods made of zirconium alloys have a shorter service life and cannot operate stably for a long time.

Conventional alloy solder composed of tin and metals such as antimony, silver, indium, gallium has the characteristics of low melting point, non-toxicity and corrosion resistance. Although tin alloy solder has high ductility and corrosion resistance, the use range of tin alloy solder in normal conditions (normal temperature and pressure, and low erosion) is limited due to its low hardness and machining strength. In ultra-limit environments (high temperature, high pressure and high erosion), such as in the aerospace field, the speed of aircraft is getting higher with the development of technology and the actual needs of society, making the aircraft in a high-temperature, high-pressure and high-erosion environment. Due to the low melting point and low strength of tin alloy solder, the welds formed by traditional tin alloy solder are prone to deform and cause failure under an ultralimit temperature (the ultralimit temperature is a temperature beyond the melting point).

Therefore, to expand the use range of tin alloys, it is necessary for tin alloy weld materials to have good high-temperature oxidation resistance and corrosion resistance, have high strength and hardness, be difficult to fall off during use, be convenient for long-term maintenance, and have high stability performance under extreme environments. However, it is difficult for the traditional tin alloy solder to operate stably in an environment of high temperature, high pressure and high erosion for a long time. Therefore, a more stable and practical manufacturing technique is needed to make tin alloy weld materials more widely used.

SUMMARY

The present disclosure provides an ultralimit (magnesium, aluminum, nickel, titanium, iron, copper, zirconium, or tin) alloy and a preparation method therefor.

The first aspect of the present disclosure provides an ultralimit alloy and a preparation method therefor, to solve the problem that the alloy cannot meet the requirements for use at ultralimit temperature.

The first aspect of the present disclosure provides a basic technical solution: a composite bonding layer and a composite ceramic layer are successively deposited on a surface of an alloy matrix; the composite bonding layer includes a bonding layer deposited on the surface of the alloy matrix and a precious metal layer deposited on a surface of the bonding layer; the composite ceramic layer includes a ceramic A layer and a ceramic B layer; the alloy matrix includes one of a magnesium alloy matrix, an aluminum alloy matrix, a nickel alloy matrix, a titanium alloy matrix, an iron alloy matrix and a copper alloy matrix.

The present disclosure has the following beneficial effects:

Through extensive research, the inventors have developed an ultralimit alloy, which can be used at an ultralimit temperature (beyond its melting point). During the development process, it is generally considered that when the environment temperature is higher than the alloy's service temperature, the alloy cannot be used at this temperature, and other alloys with a high melting point will be needed. However, the inventors did the opposite, trying to improve the alloy to meet the needs of aircraft manufacturing. In the process of continuous attempts, the inventors found that, by depositing a certain proportion of coating layer on the surface of the alloy, the service temperature of the alloy could be raised to 100-500° C. higher than the original melting point, which would greatly increase the service temperature of the alloy, which meets the requirements of aircraft manufacturing. In a high-temperature environment, it is very difficult to increase the service temperature of the alloy even by 2-3° C. Therefore, the applicant's research represents a significant advance in the use of alloys.

The technical solution can greatly increase the service temperature of the alloy by depositing a composite bonding layer and a composite ceramic layer on the alloy matrix, to adapt to the use of the alloy at an ultralimit temperature. Depositing a composite bonding layer can improve the bonding effect between the coating layers and the alloy matrix, preventing the coating layers from falling off during use. Depositing a composite ceramic layer can reduce heat conduction, thereby increasing the service temperature of the alloy matrix.

In summary, the first aspect of the present disclosure has the following technical effects:

1. The ultralimit alloy of the present disclosure has excellent high-temperature mechanical and chemical stability, and can be used under conditions exceeding the melting point of the alloy matrix; the use range is enhanced.

2. By depositing a plurality of coating layers on a surface of an alloy matrix, the service temperature of the alloy matrix can be increased to 100-500° C. higher than the melting point of the original alloy matrix, so as to achieve the use of the alloy in an ultralimit environment.

3. The ultralimit alloy of the present disclosure has excellent corrosion resistance, so that the service time under acidic or alkaline conditions is greatly prolonged, and the cost can be saved since the waste caused by material corrosion is reduced.

4. The present disclosure breaks the limitation of the traditional thought that the material must be replaced when the environment temperature is higher than the service temperature of the material. By depositing coating layers on the surface of the material, the service temperature of the material is increased, so that the ultralimit alloy can be applied to the production of the accelerated aircraft without shortening the service life of the aircraft.

Further, a reflecting layer, a catadioptric layer, an insulating layer and a carbon foam layer are successively deposited outside the composite ceramic layer. For ultralimit magnesium alloys, ultralimit aluminum alloys, ultralimit iron alloys, and ultralimit copper alloys, the thickness of the composite bonding layer is 100-200 µm, the thickness of the composite ceramic layer is 150-500 µm, the thickness of the reflecting layer is 10-30 µm, the thickness of the catadioptric layer is 10-30 µm, the thickness of the insulating layer is 10-200 µm, and the thickness of the carbon foam layer is 20-200 µm. For ultralimit nickel alloys, the thickness of the composite bonding layer is 80-200 µm, the thickness of the composite ceramic layer is 150-500 µm, the thickness of the reflecting layer is 10-30 µm, the thickness of the catadioptric layer is 10-30 µm, the thickness of the insulating layer is 10-200 µm, and the thickness of the carbon foam layer is 20-200 µm. For ultralimit titanium alloys, the thickness of the bonding layer is 20-30 µm, the thickness of the precious metal layer is 40-60 µm, the thickness of the composite ceramic layer is 150-500 µm, the thickness of the reflecting layer is 10-30 µm, the thickness of the catadioptric layer is 20-30 µm, the thickness of the insulating layer is 100-200 µm, and the thickness of the carbon foam layer is 20-200 µm.

Beneficial effects: depositing the reflecting layer has the effect of reflecting the heat source, thereby reducing the heat source on the surface of the alloy and increasing the service temperature; depositing the catadioptric layer can block the refraction of infrared rays in the coating layers, thereby reducing the temperature of the alloy matrix and increasing the service temperature of the prepared alloy; the insulating layer can prevent the ionization on the surface of alloy matrix and resist the erosion of charges on the matrix material. When in use, the carbon on the carbon foam layer vaporizes and cools down, and a vaporized film is formed on the surface of the alloy matrix to further prevent heat transfer, thereby increasing the service temperature of the alloy. In this technical solution, the service temperature of the alloy is greatly improved through the various coating layers. In addition, by setting the thickness of the coating layers, the service temperature of the prepared ultralimit alloy can be increased. The weight of the prepared ultralimit alloy is not increased too much, which endows it with the characteristics of light weight and makes it convenient for making aircraft.

Further, the composition of the bonding layer is one or more of MCrAlY, NiAl, NiCr—Al and Mo; MCrAlY is NiCrCoAlY, NiCoCrAlY, CoNiCrAlY or CoCrAlY. The composition of the precious metal layer is one of or an alloy of more of Au, Pt, Ru, Rh, Pd, and Ir.

Beneficial effects: the ratios of the elements in the three materials of NiCrCoAlY, NiCoCrAlY, and CoNiCrAlY are different, so the prepared materials are different; the bonding layer has a good bonding effect, which makes the subsequent coating layers bonds well with the alloy matrix, which reduces the probability of the falling off of the coating layers; precious metals have anti-oxidation properties, which can effectively prevent the diffusion of oxygen into the bonding layer and the alloy matrix at high temperatures, thereby increasing the oxidation resistance and the service life of the coating layers.

Further, the composition of the ceramic A layer is YSZ or rare earth zirconate ($RE_2Zr_2O_7$). The composition of the ceramic B layer is $ZrO_2$-$RETaO_4$. The ceramic A layer is close to the precious metal layer, or, the ceramic B layer is close to the precious metal layer.

Beneficial effects: YSZ or rare earth zirconate is commonly used as a thermal barrier coating and is easily available. $ZrO_2$-$RETaO_4$ has the properties of low thermal conductivity and high expansion coefficient. Low thermal conductivity can reduce heat conduction, so that the alloy matrix keeps low temperature in a high temperature environment, thus improving the service temperature of the prepared alloy. The high expansion coefficient of $ZrO_2$-$RETaO_4$ is to match the thermal expansion coefficient of the bonding layer. Since the precious metal bonding layer also has a high thermal expansion coefficient, the thermal mismatch stress (stress caused by different thermal expansion coefficients) between the ceramic layer and the bonding layer during the thermal cycle process (that is, the process of continuous heating and cooling) is small, thereby increasing the service life of the coating layers (generally speaking, when two coating layers with vastly different thermal expansion coefficients are deposited together, the expansion degrees of the two coating layers are seriously different when the temperature is raised or lowered, which would result in an increase in stress between the two coating layers, leading to the problem of cracks between the two coating layers and even falling off of the coating layers).

Further, the $ZrO_2$-$RETaO_4$ is spherical and has a particle size of 10-70 μm.

Beneficial effects: when the ceramic B layer is deposited, the spraying effect is good, and the bonding effect of the ceramic B layer is good.

Further, the composition of the reflecting layer is one or more of $REVO_4$, $RETaO_4$, and $Y_2O_3$.

Beneficial effects: $REVO_4$, $RETaO_4$, and $Y_2O_3$ have high reflection coefficients, so they can reflect heat sources, reduce heat radiation, and lower the temperature of the alloy matrix, thereby increasing the service temperature of the prepared alloy.

Further, the composition of the catadioptric layer is one or two of graphene and boron carbide, and the crystal structures of graphene and boron carbide are in a disorderly arranged state.

Beneficial effects: although graphene and boron carbide have high refractive indexes, when the incident light is irradiated on the catadioptric layer, the disorderly arranged graphene and boron carbide can enhance the refraction of the light in all directions, so as to avoid the incident light from being refracted in the same direction and achieve the effect of dispersed refraction. In this way, the intensity of incident light entering into the coating layers can be reduced.

Further, the composition of the insulating layer is one or more of epoxy resin, phenolic resin, and ABS resin.

Beneficial effects: when the housing of the aircraft is ionized due to friction with air during the use of aircraft, epoxy resin, phenolic resin and ABS resin can isolate conductive electrons and resist the erosion of the alloy matrix by charges.

The first aspect of the present disclosure further provides another basic technical solution: a method for preparing an ultralimit alloy, including the following operations:

operation 1: depositing a bonding layer on a surface of an alloy matrix, and depositing a precious metal layer on a surface of the bonding layer, such that the bonding layer and the precious metal layer form a composite bonding layer;

operation 2: depositing a ceramic A layer and a ceramic B layer on a surface of the precious metal layer, such that the ceramic A layer and the ceramic B layer form a composite ceramic layer;

operation 3: depositing a reflecting layer on a surface of the composite ceramic layer;

operation 4: brushing a catadioptric layer on a surface of the reflecting layer;

operation 5: brushing an insulating layer on a surface of the catadioptric layer;

operation 6: brushing a carbon foam layer on a surface of the insulating layer to form an ultralimit alloy.

Beneficial Effects of this Technical Solution:

By controlling the thickness of each coating layer deposited on the alloy matrix, the service temperature of the prepared ultralimit alloy can be increased to 100-500° C. higher than the melting point of the original alloy, and excellent corrosion resistance can be obtained. At the same time, the large weight increase of the prepared ultralimit alloy due to the large coating thickness can be avoided, so that the ultralimit alloy can not only maintain the property of light weight, but also be used at an ultralimit temperature, so as to meet the requirements for use after the aircraft is accelerated.

Further, in the first operation, before the depositing of the bonding layer, oil stains on the surface of the alloy matrix are removed; the surface of the alloy matrix is shot peened, such that a surface roughness of the alloy matrix is 60-100 μm.

Beneficial effects: by removing oil stains on the surface of the alloy matrix, the bonding effect between the alloy matrix and the coating layers can be increased. In addition, large internal stress will be generated during the curing of the coating layers. The roughness on the surface of the alloy matrix after shot peening by the shot peening machine can effectively eliminate the problem of stress concentration, thus preventing the coating layers from cracking. Further, the surface roughness can support the mass of a part of the coating, which is beneficial to eliminate the sagging phenomenon.

The second aspect of the present disclosure provides an ultralimit zirconium alloy and a preparation method therefor, to solve the problem that the traditional zirconium alloy cannot run stably in the nuclear reaction technology for a long time.

The second aspect of the present disclosure provides the following basic technical solution: an ultralimit zirconium alloy, including a zirconium alloy matrix, and the surface of the zirconium alloy matrix is successively deposited with a bonding layer, a precious metal layer, a ceramic A layer and a ceramic B layer.

Beneficial Effects of this Technical Solution:

Through extensive research, the inventors of the present disclosure made some improvements on the zirconium alloy so that the zirconium alloy can run stably in the nuclear reaction technology for a long time. In the process of continuous attempts, the inventors found that, by depositing a certain proportion of coating layer on the surface of the zirconium alloy, the service temperature of the zirconium alloy could be raised by 100-500° C. In a high-temperature environment, it is very difficult to increase the service temperature of materials by even a few degrees Celsius in traditional technology. Therefore, the present disclosure obtains a breakthrough in the use of zirconium alloys, so that the zirconium alloys can run stably in the nuclear reaction technology for a long time.

The technical solution can greatly increase the service temperature of the zirconium alloy by depositing a bonding layer, a precious metal layer, a ceramic A layer, and a ceramic B layer on the zirconium alloy matrix, to adapt to the use of the zirconium alloy at an ultralimit temperature. Depositing a bonding layer can improve the bonding effect between each coating layer and the zirconium alloy matrix, preventing the coating layers from falling off during use. Depositing a precious metal layer can prevent oxygen from diffusing into the coating layers, thereby avoiding oxidation of the zirconium alloy matrix. Depositing a ceramic A layer and a ceramic B layer can reduce heat conduction, thereby increasing the service temperature of the zirconium alloy matrix.

In summary, the present disclosure has the following technical effects:

1. The ultralimit zirconium alloy of the present disclosure can overcome the problem that the traditional zirconium alloy falls off due to the generation of oxides on the surface after serving in an environment of high temperature, high pressure and water vapor for a long time; no oxidation will occur when the ultralimit zirconium alloy of the present disclosure serves for a long time at high temperature, which will increase the service time of the entire component.

2. By depositing a plurality of coating layers on a surface of the zirconium alloy matrix, the service temperature of the zirconium alloy matrix can be increased to 100-500° C. higher than the melting point of the original zirconium alloy matrix, so as to achieve the long-term stable use of the zirconium alloy in an ultralimit environment.

3. The ultralimit zirconium alloy of the present disclosure has excellent corrosion resistance, so that the service time under acidic or alkaline conditions is greatly prolonged, and the cost can be saved since the waste caused by material corrosion is reduced.

4. The ultralimit zirconium alloy of the present disclosure breaks through the development bottleneck of traditional zirconium alloys, and can further increase the service temperature based on the high melting point; the increased temperature is a leap forward. The ultralimit zirconium alloy of the present disclosure can be used stably for a long time under an ultralimit temperature.

Further, a thickness of the bonding layer is 50-150 µm, a thickness of the precious metal layer is 10-20 µm, a thickness of the ceramic A layer is 50-80 µm, and a thickness of the ceramic B layer is 50-80 µm; a surface of the ceramic B layer is successively deposited with a seal coating layer with a thickness of 5-10 µm, a reflecting layer with a thickness of 10-15 µm, a catadioptric layer with a thickness of 10-15 µm, and an electrically insulating layer with a thickness of 15-20 µm.

Beneficial effects: the seal coating layer can isolate the external oxidizing or corrosive atmosphere, so that the external atmosphere cannot directly react with the internal coating layers, thereby increasing the service life of the coating layers; the reflecting layer has the effect of reflecting the heat source, thereby reducing the heat source on the surface of the zirconium alloy and increasing the service temperature; the depositing of the catadioptric layer can block the refraction of infrared rays in the coating layers, thereby reducing the temperature of the zirconium alloy matrix and increasing the service temperature of the prepared zirconium alloy; the electrically insulating layer can isolate the conductive ions to avoid the conductive ions from corroding the zirconium alloy matrix, thereby improving the corrosion resistance of the prepared ultralimit zirconium alloy. In this technical solution, the service temperature of the zirconium alloy is greatly improved through the coordination of various coating layers and the thicknesses thereof, which is convenient for making aircrafts.

Further, the composition of the bonding layer is MCrAlY, and the MCrAlY is CoCrAlY, NiCoCrAlY or CoNiCrAlY. The precious metal layer is one of or an alloy of more of Pt, Ru, Rh, Pd, Ir, and Os.

Beneficial effects: the ratios of the elements in NiCoCrAlY and CoNiCrAlY are different, so the prepared materials are different; the bonding layer has a good bonding effect, which makes the subsequent coating layers bond well with the zirconium alloy matrix, so as to reduce the probability of the falling off of the coating layers; precious metals have anti-oxidation properties, which can effectively prevent the diffusion of oxygen into the bonding layer and the zirconium alloy matrix at high temperatures, thereby increasing the oxidation resistance and the service life of the coating layers.

Further, the composition of the ceramic A layer is one or more of $Y_2O_3$—$ZrO_2$, $Y_2O_3$—$CeO_2$, $Y_2O_3$—$TiO_2$, $Y_2O_3$—$CeO_2$, $Y_2O_3$—$Yb_2O_3$, $Y_2O_3$—$Er_2O_3$, $Y_2O_3$—$Dy_2O_3$, and $Y_2O_3$—$HfO_2$. The ceramic B layer is $RETaO_4$, which is spherical in shape and has a particle size of 10-70 µm.

Beneficial effects: YSZ or rare earth zirconate is commonly used as a thermal barrier coating and is easily available. $RETaO_4$ has the properties of low thermal conductivity and high expansion coefficient. Low thermal conductivity can reduce heat conduction, so that the zirconium alloy matrix keeps low temperature in a high temperature environment, thus improving the service temperature of the prepared zirconium alloy. The high expansion coefficient of $ZrO_2$-$RETaO_4$ is to match the thermal expansion coefficient of the bonding layer. Since the precious metal bonding layer also has a high thermal expansion coefficient, the thermal mismatch stress (stress caused by different thermal expansion coefficients) between the ceramic layer and the bonding layer during the thermal cycle process (that is, the process of continuous heating and cooling) is small, therefore, the service life of the coating layers can be increased (generally speaking, when two coating layers with vastly different thermal expansion coefficients are deposited together, the expansion degrees of the two coating layers are seriously different when the temperature is raised or lowered, which would result in an increase in stress between the two coating layers, leading to the problem of cracks between the two coating layers and even falling off of the coating layers).

Further, the composition of the seal coating layer is one or more of $Ti_3SiC$, $REPO_4$ and BN. Beneficial effects: the above materials can isolate the external oxidizing or corrosive atmosphere, so that the external atmosphere cannot directly react with the internal coating layers, thereby increasing the service life of the coating layers.

Further, the composition of the reflecting layer is one or more of $REVO_4$, $RETaO_4$, and $Y_2O_3$. The composition of the catadioptric layer is graphene, and the spatial distribution of the graphene is in a disorderly arranged state.

Beneficial effects: $REVO_4$, $RETaO_4$, and $Y_2O_3$ have high reflection coefficients, so they can reflect heat sources, reduce heat radiation, and lower the temperature of the zirconium alloy matrix, thereby increasing the service temperature of the prepared zirconium alloy; although graphene has a high refractive index, when the incident light is irradiated on the catadioptric layer, the disorderly arranged graphene can enhance the refraction of the light in all directions, so as to avoid the incident light from being refracted in the same direction and achieve the effect of dispersed refraction. In this way, the intensity of incident light entering into the coating layers can be reduced.

Further, the composition of the electrically insulating layer is one or more of polytetrafluoroethylene, polyimide, polyphenyl ether, polyphenylene sulfide, polyether ether ketone, bismaleimide, furan resin, cyanate ester resin and polyarylacetylene.

Beneficial effects: the above materials can isolate conductive ions to avoid the conductive ions from entering the zirconium alloy matrix and corroding the zirconium alloy matrix.

The second aspect of the present disclosure further provides another technical solution: a method for preparing an ultralimit zirconium alloy, including the following operations:

operation 1: depositing a bonding layer with a thickness of 50-150 μm on a surface of the zirconium alloy matrix;

operation 2: depositing a precious metal layer with a thickness of 10-20 μm on a surface of the bonding layer;

operation 3: depositing a ceramic A layer with a thickness of 50-80 μm on a surface of the precious metal layer;

operation 4: depositing a ceramic B layer with a thickness of 50-80 μm on a surface of the ceramic A layer;

operation 5: depositing a seal coating layer with a thickness of 5-10 μm on a surface of the ceramic B layer;

operation 6: depositing a reflecting layer with a thickness of 10-15 μm on a surface of the seal coating layer;

operation 7: depositing a catadioptric layer with a thickness of 10-15 μm on a surface of the reflecting layer; and operation 8: depositing an electrically insulating layer with a thickness of 15-20 μm on a surface of the catadioptric layer, to prepare the ultralimit zirconium alloy.

Beneficial effects of this technical solution: by controlling the thickness of each coating layer deposited on the zirconium alloy matrix, the service temperature of the prepared ultralimit zirconium alloy can be increased to 100-500° C. higher than the melting point of the original zirconium alloy, and excellent corrosion resistance can be obtained. At the same time, the large weight increase of the prepared ultralimit zirconium alloy due to the large coating thickness can be avoided, so that the ultralimit zirconium alloy can meet the requirements for use in the aircraft.

Further, the total thickness of the bonding layer, the precious metal layer, the ceramic A layer, the ceramic B layer, the seal coating layer, the reflecting layer, the catadioptric layer, and the electrically insulating layer is 185-320 μm.

Beneficial effects: the coating layers of such thickness endow the prepared ultralimit zirconium alloy with good heat resistance and corrosion resistance without seriously increasing the weight of the ultralimit zirconium alloy, so that the prepared ultralimit zirconium alloy can meet the requirements for use in the aircraft.

Further, in the first operation, before the depositing of the bonding layer, oil stains on the surface of the zirconium alloy matrix are removed; the surface of the zirconium alloy matrix is then sandblasted, such that a surface roughness of the zirconium alloy matrix is 60-100 μm.

Beneficial effects: by removing oil stains on the surface of the zirconium alloy matrix, the bonding effect between the zirconium alloy matrix and the coating layers can be increased; in addition, large internal stress will be generated during the curing of the coating layers. The roughness on the surface of the zirconium alloy matrix after sand blasting by the sand-blasting machine can effectively eliminate the problem of stress concentration, thus preventing the coating layers from cracking. Further, the surface roughness can support the mass of a part of the coating, which is beneficial to eliminate the sagging phenomenon.

The third aspect of the present disclosure provides an ultralimit tin alloy and a preparation method therefor, to solve the problem that traditional tin alloy weld materials are prone to deform and cause failure under an ultralimit temperature environment.

The present disclosure provides the following basic solution: an ultralimit tin alloy which is a weld material, including a tin alloy matrix, the surface of the tin alloy matrix being successively deposited with a bonding layer, a ceramic layer, and a seal coating layer.

Beneficial Effects of this Technical Solution:

Through extensive research, the inventors have developed an ultralimit tin alloy weld material, which can satisfy the use of tin alloy at ultralimit temperature (beyond its melting point temperature). During the development process, it is generally considered that when the environment temperature is higher than the alloy's service temperature, the alloy cannot be used at this temperature, and other alloys with a high melting point will be needed. However, the inventors did the opposite, trying to improve the tin alloy weld materials to meet the needs of aircraft manufacturing. In the process of continuous attempts, the inventors found that, by depositing a certain proportion of coating layer on the surface of the tin alloy matrix, the service temperature of the tin alloy could be raised to 100-500° C. higher than the original melting point, which would greatly increase the service temperature of the original tin alloy weld material, such that this tin alloy weld material remains stable for a long time at high temperature without cracking or even falling off, which meets the needs of aircraft manufacturing. In a high-temperature environment, it is very difficult to increase the service temperature of tin alloy weld materials even by 2-3° C. Therefore, the applicant's research represents a significant advance in the use of tin alloys.

The technical solution can greatly increase the service temperature of the tin alloy weld material by depositing a bonding layer, a ceramic layer and a seal coating layer on the tin alloy matrix, to adapt to the use of the tin alloy weld material at an ultralimit temperature.

Depositing a bonding layer can improve the bonding effect between the coating layers and the tin alloy matrix, preventing the coating layers from falling off during use. Depositing a ceramic layer can reduce heat conduction, thereby increasing the service temperature of the tin alloy weld material. The purpose of depositing the seal coating layer is to isolate the tin alloy matrix from the external oxidizing or corrosive atmosphere, so that the external atmosphere cannot directly react with the internal coating layers and matrix, thereby increasing the service life of the coating layers and matrix. Through multiple experiments, the inventors verify that the service temperature of the tin alloy weld material is greatly improved through the various coating layers.

In summary, the present disclosure has the following technical effects:

1. For welds obtained by using traditional tin alloy solder, due to the low strength and low hardness of traditional tin alloy welds, the parts welded with traditional tin alloy solder will suffer serious stress deformation during the service under high temperature and high pressure. The introduction of various coating layers in this technical solution can greatly improve the strength of the tin alloy welding material, so that the service strength of the tin alloy welding material is further improved.

2. Although the welds obtained by using traditional tin alloy solder has good corrosion resistance at room temperature, its oxidation resistance is weak in a high-temperature environment. The main reason for high-temperature oxidation is the diffusion of oxygen into the weld. However, the introduction of various coating layers in this technical solution hinders the diffusion of external oxygen into the weld.

3. The welds obtained by using traditional tin alloy solder will be exposed to a lot of infrared radiation when used in a high-temperature environment for a long time, which greatly shortens the service time of the welds and makes the welds prone to fracture. In this technical solution, the introduction of various coating layers can reduce the amount of infrared radiation received by the welds to a certain extent, so that the service life of the welds can be significantly improved and the entire welds are extremely stable during the use.

4. The tin alloy weld material of the present disclosure breaks through the development bottleneck of the traditional tin alloy material. By depositing coating layers on the surface of the tin alloy matrix material, the service temperature of the tin alloy weld material is increased, so that the ultralimit tin alloy weld material can be used stably in an ultra-high temperature environment for a long time, so as to meet the needs of aircrafts in an environment of high temperature, high pressure and high erosion, and realize the speed-up of the aircrafts.

Further, a thickness of the bonding layer is 50-180 μm, a thickness of the ceramic layer is 50-80 μm, a thickness of the seal coating layer is 5-15 μm; the seal coating layer is successively deposited with a reflecting layer with a thickness of 5-15 μm, a catadioptric layer with a thickness of 5-15 μm, and an insulating layer with a thickness of 10-25 μm.

Beneficial effects: depositing the reflecting layer has the effect of reflecting the heat radiation, thereby reducing the temperature of the tin alloy welding material and increasing the service temperature of the tin alloy weld; depositing the catadioptric layer can block the refraction of infrared rays in the coating layers, so as to reduce the amount of infrared rays entering the tin alloy matrix, to reduce the temperature of the tin alloy weld material so that the service temperature of the prepared tin alloy weld material is increased. In a superfast environment, the surface of the material is prone to ionization. The effect of depositing the insulating layer lies in that the insulating layer can isolate the conductive ions or electrons generated by ionization from entering the tin alloy matrix, thereby resisting the erosion of the tin alloy matrix by electric charges. Through multiple experiments, the inventors verify that the service temperature of the tin alloy weld material is greatly improved through the coating layers of various thicknesses.

Further, the composition of the bonding layer includes one of or an alloy of more of Pt, Pd, Rh, Ru, Ir, and Os. Beneficial effects: the bonding layer has a good bonding effect, which makes the ceramic layer bond well with the tin alloy matrix, so as to reduce the probability of the falling off of the ceramic layers; precious metals have anti-oxidation properties, which can effectively prevent the diffusion of oxygen into the bonding layer and the tin alloy matrix at high temperatures, thereby increasing the oxidation resistance of the tin alloy weld material and the service life of the weld material.

Further, the composition of the ceramic layer is $RETaO_4$.

Beneficial effects: $RETaO_4$ has high expansion coefficient and low thermal conductivity. Low thermal conductivity can reduce the conduction of external heat into the tin alloy weld material, so that the tin alloy weld material can maintain a low temperature in a high-temperature environment. As for high expansion coefficient, since the coating layers are used as a whole instead of acting individually, the high expansion coefficient of $RETaO_4$ is to match the thermal expansion coefficient of the bonding layer. Since the precious metal bonding layer also has a high thermal expansion coefficient, the thermal mismatch stress (stress caused by different thermal expansion coefficients) between the ceramic layer and the bonding layer during the thermal cycle process (that is, the process of continuous heating and cooling) is small, thereby increasing the service life of the coating layers (generally speaking, when two coating layers with vastly different thermal expansion coefficients are deposited together, the expansion degrees of the two coating layers are seriously different when the temperature is raised or lowered, which would result in an increase in stress between the two coating layers, leading to the problem of cracks between the two coating layers and even falling off of the coating layers).

Further, the composition of the seal coating layer is one or more of $Ti_3SiC$, $REPO_4$ and BN. Beneficial effects: through experiments, the inventors have proved that a seal coating layer with the composition of one or more of $Ti_3SiC$, $REPO_4$ and BN has a better barrier effect.

Further, the reflecting layer is one or more of $REVO_4$, $RETaO_4$, and $Y_2O_3$. Beneficial effects: $REVO_4$, $RETaO_4$, and $Y_2O_3$ have high reflection coefficients, so they can reflect the heat radiation well, which greatly reduces the temperature of tin alloy weld materials in high-temperature environments, thereby increasing the service temperature of the prepared tin alloy weld material. Further, the catadioptric layer is one or two of graphene or boron carbide, and the spatial distribution of the graphene and boron carbide are in a disorderly arranged state.

Beneficial effects: the spatial distribution of graphene or boron carbide are in a disorderly arranged state, although graphene or boron carbide has a high refractive index, when the infrared light is irradiated on the graphene catadioptric layer, the disorderly arranged graphene can enhance the refraction of the light in all directions, so as to avoid the incident light from being refracted in the same direction and achieve the effect of dispersed refraction. In this way, the intensity of infrared light entering into the coating layers can be reduced, so that the temperature of the coating layers and the tin alloy weld material can be decreased.

Further, the insulating layer is an organic coating layer including one or more of polytetrafluoroethylene, polyimide (PI), polyphenyl ether (PPO/PPE), polyphenylene sulfide (PPS), polyether ether ketone (PEEK), bismaleimide (BMI), furan resin, cyanate ester (CE) resin and polyarylacetylene (PAA).

Beneficial effects: taking aircrafts as an example, during high-speed flight, the outer surface of the aircraft rubs against the air, causing the air to ionize to form conductive ions or electrons. The inventors have verified through experiments that the use of organic coating layers such as polytetrafluoroethylene, polyimide (PI) and polyphenyl ether (PPO/PPE) can effectively prevent charges from entering the coating layers and the tin alloy matrix, thereby reducing the corrosion of the tin alloy weld material by the conductive electrons or ions.

The third aspect of the present disclosure further provides another technical solution: a method for preparing an ultralimit tin alloy, including the following operations:

operation 1: depositing a bonding layer on a surface of a tin alloy matrix, and the thickness of the bonding layer is 50-180 μm;

operation 2: preparing a ceramic layer on a surface of the bonding layer obtained in operation 1, and the thickness of the ceramic layer is 50-80 μm;

operation 3: preparing a seal coating layer on a surface of the ceramic layer obtained in operation 2, and the thickness of the seal coating layer is 5-15 μm;

operation 4: preparing a reflecting layer on a surface of the seal coating layer obtained in operation 3, and the thickness of the reflecting layer is 5-15 μm;

operation 5: preparing a catadioptric layer on a surface of the reflecting layer obtained in operation 4, and the thickness of the catadioptric layer is 5-15 μm;

operation 6: preparing an insulating layer on a surface of the catadioptric layer obtained in operation 5, and the thickness of the insulating layer is 10-25 μm. Beneficial effects of this technical solution:

By controlling the thickness of each coating layer deposited on the tin alloy matrix, the service temperature of the prepared ultralimit tin alloy weld material can be increased to 100-500° C. higher than the melting point of the original tin alloy, and excellent corrosion resistance can be obtained. At the same time, the large weight increase of the prepared ultralimit tin alloy weld material due to the large coating thickness can be avoided, so that the ultralimit tin alloy weld material can meet the requirements for use in the aircraft.

Further, in operation 1, before the depositing of the bonding layer, the surface of the tin alloy matrix is sandblasted, and then the surface of the tin alloy matrix after the sandblasting is subjected to a dust removal process; the tin alloy weld material deposited with a plurality of coating layers by operations 1-6 is allowed to stand for 5-10 hours at 50-80° C. for aging treatment.

Beneficial effects: by sandblasting the surface of the tin alloy matrix, the surface roughness of the tin alloy matrix can be increased, thereby improving the bonding strength between the tin alloy matrix and the bonding layer. In addition, the sandblasting process would cause a large amount of dust on the surface of the tin alloy matrix. Therefore, it is necessary to have dust removal treatment on the surface of the tin alloy matrix after sandblasting to prevent dust from affecting the bonding effect of the coating layers and the tin alloy matrix. The aging treatment is to eliminate the residual stress inside and between the coating layers and the tin alloy matrix, to avoid the problems of cracking or even falling off of the coating layers under the influence of the residual stress.

DETAILED DESCRIPTION OF THE PREFERRED EMBODIMENTS

Embodiment 1 (Ultralimit Magnesium Alloy)

In this embodiment, the ultralimit alloy is an ultralimit magnesium alloy, that is, the alloy matrix is a magnesium alloy.

Figure 1A:
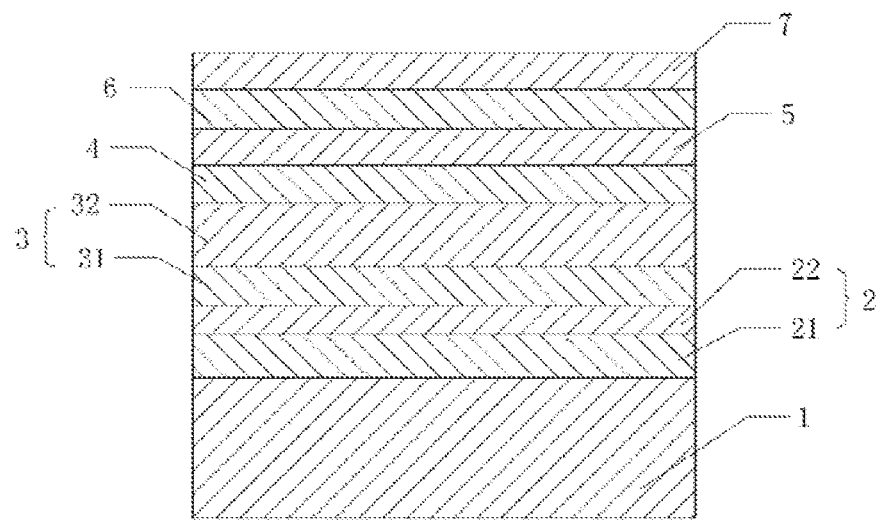
FIG. 1A is a schematic diagram of the ultralimit magnesium alloy (Embodiment 1), ultralimit aluminum alloy (Embodiment 2) and ultralimit nickel alloy (Embodiment 3) of the present disclosure.

The reference signs in FIG. 1A include: magnesium alloy matrix 1, composite bonding layer 2, bonding layer 21, precious metal layer 22, composite ceramic layer 3, ceramic A layer 31, ceramic B layer 32, reflecting layer 4, catadioptric layer 5, insulating layer 6, and carbon foam layer 7.

As shown in FIG. 1A, the present disclosure provides an ultralimit magnesium alloy. The ultralimit magnesium alloy includes a magnesium alloy matrix 1. The surface of the magnesium alloy matrix 1 is successively deposited with a composite bonding layer 2 with a thickness of 100-200 μm, a composite ceramic layer 3 with a thickness of 150-500 μm, a reflecting layer 4 with a thickness of 10-30 μm, a catadioptric layer 5 with a thickness of 10-30 μm, an insulating layer 6 with a thickness of 10-200 μm, and a carbon foam layer 7 with a thickness of 20-200 μm. The composite bonding layer 2 includes a bonding layer 21 deposited on the surface of the magnesium alloy matrix 1 and a precious metal layer 22 deposited on the surface of the bonding layer 21. The composition of the bonding layer 21 is one of or an alloy of more of MCrAlY, NiAl, NiCr—Al and Mo; MCrAlY is NiCrCoAlY, NiCoCrAlY, CoNiCrAlY or CoCrAlY. The composition of the precious metal layer 22 is one of or an alloy of more of Au, Pt, Ru, Rh, Pd, and Ir. The composite ceramic layer 3 includes a ceramic A layer 31 and a ceramic B layer 32. The ceramic A layer 31 is close to the precious metal layer 22, or, the ceramic B layer 32 is close to the precious metal layer 22. The composition of the ceramic A layer 31 is YSZ or rare earth zirconate ($RE_2Zr_2O_7$, RE=Y, Nd, Eu, Gd, Dy or Sm). The composition of the ceramic B layer 32 is $ZrO_2$-$RETaO_4$; the $ZrO_2$-$RETaO_4$ is spherical in shape and has a particle size of 10-70 μm; the chemical formula of $ZrO_2$-$RETaO_4$ is $RE_{1-x}(Ta/Nb)_{1-x}(Zr/Ce/Ti)_{2x}O_4$, RE=Y, Nd, Eu, Gd, Dy, Er, Yb, Lu or Sm. The composition of the reflecting layer 4 is one or more of $REVO_4$, $RETaO_4$, and $Y_2O_3$, and RE=Y, Nd, Eu, Gd, Dy, Er, Yb, Lu or Sm. The composition of the catadioptric layer 5 is one or two of graphene and boron carbide, and the crystal structures of graphene and boron carbide are in a disorderly arranged state. The composition of the insulating layer 6 is one or more of epoxy resin, phenolic resin, and ABS resin.

The present disclosure uses $ZrO_2$-$RETaO_4$ as the ceramic B layer, which has the effects of low thermal conductivity and high expansion rate, and can reduce heat conduction; the $ZrO_2$-$RETaO_4$ prepared by the following method can meet the requirements of APS spraying technology.

$ZrO_2$-$RETaO_4$ is prepared by the following method. The method includes the following operations:

operation (1): pre-drying zirconium oxide ($ZrO_2$) powder, rare earth oxide ($RE_2O_3$) powder and tantalum pentoxide ($Ta_2O_5$) powder, the pre-drying temperature is 600° C., and the pre-drying time is 8 hours; weighing zirconium oxide ($ZrO_2$) powder, rare earth oxide powder $RE_2O_3$ and tantalum oxide ($Ta_2O_5$) powder according to a molar ratio of $2x:(1-x):(1-x)$, and adding the powders into the ethanol solvent to obtain a mixed solution, so that the molar ratio of RE:Ta:Zr in the mixed solution is $(1-x):(1-x):2x$; ball-milling the mixed solution using a ball mill for 10 hours, and the speed of the ball mill is 300 r/min;

drying the slurry obtained after ball milling using a rotary evaporator (model: N-1200B), the drying temperature is 60° C., and the drying time is 2 hours; sieving the dried powder through a 300-mesh sieve to obtain powder A;

operation (2): preparing powder B with a composition of $ZrO_2$ doped with $RETaO_4$ from the powder A obtained in operation (1) by a high-temperature solid-phase reaction method, the reaction temperature is 1700° C. and the reaction time is 10 hours; sieving the powder B with a 300-mesh sieve;

operation (3): mixing the powder B sieved in operation (2) with deionized water solvent and an organic bonding agent to obtain slurry C, the mass percentage of powder B in slurry C is 25%, the mass percentage of organic bonding agent in slurry C is 2%, and the rest is the solvent; the organic bonding agent is polyvinyl alcohol or gum arabic; drying the slurry C by a centrifugal atomization method to obtain dried granules D, the temperature during drying is 600° C., and the centrifugal speed is 8500 r/min;

operation (4): sintering the granules D obtained in operation (3) at 1200° C. for 8 hours, sieving the sintered granules D with a 300-mesh sieve to obtain $ZrO_2$-$RETaO_4$ ceramic powder having a particle size of 10-70 μm and a spherical shape.

Based on extensive experiments, the inventors conclude that within the parameter scope of the present disclosure, the prepared ultralimit magnesium alloys have the largest increase in service temperature, small increase in weight of the magnesium alloy and the best parameter ranges. In the present disclosure, 30 of the experiments are listed for description.

The parameters of Test Examples 1-30 of an ultralimit magnesium alloy and its preparation method according to the present disclosure are shown in Table 1-1, Table 1-2, and Table 1-3 (thickness unit: μm):

TABLE 1-1

Composition and thickness of each coating layer in Test Examples 1-10 of an ultralimit magnesium alloy and its preparation method

| | Test Example | | 1 | 2 | 3 | 4 | 5 | 6 | 7 | 8 | 9 | 10 |
|---|---|---|---|---|---|---|---|---|---|---|---|---|
| Composite bonding layer | Thickness of bonding layer | NiCrCoAlY | 50 | 60 | 40 | 50 | 50 | — | — | — | — | — |
| | | CoCrAlY | — | — | — | — | — | — | — | — | — | — |
| | | NiCoCrAlY | — | — | — | — | — | — | — | — | — | — |
| | | CoNiCrAlY | — | — | — | — | — | — | — | — | — | — |
| | | NiAl | — | — | — | — | — | 70 | 70 | 60 | 80 | 60 |
| | | NiCr—Al | — | — | — | — | — | — | — | — | — | — |
| | | Mo | — | — | — | — | — | — | — | — | — | — |
| | Thickness of precious metal layer | Au | 50 | — | — | — | — | — | 40 | — | — | — |
| | | Pt | — | 40 | — | — | — | — | — | 60 | — | — |
| | | Ru | — | — | 60 | — | — | — | — | — | 50 | — |
| | | Rh | — | — | — | 60 | — | — | — | — | — | 70 |
| | | Pd | — | — | — | — | 50 | — | — | — | — | — |
| | | Ir | — | — | — | — | — | 30 | — | — | — | — |
| | | PT—Rh alloy | — | — | — | — | — | — | — | — | — | — |
| | | Pd—Rh alloy | — | — | — | — | — | — | — | — | — | — |
| | | Ru—Rh alloy | — | — | — | — | — | — | — | — | — | — |
| Composite ceramic layer | Thickness of ceramic A layer | YSZ | 70 | 60 | 80 | 50 | 65 | 90 | — | — | — | — |
| | | $Y_2Zr_2O_7$ | — | — | — | — | — | — | 100 | — | — | — |
| | | $Gd_2Zr_2O_7$ | — | — | — | — | — | — | — | 90 | — | — |
| | | $Nd_2Zr_2O_7$ | — | — | — | — | — | — | — | — | 90 | — |
| | | $Sm_2Zr_2O_7$ | — | — | — | — | — | — | — | — | — | 120 |
| | | $Eu_2Zr_2O_7$ | — | — | — | — | — | — | — | — | — | — |
| | | $Dy_2Zr_2O_7$ | — | — | — | — | — | — | — | — | — | — |
| | | YSZ and $Sm_2Zr_2O_7$ | — | — | — | — | — | — | — | — | — | — |
| | | YSZ and $Eu_2Zr_2O_7$ | — | — | — | — | — | — | — | — | — | — |
| | | YSZ and $Nd_2Zr_2O_7$ | — | — | — | — | — | — | — | — | — | — |
| | Thickness of ceramic B layer | $ZrO_2$—$YTaO_4$ | 80 | 90 | — | 100 | — | — | 90 | — | — | — |
| | | $ZrO_2$—$GdTaO_4$ | — | — | 70 | — | 85 | 60 | — | 80 | — | — |
| | | $ZrO_2$—$NdTaO_4$ | — | — | — | — | — | — | — | — | 100 | — |
| | | $ZrO_2$—$SmTaO_4$ | — | — | — | — | — | — | — | — | — | 70 |
| | | $ZrO_2$—$EuTaO_4$ | — | — | — | — | — | — | — | — | — | — |
| | | $ZrO_2$—$DyTaO_4$ | — | — | — | — | — | — | — | — | — | — |
| | | $ZrO_2$—$ErTaO_4$ | — | — | — | — | — | — | — | — | — | — |
| | | $ZrO_2$—$YbTaO_4$ | — | — | — | — | — | — | — | — | — | — |
| | | $ZrO_2$—$LuTaO_4$ | — | — | — | — | — | — | — | — | — | — |
| Thickness of reflecting layer | | $Y_2O_3$ | 10 | 10 | — | — | — | — | — | — | — | — |
| | | $YVO_4$ | — | — | — | — | 30 | — | — | — | — | — |
| | | $NdVO_4$ | — | — | — | 20 | — | — | — | — | — | — |
| | | $SmVO_4$ | — | — | 20 | — | — | — | — | — | — | — |
| | | $EuVO_4$ | — | — | — | — | — | 10 | — | — | — | — |
| | | $GdVO_4$ | — | — | — | — | — | — | 15 | — | — | — |
| | | $DyVO_4$ | — | — | — | — | — | — | — | — | — | 10 |
| | | $ErVO_4$ | — | — | — | — | — | — | — | — | 20 | — |
| | | $YbVO_4$ | — | — | — | — | — | — | — | 10 | — | — |
| | | $LuVO_4$ | — | — | — | — | — | — | — | — | — | — |
| | | $YTaO_4$ | — | — | — | — | — | — | — | — | — | — |
| | | $NdTaO_4$ | — | — | — | — | — | — | — | — | — | — |
| | | $SmTaO_4$ | — | — | — | — | — | — | — | — | — | — |
| | | $EuTaO_4$ | — | — | — | — | — | — | — | — | — | - |
| | | $GdTaO_4$ | — | — | — | — | — | — | — | — | — | — |
| | | $DyTaO_4$ | — | — | — | — | — | — | — | — | — | — |
| | | $ErTaO_4$ | — | — | — | — | — | — | — | — | — | — |
| | | $YbTaO_4$ | — | — | — | — | — | — | — | — | — | — |
| | | $LuTaO_4$ | — | — | — | — | — | — | — | — | — | — |
| | | $Y_2O_3$ and $EuVO_4$ | — | — | — | — | — | — | — | — | — | — |
| | | $YVO_4$ and $EuTaO_4$ | — | — | — | — | — | — | — | — | — | — |
| | | $Y_2O_3$ and $LuTaO_4$ | — | — | — | — | — | — | — | — | — | — |
| | | $YVO_4$ and $LuTaO_4$ | — | — | — | — | — | — | — | — | — | — |
| Thickness of catadioptric layer | | Graphene | 10 | 10 | 20 | 20 | 20 | 10 | — | — | — | — |
| | | Boron carbide | — | — | — | — | — | — | 30 | 15 | 25 | 20 |
| Thickness of insulating layer | | Epoxy resin | 15 | 10 | — | — | — | — | 20 | — | — | 10 |
| | | Phenolic resin | — | — | 20 | 20 | — | — | — | — | 15 | — |
| | | ABS resin | — | — | — | — | 50 | 100 | — | 10 | — | — |
| Thickness of carbon foam layer | | | 20 | 20 | 20 | 20 | 100 | 200 | 30 | 25 | 20 | 35 |

TABLE 1-2

Composition and thickness of each coating layer in Test Examples 11-20 of an ultralimit magnesium alloy and its preparation method

| | Test Example | | 11 | 12 | 13 | 14 | 15 | 16 | 17 | 18 | 19 | 20 |
|---|---|---|---|---|---|---|---|---|---|---|---|---|
| Composite bonding layer | Thickness of bonding layer | NiCrCoAlY | — | — | — | — | — | — | — | — | — | — |
| | | CoCrAlY | 70 | — | — | — | — | — | — | — | — | — |
| | | NiCoCrAlY | — | 100 | — | — | — | — | — | — | — | — |
| | | CoNiCrAlY | — | — | 75 | — | — | 65 | — | — | — | 55 |
| | | NiAl | — | — | — | — | 100 | — | — | — | — | — |
| | | NiCr—Al | — | — | — | 80 | — | — | — | 80 | — | — |
| | | Mo | — | — | — | — | — | — | 105 | — | 95 | — |
| | Thickness of precious metal layer | Au | — | — | — | — | — | — | 75 | — | — | — |
| | | Pt | — | — | — | — | — | 105 | — | — | 75 | — |
| | | Ru | — | — | — | — | — | — | — | 100 | — | — |
| | | Rh | — | — | — | — | — | — | — | — | — | 125 |
| | | Pd | — | — | — | — | — | — | — | — | — | — |
| | | Ir | — | — | — | — | — | — | — | — | — | — |
| | | PT—Rh alloy | 90 | — | — | — | 60 | — | — | — | — | — |
| | | Pd—Rh alloy | — | 60 | — | 95 | — | — | — | — | — | — |
| | | Ru—Rh alloy | — | — | 90 | — | — | — | — | — | — | — |
| Composite ceramic layer | Thickness of ceramic A layer | YSZ | — | — | — | — | — | 80 | — | — | — | — |
| | | $Y_2Zr_2O_7$ | — | — | — | — | — | — | 140 | — | — | — |
| | | $Gd_2Zr_2O_7$ | — | — | — | — | — | — | — | — | — | — |
| | | $Nd_2Zr_2O_7$ | — | — | — | — | — | — | — | 100 | — | — |
| | | $Sm_2Zr_2O_7$ | — | — | — | — | — | — | — | — | — | — |
| | | $Eu_2Zr_2O_7$ | 50 | — | — | — | — | — | — | — | 110 | — |
| | | $Dy_2Zr_2O_7$ | — | 70 | — | — | — | — | — | — | — | — |
| | | YSZ and $Sm_2Zr_2O_7$ | — | — | 90 | — | — | — | — | — | — | 180 |
| | | YSZ and $Eu_2Zr_2O_7$ | — | — | — | 60 | — | — | — | — | — | — |
| | | YSZ and $Nd_2Zr_2O_7$ | — | — | — | — | 100 | — | — | — | — | — |
| | Thickness of ceramic B layer | $ZrO_2$—$YTaO_4$ | — | — | — | — | — | 120 | — | — | — | — |
| | | $ZrO_2$—$GdTaO_4$ | — | — | — | — | — | — | — | 50 | — | — |
| | | $ZrO_2$—$NdTaO_4$ | — | — | — | — | — | — | 60 | — | — | — |
| | | $ZrO_2$—$SmTaO_4$ | — | — | — | — | — | — | — | — | 70 | — |
| | | $ZrO_2$—$EuTaO_4$ | 130 | — | — | — | — | — | — | — | — | 100 |
| | | $ZrO_2$—$DyTaO_4$ | — | 90 | — | — | — | — | — | — | — | — |
| | | $ZrO_2$—$ErTaO_4$ | — | — | 70 | — | — | — | — | — | — | — |
| | | $ZrO_2$—$YbTaO_4$ | — | — | — | 90 | — | — | — | — | — | — |
| | | $ZrO_2$—$LuTaO_4$ | — | — | — | — | 60 | — | — | — | — | — |
| Thickness of reflecting layer | | $Y_2O_3$ | — | — | — | — | — | — | — | — | — | — |
| | | $YVO_4$ | — | — | — | — | — | — | — | — | — | — |
| | | $NdVO_4$ | — | — | — | — | — | — | — | — | — | — |
| | | $SmVO_4$ | — | — | — | — | — | — | — | — | — | — |
| | | $EuVO_4$ | — | — | — | — | — | — | — | — | — | — |
| | | $GdVO_4$ | — | — | — | — | — | — | — | — | — | — |
| | | $DyVO_4$ | — | — | — | — | — | — | — | — | — | — |
| | | $ErVO_4$ | — | — | — | — | — | — | — | — | — | — |
| | | $YbVO_4$ | — | — | — | — | — | — | — | — | — | — |
| | | $LuVO_4$ | — | — | — | — | — | — | — | 20 | — | — |
| | | $YTaO_4$ | — | — | — | — | — | — | — | — | — | 18 |
| | | $NdTaO_4$ | — | — | — | — | — | — | — | — | 25 | — |
| | | $SmTaO_4$ | — | — | — | — | — | — | — | — | — | — |
| | | $EuTaO_4$ | — | — | — | — | — | — | — | — | — | — |
| | | $GdTaO_4$ | — | — | — | — | — | — | — | — | — | — |
| | | $DyTaO_4$ | — | — | — | — | — | — | — | — | — | — |
| | | $ErTaO_4$ | — | — | — | — | — | — | 15 | — | — | — |
| | | $YbTaO_4$ | — | — | - | — | — | 10 | — | — | — | — |
| | | $LuTaO_4$ | — | — | — | — | 20 | — | — | — | — | — |
| | | $Y_2O_3$ and $EuVO_4$ | 15 | — | — | — | — | — | — | — | — | — |
| | | $YVO_4$ and $EuTaO_4$ | — | 20 | — | — | — | — | — | — | — | — |
| | | $Y_2O_3$ and $LuTaO_4$ | — | — | 10 | — | — | — | — | — | — | — |
| | | $YVO_4$ and $LuTaO_4$ | — | — | — | 15 | — | — | — | — | — | — |
| Thickness of catadioptric layer | | Graphene | 15 | 30 | — | — | 25 | — | 20 | — | — | 23 |
| | | Boron carbide | — | — | 15 | 20 | — | 25 | — | 30 | 23 | — |
| Thickness of insulating layer | | Epoxy resin | 15 | — | — | 15 | — | — | 25 | 30 | — | 35 |
| | | Phenolic resin | — | 10 | — | — | — | — | — | — | 200 | — |
| | | ABS resin | — | — | 20 | — | 10 | 20 | — | — | — | — |
| Thickness of carbon foam layer | | | 30 | 40 | 45 | 50 | 70 | 50 | 60 | 80 | 100 | 200 |

TABLE 1-3

Composition and thickness of each coating layer in Test Examples 21-30 of an ultralimit magnesium alloy and its preparation method

| | | Test Example | 21 | 22 | 23 | 24 | 25 | 26 | 27 | 28 | 29 | 30 |
|---|---|---|---|---|---|---|---|---|---|---|---|---|
| Composite bonding layer | Thickness of bonding layer | NiCrCoAlY | 65 | — | 40 | — | — | — | — | — | — | 45 |
| | | CoCrAlY | — | 50 | — | — | — | — | — | — | — | — |
| | | NiCoCrAlY | — | — | — | — | — | 20 | — | — | — | — |
| | | CoNiCrAlY | — | — | — | — | 60 | — | — | — | — | — |
| | | NiAl | — | — | — | 30 | — | — | — | — | — | — |
| | | NiCr—Al | — | — | — | — | — | — | 80 | 100 | — | — |
| | | Mo | — | — | — | — | — | — | — | — | 65 | — |
| | Thickness of precious metal layer | Au | 55 | — | — | — | — | — | — | — | — | 65 |
| | | Pt | — | 70 | — | — | — | — | — | — | — | — |
| | | Ru | — | — | 60 | — | 40 | — | — | — | 65 | — |
| | | Rh | — | — | — | 70 | — | — | — | — | — | — |
| | | Pd | — | — | — | — | — | 80 | — | — | — | — |
| | | Ir | — | — | — | — | — | — | 80 | — | — | — |
| | | PT—Rh alloy | — | — | — | — | — | — | — | 100 | — | — |
| | | Pd—Rh alloy | — | — | — | — | — | — | — | — | — | — |
| | | Ru—Rh alloy | — | — | — | — | — | — | — | — | — | — |
| Composite ceramic layer | Thickness of ceramic A layer | YSZ | 90 | — | — | — | — | — | — | — | — | 70 |
| | | $Y_2Zr_2O_7$ | — | 50 | — | — | — | — | — | 90 | — | — |
| | | $Gd_2Zr_2O_7$ | — | — | — | — | — | 80 | — | — | — | — |
| | | $Nd_2Zr_2O_7$ | — | — | 150 | — | — | — | 300 | — | 85 | — |
| | | $Sm_2Zr_2O_7$ | — | — | — | 100 | 80 | — | — | — | — | — |
| | | $Eu_2Zr_2O_7$ | — | — | — | — | — | — | — | — | — | — |
| | | $Dy_2Zr_2O_7$ | — | — | — | — | — | — | — | — | — | — |
| | | YSZ and $Sm_2Zr_2O_7$ | — | — | — | — | — | — | — | — | — | — |
| | | YSZ and $Eu_2Zr_2O_7$ | — | — | — | — | — | — | — | — | — | — |
| | | YSZ and $Nd_2Zr_2O_7$ | — | — | — | — | — | — | — | — | — | — |
| | | $ZrO_2$—$YTaO_4$ | — | — | — | — | — | — | — | — | — | 100 |
| | | $ZrO_2$—$GdTaO_4$ | — | — | — | — | — | — | — | — | — | — |
| | | $ZrO_2$—$NdTaO_4$ | — | — | — | — | — | — | — | — | 75 | — |
| | Thickness of ceramic B layer | $ZrO_2$—$SmTaO_4$ | — | — | — | — | — | — | — | — | — | — |
| | | $ZrO_2$—$EuTaO_4$ | — | — | — | — | — | — | — | — | — | — |
| | | $ZrO_2$—$DyTaO_4$ | 80 | — | — | — | — | — | — | 100 | — | — |
| | | $ZrO_2$—$ErTaO_4$ | — | — | — | — | 90 | — | 200 | — | — | — |
| | | $ZrO_2$—$YbTaO_4$ | — | 150 | — | — | — | 100 | — | — | — | — |
| | | $ZrO_2$—$LuTaO_4$ | — | — | 50 | 70 | — | — | — | — | — | — |
| Thickness of reflecting layer | | $Y_2O_3$ | — | — | — | — | — | — | — | — | — | 20 |
| | | $YVO_4$ | — | — | — | — | — | — | — | — | — | — |
| | | $NdVO_4$ | — | — | — | — | — | — | — | — | — | — |
| | | $SmVO_4$ | — | — | — | — | — | — | — | — | — | — |
| | | $EuVO_4$ | — | — | — | — | — | — | — | — | — | — |
| | | $GdVO_4$ | — | — | — | — | — | — | — | — | — | — |
| | | $DyVO_4$ | — | — | — | 22 | — | — | — | — | — | — |
| | | $ErVO_4$ | — | — | — | — | — | 10 | — | — | — | — |
| | | $YbVO_4$ | — | — | — | — | — | — | — | — | — | — |
| | | $LuVO_4$ | — | — | — | — | — | — | — | — | — | — |
| | | $YTaO_4$ | — | — | — | — | — | — | — | — | — | — |
| | | $NdTaO_4$ | — | — | — | — | — | — | — | — | — | — |
| | | $SmTaO_4$ | 18 | — | — | — | — | — | — | — | — | — |
| | | $EuTaO_4$ | — | — | 12 | — | — | — | — | — | — | — |
| | | $GdTaO_4$ | — | — | — | — | 15 | — | — | — | — | — |
| | | $DyTaO_4$ | — | 12 | — | — | — | — | — | — | — | — |
| | | $ErTaO_4$ | — | — | — | — | — | — | — | 30 | — | — |
| | | $YbTaO_4$ | — | — | — | — | — | 28 | — | — | — | — |
| | | $LuTaO_4$ | — | — | — | — | — | — | — | — | 30 | — |
| | | $Y_2O_3$ and $EuVO_4$ | — | — | — | — | — | — | — | — | — | — |
| | | $YVO_4$ and $EuTaO_4$ | — | — | — | — | — | — | — | — | — | — |
| | | $Y_2O_3$ and $LuTaO_4$ | — | — | — | — | — | — | — | — | — | — |
| | | $YVO_4$ and $LuTaO_4$ | — | — | — | — | — | — | — | — | — | — |
| Thickness of catadioptric layer | | Graphene | 15 | 28 | — | 18 | — | 13 | 10 | 10 | — | 20 |
| | | Boron carbide | — | — | 18 | — | 13 | — | — | — | 15 | — |
| Thickness of insulating layer | | Epoxy resin | — | 10 | — | — | — | 180 | — | 160 | — | 15 |
| | | Phenolic resin | 30 | — | — | 80 | 100 | — | — | — | — | — |
| | | ABS resin | — | — | 60 | — | — | — | 150 | — | 170 | — |
| Thickness of carbon foam layer | | | 130 | 150 | 160 | 170 | 175 | 180 | 185 | 190 | 200 | 30 |

Take Test Example 1 of Embodiment 1 as an example to illustrate another technical solution of the present disclosure, that is, a method for preparing an ultralimit magnesium alloy. A method for preparing an ultralimit magnesium alloy, including the following operations:

Operation 1: in this test example, AM50A magnesium alloy serves as the magnesium alloy matrix, and the oil stains and impurities on the surface of magnesium alloy matrix are removed by a soaking method. First, the magnesium alloy matrix is soaked in an emulsified detergent or an alkali solution; the main components of the emulsified detergent are ethanol and surfactant, and the main components of the alkali solution are sodium hydroxide, trisodium phosphate, sodium carbonate and sodium silicate; in this test example, the magnesium alloy matrix is soaked in the alkali solution. The pH value of the alkali solution is adjusted to between 10-11, and then the magnesium alloy matrix is soaked in the alkali solution for 0.5-1.5 h and then taken out. In this test example, the soaking time is 1 hour. Then, the magnesium alloy matrix is rinsed with clean water and dried. The surface of the magnesium alloy matrix is shot peened by a shot peening machine. The shot peening machine used is a JCK-SS500-6A automatic transmission shot peening machine. The shot peening material used is any one of iron sand, glass shot and ceramic shot. In this test example, iron sand is used, and the particle size of the iron sand may be 0.3-0.8 mm; the particle size of the iron sand in this test example is 0.5 mm. The surface roughness of the magnesium alloy matrix after shot peening is 60-100 μm. In this test example, the surface roughness of the magnesium alloy matrix is 80 μm, which facilitates the bonding of the coating layer to the magnesium alloy matrix.

Operation 2: a composite bonding layer is deposited on the surface of the AM50A magnesium alloy after the shot peening. First, a layer of NiCrCoAlY is sprayed on the surface of the magnesium alloy matrix as the bonding layer by HVOF or supersonic arc spraying method. In this test example, the HVOF method is used; the powder particle size during spraying is 25-65 μm, the oxygen flow rate is 2000SCFH, the kerosene flow rate is 18.17 LPH, the carrier gas is 12.2SCFH, the powder feed rate is 5 RPM, the barrel length is 5 in, and the spraying distance is 254 mm.

Then, a layer of Au is deposited on the NiCrCoAlY as a precious metal layer by a EB-PVD method, such that a composite bonding layer is formed. The gas pressure when depositing Au is less than 0.01 Pa; in this test example, the gas pressure is 0.008 Pa, and the ratio of the temperature of the magnesium alloy matrix to the melting point of the magnesium alloy matrix is less than 0.3. The thickness of the deposited bonding layer is 50 μm, and the thickness of the precious metal layer is 50 μm.

Operation 3: a layer of YSZ is sprayed on the surface of the bonding layer as a ceramic A layer by APS, HVOF, PS-PVD or EB-PVD method; in this test example, the APS method is used. Then, a layer of YTaO$_4$ is sprayed on the ceramic A layer as a ceramic B layer by the APS method, such that a composite ceramic layer is formed. The thickness of the ceramic A layer is 70 μm, and the thickness of the ceramic B layer is 80 μm.

Operation 4: a layer of Y$_2$O$_3$ transparent ceramic material is sprayed on the surface of the ceramic B layer as a reflecting layer by HVOF, PS-PVD or EB-PVD method; in this test example, the HVOF method is used. The thickness of the sprayed reflecting layer is 10 μm.

Operation 5: graphene and micron-sized carbon powder material are uniformly mixed with each other, and then the mixed powder is introduced into a solution for ultrasonic vibration mixing. In this test example, the solution is an ethanol solution with 1% dispersant. The micron-sized carbon powder is separated from the mixed solution by a filter paper. The solution mixed with graphene is brushed on the surface of the reflecting layer as a catadioptric layer. Then, the magnesium alloy brushed with the graphene catadioptric layer is placed in a drying oven and dried at 60° C. for 2 hours. The thickness of the brushed catadioptric layer is 10 μm.

Operation 6: a layer of epoxy resin is brushed on the surface of the catadioptric layer as an insulating layer, and the thickness of the insulating layer is 10 μm.

Operation 7: a layer of carbon foam layer is brushed on the insulating layer. The thickness of the carbon foam layer is 20 μm. The ultralimit magnesium alloy is obtained.

The only difference between Test Examples 2-29 and Test Example 1 is that the parameters as shown in Table 1-1 are different. The difference between Test Example 30 and Test Example 1 is that the spraying sequence of the ceramic A layer and the ceramic B layer in operation 3 is different.

Experiments:

13 groups of Comparative Examples are provided to perform comparative experiments with Test Examples 1-30. The parameters of Comparative Examples 1-12 are shown in Table 1-4 (thickness unit: μm):

TABLE 1-4

Composition and thickness of each coating layer in Comparative Examples 1-12

| | | Comparative Example | 1 | 2 | 3 | 4 | 5 | 6 | 7 | 8 | 9 | 10 | 11 | 12 |
|---|---|---|---|---|---|---|---|---|---|---|---|---|---|---|
| Composite bonding layer | Thickness of bonding layer | NiCrCoAlY | 45 | — | — | — | 50 | — | — | — | — | — | — | — |
| | | NiAl | — | 60 | — | — | — | 70 | 50 | — | — | — | — | — |
| | | NiCr—Al | — | — | 40 | — | — | — | — | 30 | — | — | — | — |
| | | Mo | — | — | — | 20 | — | — | — | — | — | 90 | — | 45 |
| | Thickness of precious metal layer | Au | — | 30 | — | — | — | — | — | 60 | — | — | — | — |
| | | Pt | — | — | 40 | — | — | — | — | — | 50 | — | — | — |
| | | Ru | — | — | — | 60 | — | — | — | — | — | — | — | — |
| | | Rh | — | — | — | — | 50 | — | — | — | — | — | — | — |
| | | Pd | — | — | — | — | — | 30 | — | — | — | — | — | — |
| | | Ir | — | — | — | — | — | — | 60 | — | — | — | — | — |
| Composite ceramic layer | Thickness of ceramic A layer | YSZ | — | — | 60 | 55 | — | — | — | — | — | — | — | — |
| | | Y$_2$Zr$_2$O$_7$ | 50 | — | — | — | 35 | — | — | — | — | — | — | — |
| | | Gd$_2$Zr$_2$O$_7$ | — | 45 | — | — | — | — | — | — | — | — | — | — |
| | | Nd$_2$Zr$_2$O$_7$ | — | — | — | — | — | 100 | — | — | — | — | — | — |
| | | Sm$_2$Zr$_2$O$_7$ | — | — | — | — | — | — | 150 | — | — | — | — | — |
| | | Eu$_2$Zr$_2$O$_7$ | — | — | — | — | — | — | — | 150 | — | — | — | — |
| | | Dy$_2$Zr$_2$O$_7$ | — | — | — | — | — | — | — | — | 80 | — | — | — |
| | Thickness of ceramic B layer | ZrO$_2$—YTaO$_4$ | 40 | — | — | — | — | — | — | — | — | — | — | — |
| | | ZrO$_2$—GdTaO$_4$ | — | — | — | 30 | — | — | — | — | — | — | — | — |
| | | ZrO$_2$—NdTaO$_4$ | — | 50 | — | — | — | — | — | — | — | — | — | — |
| | | ZrO$_2$—SmTaO$_4$ | — | — | — | — | — | — | — | 100 | — | — | — | — |
| | | ZrO$_2$—EuTaO$_4$ | — | — | 20 | — | — | — | — | — | — | — | — | — |
| | | ZrO$_2$—DyTaO$_4$ | — | — | — | — | — | 150 | — | — | — | — | — | — |
| | | ZrO$_2$—ErTaO$_4$ | — | — | — | — | 30 | — | — | — | — | — | — | — |
| | | ZrO$_2$—YbTaO$_4$ | — | — | — | — | — | — | 80 | — | — | — | — | — |
| | | ZrO$_2$—LuTaO$_4$ | — | — | — | — | — | — | — | — | — | 100 | — | — |

TABLE 1-4-continued

Composition and thickness of each coating layer in Comparative Examples 1-12

| Comparative Example | | 1 | 2 | 3 | 4 | 5 | 6 | 7 | 8 | 9 | 10 | 11 | 12 |
|---|---|---|---|---|---|---|---|---|---|---|---|---|---|
| Thickness of reflecting layer | $Y_2O_3$ | 5 | — | — | — | — | — | — | — | — | 20 | — | — |
|  | $YVO_4$ | — | 8 | — | — | — | — | — | — | 35 | — | — | — |
|  | $GdVO_4$ | — | — | 5 | — | — | — | 38 | — | — | — | — | 20 |
|  | $YTaO_4$ | — | — | — | 35 | — | — | — | 8 | — | — | — | — |
|  | $GdTaO_4$ | — | — | — | — | 8 | 35 | — | — | — | — | — | — |
| Thickness of catadioptric layer | Graphene | 5 | — | 9 | — | 35 | 38 | — | 45 | 50 | 20 | 20 | 20 |
|  | Boron carbide | — | 8 | — | 6 | — | — | 40 | — | — | — | — | — |
| Thickness of insulating layer | Epoxy resin | 5 | — | — | — | 25 | — | 30 | — | — | 15 | 15 | 15 |
|  | Phenolic resin | — | 9 | — | — | — | — | — | — | 40 | — | — | — |
|  | ABS resin | — | — | 8 | 5 | — | 28 | — | 35 | — | — | — | — |
| Thickness of carbon foam layer | | 15 | 10 | 18 | 5 | 250 | 220 | 230 | 260 | 280 | 10 | 10 | — |

The only difference between Comparative Examples 1-12 and Test Example 1 is that the parameters as shown in Table 1-3 are different; the Comparative Example 13 uses AM50A magnesium alloy.

The following experiments are performed using the magnesium alloys provided in Test Examples 1-30 and Comparative Examples 1-13:

High Temperature Creep Test:

The magnesium alloys provided in Test Examples 1-30 and Comparative Examples 1-13 are processed into columnar test pieces with a length of 187 mm and a diameter of 16 mm. The high temperature creep test is carried out with an electronic high temperature creep rupture strength test machine (model: RMT-D5).

Figure 2A:
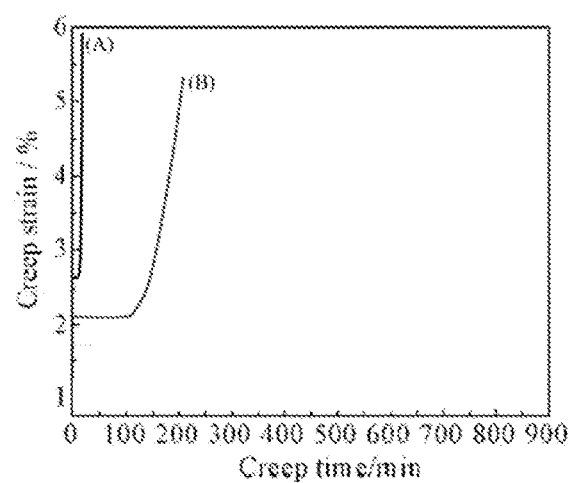
FIG. 2A shows creep test curves of Test Example 1 and Comparative Example 13 at 50 MPa and 900° C. according to Embodiment 1 (ultralimit magnesium alloy) of the present disclosure.

The test pieces of Test Examples 1-30 and Comparative Examples 1-13 are placed into the electronic high temperature creep rupture strength test machine, and the test machine is started to heat up the test machine. During the heating process, the test pieces are in a stress-free state (in a stress-free state, the test pieces can expand freely; the high-temperature creep means that the deformation increases with time under the combined action of temperature and stress, therefore, the heating rate has no influence on the creep). When the temperature of the test machine reaches 900° C., the stress of the test machine is adjusted to 50 MPa, and the high temperature creep test is carried out. Take Test Example 1 and Comparative Example 13 as examples, the experimental results are shown in FIG. 2A (in FIG. 2A, (A) represents Comparative Example 13, and (B) represents Test Example 1). The specific experimental results of Test Examples 1-30 and Comparative Examples 1-13 are shown in Table 1-5.

It can be observed from FIG. 2A that there are three stages of creep in both test pieces (A) and (B). However, when the temperature exceeds the melting point of AM50A magnesium alloy, the creep rupture of test piece (A) occurs within a very short period of time. Therefore, it can be concluded that AM50A magnesium alloy can hardly carry loads at a temperature higher than its melting point. Compared with test piece (A), the creep resistance of test piece (B) is significantly improved. The steady-state creep time of the test piece (B) is longer. It can be observed that after a long steady-state creep stage, the creep curve enters an accelerated creep stage, and the creep rupture occurs. Therefore, it can be concluded that, compared with the original AM50A magnesium alloy, the ultralimit magnesium alloy provided by the present disclosure maintains good mechanical properties without rupturing at a temperature exceeding the melting point of AM50A magnesium alloy, and has excellent high-temperature resistance.

Salt-Spray Corrosion Test:

The magnesium alloys provided in Test Examples 1-30 and Comparative Examples 1-13 are processed into test pieces of 50 mm×25 mm×2 mm, and then subjected to degreasing, rust removal, cleaning and drying. YWX/Q-250B salt-spray corrosion tester serves as the test equipment, and an atmospheric corrosive environment of GB/T2967.3-2008 is simulated.

Figure 3A:
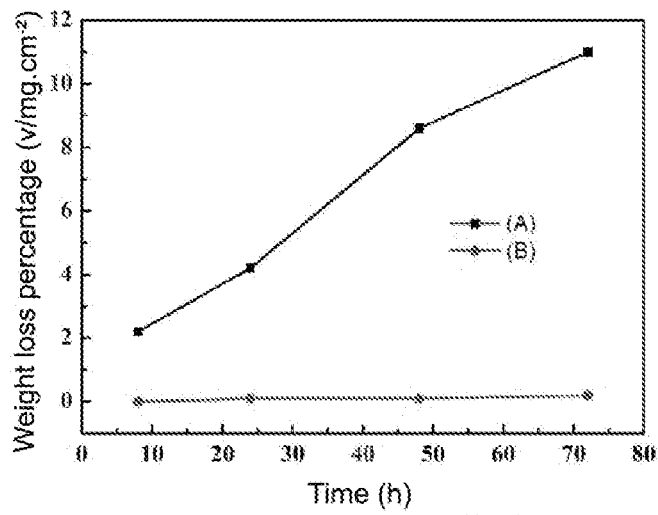
FIG. 3A is a schematic diagram of the salt-spray corrosion test results of Test Example 1 and Comparative Example 13 according to Embodiment 1 (ultralimit magnesium alloy) of the present disclosure.

The test pieces provided by Test Examples 1-30 and Comparative Examples 1-13 are hung in the test equipment, the test equipment is adjusted to a temperature of 50±1° C. and pH of 3.0-3.1, and then the test pieces are continuously sprayed with NaCl solution with a concentration of 5±0.5%. Taking Test Example 1 and Comparative Example 13 as examples, after continuously spraying a 5±0.5% NaCl solution on the test pieces for 8 h, 24 h, 48 h and 72 h, the weight loss rate of the test pieces is shown in FIG. 3A (in FIG. 3A, (A) represents Comparative Example 13, and (B) represents Test Example 1). The specific experimental results of Test Examples 1-30 and Comparative Examples 1-13 are shown in Table 1-5.

It can be concluded from FIG. 3A that test pieces (A) and (B) have obviously different corrosion patterns. For test piece (A), the corrosion weight loss value tends to increase as the corrosion time extends. In the early stage of corrosion (8-24 h), there is an oxidation film on the surface of the test pieces, which prevents the magnesium alloy matrix from contacting the solution; the corrosion rate is low. In the middle stage of corrosion (24-48 h), the Cl⁻ in the solution has penetrated the oxidation film, and a large amount of Cl⁻ is adsorbed on the matrix, which increases the corrosion pit points and deepens the original corrosion pit points; the corrosion rate is obviously accelerated. After 48 hours of continuous spraying, the corrosion products are evenly distributed and the thickness increases, covering almost the entire surface of the test piece. Cl⁻ needs to pass through the corrosion products to contact the magnesium alloy matrix, which reduces the amount of Cl⁻ adsorbed on the matrix surface and reduces the corrosion rate. In general, the corrosion loss weight of test piece (A) is much higher than that of test piece (B). Basically, the test piece (B) has no corrosion due to the existence of the coating layers, and the mass of the test piece (B) has hardly changed. Therefore, the ultralimit magnesium alloy provided by the present disclosure has good corrosion resistance.

The experimental results are shown in Table 1-5: (A. the steady creep time of the test pieces under 50 Mpa and 900° C. (min); B. the time when creep rupture of the test pieces happens under 50 Mpa and 900° C. (min); C. the weight loss (v/mg·cm²) of the test pieces after continuously spraying NaCl solution on the test pieces for 8 hours; D. the weight loss (v/mg·cm$^2$) of the test pieces after continuously spraying NaCl solution on the test pieces for 24 hours; E. the weight loss (v/mg·cm$^2$) of the test pieces after continuously spraying NaCl solution on the test pieces for 48 hours; F. the weight loss (v/mg·cm$^2$) of the test pieces after continuously spraying NaCl solution on the test pieces for 72 hours))

TABLE 1-5

Experimental results of high temperature creep test and salt-spray test

|  | A | B | C | D | E | F |
|---|---|---|---|---|---|---|
| Test Example 1 | 170 | 300 | 0 | 0.01 | 0.03 | 0.13 |
| Test Example 2 | 165 | 290 | 0 | 0.03 | 0.08 | 0.21 |
| Test Example 3 | 165 | 290 | 0.015 | 0.04 | 0.08 | 0.21 |
| Test Example 4 | 160 | 290 | 0.014 | 0.03 | 0.12 | 0.25 |
| Test Example 5 | 160 | 295 | 0 | 0.02 | 0.09 | 0.23 |
| Test Example 6 | 150 | 295 | 0 | 0.02 | 0.08 | 0.23 |
| Test Example 7 | 150 | 280 | 0.015 | 0.02 | 0.09 | 0.22 |
| Test Example 8 | 165 | 290 | 0 | 0.03 | 0.07 | 0.23 |
| Test Example 9 | 165 | 290 | 0.016 | 0.02 | 0.09 | 0.25 |
| Test Example 10 | 160 | 295 | 0 | 0.03 | 0.08 | 0.21 |
| Test Example 11 | 160 | 295 | 0 | 0.04 | 0.08 | 0.21 |
| Test Example 12 | 150 | 290 | 0.014 | 0.05 | 0.07 | 0.22 |
| Test Example 13 | 150 | 285 | 0 | 0.03 | 0.08 | 0.23 |
| Test Example 14 | 160 | 280 | 0 | 0.05 | 0.17 | 0.24 |
| Test Example 15 | 160 | 280 | 0 | 0.05 | 0.08 | 0.23 |
| Test Example 16 | 150 | 285 | 0 | 0.04 | 0.08 | 0.22 |
| Test Example 17 | 150 | 290 | 0.05 | 0.02 | 0.06 | 0.21 |
| Test Example 18 | 165 | 295 | 0.016 | 0.02 | 0.06 | 0.21 |
| Test Example 19 | 160 | 290 | 0.016 | 0.03 | 0.06 | 0.21 |
| Test Example 20 | 155 | 290 | 0 | 0.04 | 0.06 | 0.22 |
| Test Example 21 | 155 | 290 | 0 | 0.05 | 0.08 | 0.22 |
| Test Example 22 | 150 | 295 | 0.016 | 0.04 | 0.08 | 0.22 |
| Test Example 23 | 150 | 295 | 0 | 0.04 | 0.09 | 0.23 |
| Test Example 24 | 165 | 280 | 0 | 0.02 | 0.11 | 0.21 |
| Test Example 25 | 165 | 285 | 0 | 0.03 | 0.07 | 0.25 |
| Test Example 26 | 155 | 280 | 0 | 0.02 | 0.06 | 0.22 |
| Test Example 27 | 155 | 295 | 0.014 | 0.05 | 0.06 | 0.25 |
| Test Example 28 | 150 | 290 | 0.014 | 0.02 | 0.08 | 0.22 |
| Test Example 29 | 160 | 285 | 0.015 | 0.02 | 0.06 | 0.24 |
| Test Example 30 | 160 | 280 | 0.01 | 0.02 | 0.07 | 0.21 |
| Comparative Example 1 | 150 | 250 | 0.02 | 0.08 | 0.28 | 0.8 |
| Comparative Example 2 | 150 | 255 | 0.03 | 0.07 | 0.27 | 0.8 |
| Comparative Example 3 | 155 | 250 | 0.02 | 0.06 | 0.27 | 0.8 |
| Comparative Example 4 | 120 | 210 | 0.03 | 0.05 | 0.17 | 0.4 |
| Comparative Example 5 | 145 | 235 | 0.03 | 0.05 | 0.17 | 0.4 |
| Comparative Example 6 | 145 | 245 | 0.04 | 0.05 | 0.14 | 0.4 |
| Comparative Example 7 | 135 | 250 | 0.03 | 0.75 | 0.15 | 0.5 |
| Comparative Example 8 | 140 | 245 | 0.02 | 0.06 | 0.16 | 0.65 |
| Comparative Example 9 | 150 | 245 | 0.02 | 0.06 | 0.15 | 0.85 |
| Comparative Example 10 | 155 | 250 | 0.03 | 0.08 | 0.27 | 0.85 |
| Comparative Example 11 | 140 | 245 | 0.04 | 0.09 | 0.25 | 0.9 |
| Comparative Example 12 | 135 | 245 | 0.04 | 0.09 | 0.25 | 0.85 |
| Comparative Example 13 | 10 | 15 | 2.1 | 4.2 | 8.9 | 10.9 |

It can be seen that by depositing composite bonding layer, composite ceramic layer, reflecting layer, catadioptric layer, insulating layer and carbon foam layer on the magnesium alloy, the service temperature of the magnesium alloy can be increased to 100-500° C. higher than the original melting point. The corrosion resistance can be greatly improved as well. In addition, by controlling the thickness of each coating layer within the range provided by the present disclosure, the effects of the prepared ultralimit magnesium alloy can be optimized. Compared with the ultralimit magnesium alloy provided by the present disclosure, the traditional magnesium alloy with parameters beyond the range provided in the test examples of the present embodiment has a much lower maximum service temperature and poorer corrosion resistance.

Embodiment 2 (Ultralimit Aluminum Alloy)

In this embodiment, the ultralimit alloy is an ultralimit aluminum alloy, that is, the alloy matrix is an aluminium alloy matrix.

The present disclosure will be described in more detail by using the embodiments below:

The reference signs in FIG. 1A include: aluminum alloy matrix 1, composite bonding layer 2, bonding layer 21, precious metal layer 22, composite ceramic layer 3, ceramic A layer 31, ceramic B layer 32, reflecting layer 4, catadioptric layer 5, insulating layer 6, and carbon foam layer 7.

As shown in FIG. 1A, the present disclosure provides an ultralimit aluminum alloy. The ultralimit aluminum alloy includes a aluminum alloy matrix 1. The surface of the magnesium alloy matrix 1 is successively deposited with a composite bonding layer 2 with a thickness of 100-200 μm, a composite ceramic layer 3 with a thickness of 150-500 μm, a reflecting layer 4 with a thickness of 10-30 μm, a catadioptric layer 5 with a thickness of 10-30 μm, an insulating layer 6 with a thickness of 10-200 μm, and a carbon foam layer 7 with a thickness of 20-200 μm. The composite bonding layer 2 includes a bonding layer 21 deposited on the surface of the aluminum alloy matrix 1 and a precious metal layer 22 deposited on the surface of the bonding layer 21. The composition of the bonding layer 21 is one or more of MCrAlY, NiAl, NiCr—Al and Mo; MCrAlY is NiCrCoAlY, NiCoCrAlY, CoNiCrAlY or CoCrAlY. The composition of the precious metal layer 22 is one of or an alloy of more of Au, Pt, Ru, Rh, Pd, and Ir. The composite ceramic layer 3 includes a ceramic A layer 31 and a ceramic B layer 32. The ceramic A layer 31 is close to the precious metal layer 22, or, the ceramic B layer 32 is close to the precious metal layer 22. The composition of the ceramic A layer 31 is YSZ or rare earth zirconate ($RE_2Zr_2O_7$, RE=Y, Nd, Eu, Gd, Dy or Sm). The composition of the ceramic B layer 32 is $ZrO_2$-RETaO$_4$; the $ZrO_2$-RETaO$_4$ is spherical in shape and has a particle size of 10-70 μm; the chemical formula of $ZrO_2$-RETaO$_4$ is $RE_{1-x}(Ta/Nb)_{1-x}(Zr/Ce/Ti)_{2x}O_4$, RE=Y, Nd, Eu, Gd, Dy, Er, Yb, Lu or Sm. The composition of the reflecting layer 4 is one or more of REVO$_4$, RETaO$_4$ and $Y_2O_3$, and RE=Y, Nd, Eu, Gd, Dy, Er, Yb, Lu or Sm. The composition of the catadioptric layer 5 is one or two of graphene and boron carbide, and the spatial distribution of the graphene and boron carbide are in a disorderly arranged state. The composition of the insulating layer 6 is one or more of epoxy resin, phenolic resin, and ABS resin.

The present disclosure uses $ZrO_2$-RETaO$_4$ as the ceramic B layer, which has the effects of low thermal conductivity and high expansion rate, and can reduce heat conduction; The method for preparing $ZrO_2$-RETaO$_4$ is the same as that of Embodiment 1, and the $ZrO_2$-RETaO$_4$ can meet the requirements of APS spraying technology.

Based on extensive experiments, the inventors concludes that within the parameter scope of the present disclosure, the prepared ultralimit aluminum alloys have the largest increase in service temperature, and small increase in weight of the aluminum alloy. In the present disclosure, 30 of them are listed for description.

The parameters of Test Examples 1-30 of an ultralimit aluminum alloy and its preparation method according to the present disclosure are shown in Table 2-1, Table 2-2, and Table 2-3 (thickness unit: μm):

TABLE 2-1

Composition and thickness of each coating layer in Test Examples
1-10 of an ultralimit aluminum alloy and its preparation method

| | Test Example | | 1 | 2 | 3 | 4 | 5 | 6 | 7 | 8 | 9 | 10 |
|---|---|---|---|---|---|---|---|---|---|---|---|---|
| Composite bonding layer | Thickness of bonding layer | NiCrCoAlY | 50 | 60 | 40 | 50 | 50 | — | — | — | — | — |
| | | CoCrAlY | — | — | — | — | — | — | — | — | — | — |
| | | NiCoCrAlY | — | — | — | — | — | — | — | — | — | — |
| | | CoNiCrAlY | — | — | — | — | — | — | — | — | — | — |
| | | NiAl | — | — | — | — | — | 70 | 70 | 60 | 80 | 60 |
| | | NiCr—Al | — | — | — | — | — | — | — | — | — | — |
| | | Mo | — | — | — | — | — | — | — | — | — | — |
| | Thickness of precious metal layer | Au | 50 | — | — | — | — | — | 40 | — | — | — |
| | | Pt | — | 40 | — | — | — | — | — | 60 | — | — |
| | | Ru | — | — | 60 | — | — | — | — | — | 50 | — |
| | | Rh | — | — | — | 60 | — | — | — | — | — | 70 |
| | | Pd | — | — | — | — | 50 | — | — | — | — | — |
| | | Ir | — | — | — | — | — | 30 | — | — | — | — |
| | | PT—Rh alloy | — | — | — | — | — | — | — | — | — | — |
| | | Pd—Rh alloy | — | — | — | — | — | — | — | — | — | — |
| | | Ru—Rh alloy | — | — | — | — | — | — | — | — | — | — |
| Composite ceramic layer | Thickness of ceramic A layer | YSZ | 70 | 60 | 80 | 50 | 65 | 90 | — | — | — | — |
| | | $Y_2Zr_2O_7$ | — | — | — | — | — | — | 100 | — | — | — |
| | | $Gd_2Zr_2O_7$ | — | — | — | — | — | — | — | 90 | — | — |
| | | $Nd_2Zr_2O_7$ | — | — | — | — | — | — | — | — | 90 | — |
| | | $Sm_2Zr_2O_7$ | — | — | — | — | — | — | — | — | — | 120 |
| | | $Eu_2Zr_2O_7$ | — | — | — | — | — | — | — | — | — | — |
| | | $Dy_2Zr_2O_7$ | — | — | — | — | — | — | — | — | — | — |
| | | YSZ and $Sm_2Zr_2O_7$ | — | — | — | — | — | — | — | — | — | — |
| | | YSZ and $Eu_2Zr_2O_7$ | — | — | — | — | — | — | — | — | — | — |
| | | YSZ and $Nd_2Zr_2O_7$ | — | — | — | — | — | — | — | — | — | — |
| | Thickness of ceramic B layer | $ZrO_2$—$YTaO_4$ | 80 | 90 | — | 100 | — | — | 90 | — | — | — |
| | | $ZrO_2$—$GdTaO_4$ | — | — | 70 | — | 85 | 60 | — | 80 | — | — |
| | | $ZrO_2$—$NdTaO_4$ | — | — | — | — | — | — | — | — | 100 | — |
| | | $ZrO_2$—$SmTaO_4$ | — | — | — | — | — | — | — | — | — | 70 |
| | | $ZrO_2$—$EuTaO_4$ | — | — | — | — | — | — | — | — | — | — |
| | | $ZrO_2$—$DyTaO_4$ | — | — | — | — | — | — | — | — | — | — |
| | | $ZrO_2$—$ErTaO_4$ | — | — | — | — | — | — | — | — | — | — |
| | | $ZrO_2$—$YbTaO_4$ | — | — | — | — | — | — | — | — | — | — |
| | | $ZrO_2$—$LuTaO_4$ | — | — | — | — | — | — | — | — | — | — |
| Thickness of reflecting layer | | $Y_2O_3$ | 10 | 10 | — | — | — | — | — | — | — | — |
| | | $YVO_4$ | — | — | — | — | 30 | — | — | — | — | — |
| | | $NdVO_4$ | — | — | — | 20 | — | — | — | — | — | — |
| | | $SmVO_4$ | — | — | 20 | — | — | — | — | — | — | — |
| | | $EuVO_4$ | — | — | — | — | — | 10 | — | — | — | — |
| | | $GdVO_4$ | — | — | — | — | — | — | 15 | — | — | — |
| | | $DyVO_4$ | — | — | — | — | — | — | — | — | — | 10 |
| | | $ErVO_4$ | — | — | — | — | — | — | — | — | 20 | — |
| | | $YbVO_4$ | — | — | — | — | — | — | — | 10 | — | — |
| | | $LuVO_4$ | — | — | — | — | — | — | — | — | — | — |
| | | $YTaO_4$ | — | — | — | — | — | — | — | — | — | — |
| | | $NdTaO_4$ | — | — | — | — | — | — | — | — | — | — |
| | | $SmTaO_4$ | — | — | — | — | — | — | — | — | — | — |
| | | $EuTaO_4$ | — | — | — | — | — | — | — | — | — | — |
| | | $GdTaO_4$ | — | — | — | — | — | — | — | — | — | — |
| | | $DyTaO_4$ | — | — | — | — | — | — | — | — | — | — |
| | | $ErTaO_4$ | — | — | — | — | — | — | — | — | — | — |
| | | $YbTaO_4$ | — | — | — | — | — | — | — | — | — | — |
| | | $LuTaO_4$ | — | — | — | — | — | — | — | — | — | — |
| | | $Y_2O_3$ and $EuVO_4$ | — | — | — | — | — | — | — | — | — | — |
| | | $YVO_4$ and $EuTaO_4$ | — | — | — | — | — | — | — | — | — | — |
| | | $YVO_4$ and $LuTaO_4$ | — | — | — | — | — | — | — | — | — | — |
| Thickness of catadioptric layer | | Graphene | 10 | 10 | 20 | 20 | 20 | 10 | — | — | — | — |
| | | Boron carbide | — | — | — | — | — | — | 30 | 15 | 25 | 20 |
| Thickness of insulating layer | | Epoxy resin | 15 | 10 | — | — | — | 20 | — | — | — | 10 |
| | | Phenolic resin | — | — | 20 | 20 | — | — | — | — | 15 | — |
| | | ABS resin | — | — | — | — | 50 | 100 | — | 10 | — | — |
| Thickness of carbon foam layer | | | 20 | 20 | 20 | 20 | 100 | 200 | 30 | 25 | 20 | 35 |

TABLE 2-2

Composition and thickness of each coating layer in Test Examples 11-20 of an ultralimit aluminum alloy and its preparation method

| | | Test Example | 11 | 12 | 13 | 14 | 15 | 16 | 17 | 18 | 19 | 20 |
|---|---|---|---|---|---|---|---|---|---|---|---|---|
| Composite bonding layer | Thickness of bonding layer | NiCrCoAlY | — | — | — | — | — | — | — | — | — | — |
| | | CoCrAlY | 70 | — | — | — | — | — | — | — | — | — |
| | | NiCoCrAlY | — | 100 | — | — | — | — | — | — | — | — |
| | | CoNiCrAlY | — | — | 75 | — | — | 65 | — | — | — | 55 |
| | | NiAl | — | — | — | — | 100 | — | — | — | — | — |
| | | NiCr—Al | — | — | — | 80 | — | — | — | 80 | — | — |
| | | Mo | — | — | — | — | — | — | 105 | — | 95 | — |
| | Thickness of precious metal layer | Au | — | — | — | — | — | — | 75 | — | — | — |
| | | Pt | — | — | — | — | — | 105 | — | — | 75 | — |
| | | Ru | — | — | — | — | — | — | — | 100 | — | — |
| | | Rh | — | — | — | — | — | — | — | — | — | 125 |
| | | Pd | — | — | — | — | — | — | — | — | — | — |
| | | Ir | — | — | — | — | — | — | — | — | — | — |
| | | PT—Rh alloy | 90 | — | — | — | 60 | — | — | — | — | — |
| | | Pd—Rh alloy | — | 60 | — | 95 | — | — | — | — | — | — |
| | | Ru—Rh alloy | — | — | 90 | — | — | — | — | — | — | — |
| Composite ceramic layer | Thickness of ceramic A layer | YSZ | — | — | — | — | — | 80 | — | — | — | — |
| | | $Y_2Zr_2O_7$ | — | — | — | — | — | — | 140 | — | — | — |
| | | $Gd_2Zr_2O_7$ | — | — | — | — | — | — | — | — | — | — |
| | | $Nd_2Zr_2O_7$ | — | — | — | — | — | — | — | 100 | — | — |
| | | $Sm_2Zr_2O_7$ | — | — | — | — | — | — | — | — | — | — |
| | | $Eu_2Zr_2O_7$ | 50 | — | — | — | — | — | — | — | 110 | — |
| | | $Dy_2Zr_2O_7$ | — | 70 | — | — | — | — | — | — | — | — |
| | | YSZ and $Sm_2Zr_2O_7$ | — | — | 90 | — | — | — | — | — | — | 180 |
| | | YSZ and $Eu_2Zr_2O_7$ | — | — | — | 60 | — | — | — | — | — | — |
| | | YSZ and $Nd_2Zr_2O_7$ | — | — | — | — | 100 | — | — | — | — | — |
| | Thickness of ceramic B layer | $ZrO_2$—$YTaO_4$ | — | — | — | — | — | 120 | — | — | — | — |
| | | $ZrO_2$—$GdTaO_4$ | — | — | — | — | — | — | — | 50 | — | — |
| | | $ZrO_2$—$NdTaO_4$ | — | — | — | — | — | — | 60 | — | — | — |
| | | $ZrO_2$—$SmTaO_4$ | — | — | — | — | — | — | — | — | 70 | — |
| | | $ZrO_2$—$EuTaO_4$ | 130 | — | — | — | — | — | — | — | — | 100 |
| | | $ZrO_2$—$DyTaO_4$ | — | 90 | — | — | — | — | — | — | — | — |
| | | $ZrO_2$—$ErTaO_4$ | — | — | 70 | — | — | — | — | — | — | — |
| | | $ZrO_2$—$YbTaO_4$ | — | — | — | 90 | — | — | — | — | — | — |
| | | $ZrO_2$—$LuTaO_4$ | — | — | — | — | 60 | — | — | — | — | — |
| Thickness of reflecting layer | | $Y_2O_3$ | — | — | — | — | — | — | — | — | — | — |
| | | $YVO_4$ | — | — | — | — | — | — | — | — | — | — |
| | | $NdVO_4$ | — | — | — | — | — | — | — | — | — | — |
| | | $SmVO_4$ | — | — | — | — | — | — | — | — | — | — |
| | | $EuVO_4$ | — | — | — | — | — | — | — | — | — | — |
| | | $GdVO_4$ | — | — | — | — | — | — | — | — | — | — |
| | | $DyVO_4$ | — | — | — | — | — | — | — | — | — | — |
| | | $ErVO_4$ | — | — | — | — | — | — | — | — | — | — |
| | | $YbVO_4$ | — | — | — | — | — | — | — | — | — | — |
| | | $LuVO_4$ | — | — | — | — | — | — | — | 20 | — | — |
| | | $YTaO_4$ | — | — | — | — | — | — | — | — | — | 18 |
| | | $NdTaO_4$ | — | — | — | — | — | — | — | — | 25 | — |
| | | $SmTaO_4$ | — | — | — | — | — | — | — | — | — | — |
| | | $EuTaO_4$ | — | — | — | — | — | — | — | — | — | — |
| | | $GdTaO_4$ | — | — | — | — | — | — | — | — | — | — |
| | | $DyTaO_4$ | — | — | — | — | — | — | — | — | — | — |
| | | $ErTaO_4$ | — | — | — | — | — | — | 15 | — | — | — |
| | | $YbTaO_4$ | — | — | — | — | — | 10 | — | — | — | — |
| | | $LuTaO_4$ | — | — | — | — | 20 | — | — | — | — | — |
| | | $Y_2O_3$ and $EuVO_4$ | 15 | — | — | — | — | — | — | — | — | — |
| | | $YVO_4$ and $EuTaO_4$ | — | 20 | — | — | — | — | — | — | — | — |
| | | $Y_2O_3$ and $LuTaO_4$ | — | — | 10 | — | — | — | — | — | — | — |
| | | $YVO_4$ and $LuTaO_4$ | — | — | — | 15 | — | — | — | — | — | — |
| Thickness of catadioptric layer | | Graphene | 15 | 30 | — | — | 25 | — | 20 | — | — | 23 |
| | | Boron carbide | — | — | 15 | 20 | — | 25 | — | 30 | 23 | — |
| Thickness of insulating layer | | Epoxy resin | 15 | — | — | 15 | — | — | 25 | 30 | — | 35 |
| | | Phenolic resin | — | 10 | — | — | — | — | — | — | 200 | — |
| | | ABS resin | — | — | 20 | — | 10 | 20 | — | — | — | — |
| Thickness of carbon foam layer | | | 30 | 40 | 45 | 50 | 70 | 50 | 60 | 80 | 100 | 200 |

TABLE 2-3

Composition and thickness of each coating layer in Test Examples 21-30 of an ultralimit aluminum alloy and its preparation method

| | Test Example | | 21 | 22 | 23 | 24 | 25 | 26 | 27 | 28 | 29 | 30 |
|---|---|---|---|---|---|---|---|---|---|---|---|---|
| Composite bonding layer | Thickness of bonding layer | NiCrCoAlY | 65 | — | 40 | — | — | — | — | — | — | 45 |
| | | CoCrAlY | — | 50 | — | — | — | — | — | — | — | — |
| | | NiCoCrAlY | — | — | — | — | — | 20 | — | — | — | — |
| | | CoNiCrAlY | — | — | — | — | 60 | — | — | — | — | — |
| | | NiAl | — | — | — | 30 | — | — | — | — | — | — |
| | | NiCr—Al | — | — | — | — | — | — | 80 | 100 | — | — |
| | | Mo | — | — | — | — | — | — | — | — | 65 | — |
| | Thickness of precious metal layer | Au | 55 | — | — | — | — | — | — | — | — | 65 |
| | | Pt | — | 70 | — | — | — | — | — | — | — | — |
| | | Ru | — | — | 60 | — | 40 | — | — | — | 65 | — |
| | | Rh | — | — | — | 70 | — | — | — | — | — | — |
| | | Pd | — | — | — | — | — | 80 | — | — | — | — |
| | | Ir | — | — | — | — | — | — | 80 | — | — | — |
| | | PT—Rh alloy | — | — | — | — | — | — | — | 100 | — | — |
| | | Pd—Rh alloy | — | — | — | — | — | — | — | — | — | — |
| | | Ru—Rh alloy | — | — | — | — | — | — | — | — | — | — |
| Composite ceramic layer | Thickness of ceramic A layer | YSZ | 90 | — | — | — | — | — | — | — | — | 70 |
| | | $Y_2Zr_2O_7$ | — | 50 | — | — | — | — | — | 90 | — | — |
| | | $Gd_2Zr_2O_7$ | — | — | — | — | — | 80 | — | — | — | — |
| | | $Nd_2Zr_2O_7$ | — | — | 150 | — | — | — | 300 | — | 85 | — |
| | | $Sm_2Zr_2O_7$ | — | — | — | 100 | 80 | — | — | — | — | — |
| | | $Eu_2Zr_2O_7$ | — | — | — | — | — | — | — | — | — | — |
| | | $Dy_2Zr_2O_7$ | — | — | — | — | — | — | — | — | — | — |
| | | YSZ and $Sm_2Zr_2O_7$ | — | — | — | — | — | — | — | — | — | — |
| | | YSZ and $Eu_2Zr_2O_7$ | — | — | — | — | — | — | — | — | — | — |
| | | YSZ and $Nd_2Zr_2O_7$ | — | — | — | — | — | — | — | — | — | — |
| | Thickness of ceramic B layer | $ZrO_2$—$YTaO_4$ | — | — | — | — | — | — | — | — | — | 100 |
| | | $ZrO_2$—$GdTaO_4$ | — | — | — | — | — | — | — | — | — | — |
| | | $ZrO_2$—$NdTaO_4$ | — | — | — | — | — | — | — | — | 75 | — |
| | | $ZrO_2$—$SmTaO_4$ | — | — | — | — | — | — | — | — | — | — |
| | | $ZrO_2$—$EuTaO_4$ | — | — | — | — | — | — | — | — | — | — |
| | | $ZrO_2$—$DyTaO_4$ | 80 | — | — | — | — | — | — | 100 | — | — |
| | | $ZrO_2$—$ErTaO_4$ | — | — | — | — | 90 | — | 200 | — | — | — |
| | | $ZrO_2$—$YbTaO_4$ | — | 150 | — | — | — | 100 | — | — | — | — |
| | | $ZrO_2$—$LuTaO_4$ | — | — | 50 | 70 | — | — | — | — | — | — |
| Thickness of reflecting layer | | $Y_2O_3$ | — | — | — | — | — | — | — | — | — | 20 |
| | | $YVO_4$ | — | — | — | — | — | — | — | — | — | — |
| | | $NdVO_4$ | — | — | — | — | — | — | — | — | — | — |
| | | $SmVO_4$ | — | — | — | — | — | — | — | — | — | — |
| | | $EuVO_4$ | — | — | — | — | — | — | — | — | — | — |
| | | $GdVO_4$ | — | — | — | — | — | — | — | — | — | — |
| | | $DyVO_4$ | — | — | — | 22 | — | — | — | — | — | — |
| | | $ErVO_4$ | — | — | — | — | 10 | — | — | — | — | — |
| | | $YbVO_4$ | — | — | — | — | — | — | — | — | — | — |
| | | $LuVO_4$ | — | — | — | — | — | — | — | — | — | — |
| | | $YTaO_4$ | — | — | — | — | — | — | — | — | — | — |
| | | $NdTaO_4$ | — | — | — | — | — | — | — | — | — | — |
| | | $SmTaO_4$ | 18 | — | — | — | — | — | — | — | — | — |
| | | $EuTaO_4$ | — | — | 12 | — | — | — | — | — | — | — |
| | | $GdTaO_4$ | — | — | — | — | 15 | — | — | — | — | — |
| | | $DyTaO_4$ | — | 12 | — | — | — | — | — | — | — | — |
| | | $ErTaO_4$ | — | — | — | — | — | — | — | — | 30 | — |
| | | $YbTaO_4$ | — | — | — | — | — | — | — | 28 | — | — |
| | | $LuTaO_4$ | — | — | — | — | — | — | — | — | 30 | — |
| | | $Y_2O_3$ and $EuVO_4$ | — | — | — | — | — | — | — | — | — | — |
| | | $YVO_4$ and $EuTaO_4$ | — | — | — | — | — | — | — | — | — | — |
| | | $Y_2O_3$ and $LuTaO_4$ | — | — | — | — | — | — | — | — | — | — |
| | | $YVO_4$ and $LuTaO_4$ | — | — | — | — | — | — | — | — | — | — |
| Thickness of catadioptric layer | | Graphene | 15 | 28 | — | 18 | — | 13 | 10 | 10 | — | 20 |
| | | Boron carbide | — | — | 18 | — | 13 | — | — | — | 15 | — |
| Thickness of insulating layer | | Epoxy resin | — | 10 | — | — | — | 180 | — | 160 | — | 15 |
| | | Phenolic resin | 30 | — | — | 80 | 100 | — | — | — | — | — |
| | | ABS resin | — | — | 60 | — | — | 150 | — | 170 | — | — |
| Thickness of carbon foam layer | | | 130 | 150 | 160 | 170 | 175 | 180 | 185 | 190 | 200 | 30 |

Take Test Example 1 of Embodiment 2 as an example to illustrate another technical solution of the present disclosure, that is, a method for preparing an ultralimit aluminum alloy.

A method for preparing an ultralimit aluminum alloy, including the following operations:

Operation 1: basically the same as operation 1 of preparing ultralimit magnesium alloy in Embodiment 1, except that 7072 aluminum alloy serves as the alloy matrix in this test example.

The only difference between Test Examples 2-29 and Test Example 1 is that the parameters as shown in Table 2-1 are different. The difference between Test Example 30 and Test Example 1 is that the spraying sequence of the ceramic A layer and the ceramic B layer in operation 3 is different.

Experiments:

13 groups of Comparative Examples are provided to perform comparative experiments with Test Examples 1-30. The parameters of Comparative Examples 1-12 are shown in Table 2-4 (thickness unit: μm):

TABLE 2-4

Composition and thickness of each coating layer in Comparative Examples 1-12

| | Comparative Example | | 1 | 2 | 3 | 4 | 5 | 6 | 7 | 8 | 9 | 10 | 11 | 12 |
|---|---|---|---|---|---|---|---|---|---|---|---|---|---|---|
| Composite bonding layer | Thickness of bonding layer | NiCrCoAlY | 45 | — | — | — | 50 | — | — | — | — | — | — | — |
| | | NiAl | — | 60 | — | — | — | 70 | 50 | — | — | — | — | — |
| | | NiCr—Al | — | — | 40 | — | — | — | — | 30 | — | — | — | — |
| | | Mo | — | — | — | 20 | — | — | — | — | — | 90 | — | 45 |
| | Thickness of precious metal layer | Au | — | 30 | — | — | — | — | — | 60 | — | — | — | — |
| | | Pt | — | — | 40 | — | — | — | — | — | 50 | — | — | — |
| | | Ru | — | — | — | 60 | — | — | — | — | — | — | — | — |
| | | Rh | — | — | — | — | 50 | — | — | — | — | — | — | — |
| | | Pd | — | — | — | — | — | 30 | — | — | — | — | — | — |
| | | Ir | — | — | — | — | — | — | 60 | — | — | — | — | — |
| Composite ceramic layer | Thickness of ceramic A layer | YSZ | — | — | 60 | 55 | — | — | — | — | — | — | — | — |
| | | $Y_2Zr_2O_7$ | 50 | — | — | — | 35 | — | — | — | — | — | — | — |
| | | $Gd_2Zr_2O_7$ | — | 45 | — | — | — | — | — | — | — | — | — | — |
| | | $Nd_2Zr_2O_7$ | — | — | — | — | — | 100 | — | — | — | — | — | — |
| | | $Sm_2Zr_2O_7$ | — | — | — | — | — | — | 150 | — | — | — | — | — |
| | | $Eu_2Zr_2O_7$ | — | — | — | — | — | — | — | 150 | — | — | — | — |
| | | $Dy_2Zr_2O_7$ | — | — | — | — | — | — | — | — | 80 | — | — | — |
| | Thickness of ceramic B layer | $ZrO_2$—$YTaO_4$ | 40 | — | — | — | — | — | — | — | — | — | — | — |
| | | $ZrO_2$—$GdTaO_4$ | — | — | — | 30 | — | — | — | — | — | — | — | — |
| | | $ZrO_2$—$NdTaO_4$ | — | 50 | — | — | — | — | — | — | — | — | — | — |
| | | $ZrO_2$—$SmTaO_4$ | — | — | — | — | — | — | 100 | — | — | — | — | — |
| | | $ZrO_2$—$EuTaO_4$ | — | — | 20 | — | — | — | — | — | — | — | — | — |
| | | $ZrO_2$—$DyTaO_4$ | — | — | — | — | — | 150 | — | — | — | — | — | — |
| | | $ZrO_2$—$ErTaO_4$ | — | — | — | — | 30 | — | — | — | — | — | — | — |
| | | $ZrO_2$—$YbTaO_4$ | — | — | — | — | — | — | — | 80 | — | — | — | — |
| | | $ZrO_2$—$LuTaO_4$ | — | — | — | — | — | — | — | — | 100 | — | — | — |
| Thickness of reflecting layer | | $Y_2O_3$ | 5 | — | — | — | — | — | — | — | — | 20 | — | — |
| | | $YVO_4$ | — | 8 | — | — | — | — | — | — | 35 | — | — | — |
| | | $GdVO_4$ | — | — | 5 | — | — | — | 38 | — | — | — | — | 20 |
| | | $YTaO_4$ | — | — | — | 35 | — | — | — | 8 | — | — | — | — |
| | | $GdTaO_4$ | — | — | — | — | 8 | 35 | — | — | — | — | — | — |
| Thickness of catadioptric layer | | Graphene | 5 | — | 9 | — | 35 | 38 | — | 45 | 50 | 20 | 20 | 20 |
| | | Boron carbide | — | 8 | — | 6 | — | — | 40 | — | — | — | — | — |
| Thickness of insulating layer | | Epoxy resin | 5 | — | — | — | 25 | — | 30 | — | — | 15 | 15 | 15 |
| | | Phenolic resin | — | 9 | — | — | — | — | — | 40 | — | — | — | — |
| | | ABS resin | — | — | 8 | 5 | — | 28 | — | 35 | — | — | — | — |
| Thickness of carbon foam layer | | | 15 | 10 | 18 | 5 | 250 | 220 | 230 | 260 | 280 | 10 | 10 | — |

Operation 2: same as that in Embodiment 1.

Operation 3: a layer of YSZ is sprayed on the surface of the bonding layer as a ceramic A layer by the APS method. Then, a layer of $ZrO_2$—$YTaO_4$ is sprayed on the ceramic A layer as a ceramic B layer by the APS method, such that a composite ceramic layer is formed. The thickness of the ceramic A layer is 70 μm, and the thickness of the ceramic B layer is 80 μm.

Operation 4: same as that in Embodiment 1.

Operation 5: same as that in Embodiment 1.

Operation 6: a layer of epoxy resin is brushed on the surface of the catadioptric layer as an insulating layer, and the thickness of the insulating layer is 15 μm.

Operation 7: a layer of carbon foam layer is brushed on the insulating layer. The thickness of the carbon foam layer is 20 μm. The ultralimit aluminum alloy is obtained.

The only difference between Comparative Examples 1-12 and Test Example 1 is that the parameters as shown in Table 2-3 are different; the Comparative Example 13 uses 7072 aluminum alloy.

Figure 2B:
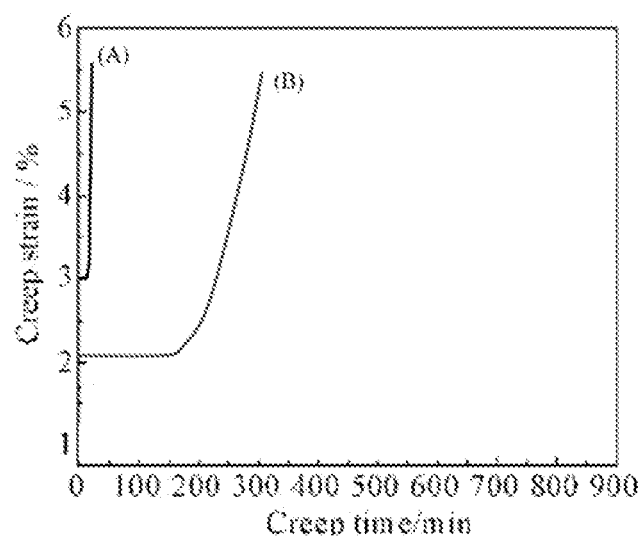
FIG. 2B shows creep test curves of Test Example 1 and Comparative Example 13 at 50 MPa and 900° C. according to Embodiment 2 (ultralimit aluminum alloy) of the present disclosure.

The following experiments are performed using the aluminum alloys provided in Test Examples 1-30 and Comparative Examples 1-13:

High Temperature Creep Test:

The aluminum alloys provided in Test Examples 1-30 and Comparative Examples 1-13 are processed into columnar test pieces with a length of 187 mm and a diameter of 16 mm. The procedure of the high temperature creep test is the same as that in Embodiment 1. Take Test Example 1 and Comparative Example 13 as examples, the experimental results are shown in FIG. 2B (in FIG. 2B, (A) represents Comparative Example 13, and (B) represents Test Example 1). The specific experimental results of Test Examples 1-30 and Comparative Examples 1-13 are shown in Table 2-5.

It can be observed from FIG. 2B that there are three stages of creep in both test pieces (A) and (B). However, when the temperature exceeds the melting point of 7072 aluminum alloy, the creep rupture of test piece (A) occurs within a very short period of time. Therefore, it can be concluded that 7072 aluminum alloy can hardly carry loads at a temperature higher than its melting point. Compared with test piece (A), the creep resistance of test piece (B) is significantly improved. The steady-state creep time of the test piece (B) is longer. It can be observed that after a long steady-state creep stage, the creep curve enters an accelerated creep stage, and the creep rupture occurs. Therefore, it can be concluded that, compared with the original 7072 aluminum alloy, the ultralimit aluminum alloy provided by the present disclosure maintains good mechanical properties without rupturing at a temperature exceeding the melting point of 7072 aluminum alloy, and has excellent high-temperature resistance.

Figure 3B:
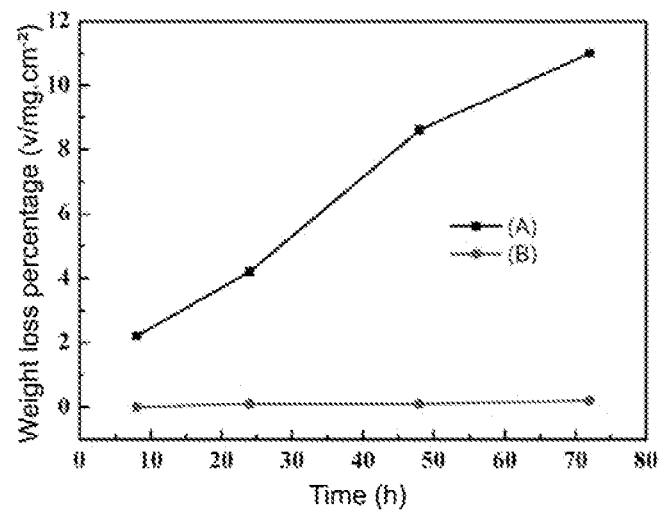
FIG. 3B is a schematic diagram of the salt-spray corrosion test results of Test Example 1 and Comparative Example 13 according to Embodiment 2 (ultralimit aluminum alloy) of the present disclosure.

Salt-Spray Corrosion Test:

The aluminum alloys provided in Test Examples 1-30 and Comparative Examples 1-13 are processed into test pieces of 50 mm×25 mm×2 mm, and the subsequent operations and experimental conditions are the same as those of Embodiment 1. The weight loss of the test pieces is shown in FIG. 3B (in FIG. 3B, (A) represents Comparative Example 13, and (B) represents Test Example 1). The specific experimental results of Test Examples 1-30 and Comparative Examples 1-13 are shown in Table 2-5.

It can be concluded from FIG. 3B that test pieces (A) and (B) have obviously different corrosion patterns. For test piece (A) (7072 aluminum alloy), the corrosion weight loss value tends to increase as the corrosion time extends. In the early stage of corrosion (8-24 h), there is an oxidation film on the surface of the test piece, which prevents the aluminum alloy matrix from contacting the solution; the corrosion rate is low. In the middle stage of corrosion (24-48 h), the in the solution has penetrated the oxidation film, and a large amount of is adsorbed on the matrix, which increases the corrosion pit points and deepens the original corrosion pit points; the corrosion rate is obviously accelerated. After 48 hours of continuous spraying, the corrosion products are evenly distributed and the thickness increases, covering almost the entire surface of the test piece. Cl⁻ needs to pass through the corrosion products to contact the aluminum alloy matrix, which reduces the amount of Cl⁻ adsorbed on the matrix surface and reduces the corrosion rate. In general, the corrosion loss weight of test piece (A) is much higher than that of test piece (B). Basically, the test piece (B) has no corrosion due to the existence of the coating layers, and the mass of the test piece (B) has hardly changed. Therefore, the ultralimit aluminum alloy provided by the present disclosure has good corrosion resistance.

The experimental results are shown in Table 2-5: (A. the steady creep time of the test pieces under 50 Mpa and 900° C. (min); B. the time when creep rupture of the test pieces happens under 50 Mpa and 900° C. (min); C. the weight loss (v/mg·cm²) of the test pieces after continuously spraying NaCl solution on the test pieces for 8 hours; D. the weight loss (v/mg·cm²) of the test pieces after continuously spraying NaCl solution on the test pieces for 24 hours; E. the weight loss (v/mg·cm²) of the test pieces after continuously spraying NaCl solution on the test pieces for 48 hours; F. the weight loss (v/mg·cm²) of the test pieces after continuously spraying NaCl solution on the test pieces for 72 hours))

TABLE 2-5

Experimental results of high temperature creep test and salt-spray test

| | A | B | C | D | E | F |
|---|---|---|---|---|---|---|
| Test Example 1 | 170 | 300 | 0 | 0.01 | 0.07 | 0.11 |
| Test Example 2 | 165 | 290 | 0 | 0.05 | 0.09 | 0.17 |
| Test Example 3 | 165 | 290 | 0 | 0.04 | 0.09 | 0.17 |
| Test Example 4 | 160 | 290 | 0 | 0.03 | 0.09 | 0.18 |
| Test Example 5 | 160 | 295 | 0 | 0.03 | 0.08 | 0.13 |
| Test Example 6 | 150 | 295 | 0 | 0.03 | 0.09 | 0.13 |
| Test Example 7 | 150 | 280 | 0.005 | 0.02 | 0.09 | 0.12 |
| Test Example 8 | 165 | 290 | 0 | 0.05 | 0.09 | 0.13 |
| Test Example 9 | 165 | 290 | 0.006 | 0.04 | 0.09 | 0.15 |
| Test Example 10 | 160 | 295 | 0 | 0.04 | 0.08 | 0.11 |
| Test Example 11 | 160 | 295 | 0 | 0.05 | 0.08 | 0.11 |
| Test Example 12 | 150 | 290 | 0.004 | 0.03 | 0.08 | 0.12 |
| Test Example 13 | 150 | 285 | 0 | 0.03 | 0.09 | 0.13 |
| Test Example 14 | 160 | 280 | 0 | 0.05 | 0.09 | 0.14 |
| Test Example 15 | 160 | 280 | 0 | 0.05 | 0.09 | 0.13 |
| Test Example 16 | 150 | 285 | 0 | 0.03 | 0.09 | 0.12 |
| Test Example 17 | 150 | 290 | 0.005 | 0.02 | 0.09 | 0.11 |
| Test Example 18 | 165 | 295 | 0.006 | 0.02 | 0.08 | 0.11 |
| Test Example 19 | 160 | 290 | 0.006 | 0.03 | 0.08 | 0.11 |
| Test Example 20 | 155 | 290 | 0 | 0.04 | 0.09 | 0.12 |
| Test Example 21 | 155 | 290 | 0 | 0.05 | 0.09 | 0.12 |
| Test Example 22 | 150 | 295 | 0.006 | 0.04 | 0.09 | 0.12 |
| Test Example 23 | 150 | 295 | 0 | 0.04 | 0.09 | 0.13 |
| Test Example 24 | 165 | 280 | 0 | 0.02 | 0.09 | 0.11 |
| Test Example 25 | 165 | 285 | 0 | 0.03 | 0.09 | 0.15 |
| Test Example 26 | 155 | 280 | 0 | 0.02 | 0.08 | 0.12 |
| Test Example 27 | 155 | 295 | 0.004 | 0.05 | 0.08 | 0.15 |
| Test Example 28 | 150 | 290 | 0.004 | 0.02 | 0.08 | 0.12 |
| Test Example 29 | 160 | 285 | 0.005 | 0.02 | 0.08 | 0.14 |
| Test Example 30 | 160 | 280 | 0 | 0.02 | 0.08 | 0.11 |
| Comparative Example 1 | 150 | 250 | 0.07 | 0.08 | 0.18 | 0.85 |
| Comparative Example 2 | 150 | 255 | 0.07 | 0.05 | 0.18 | 0.95 |
| Comparative Example 3 | 155 | 250 | 0.06 | 0.05 | 0.17 | 0.8 |
| Comparative Example 4 | 120 | 210 | 0.05 | 0.06 | 0.17 | 0.6 |
| Comparative Example 5 | 145 | 235 | 0.05 | 0.07 | 0.17 | 0.7 |
| Comparative Example 6 | 145 | 245 | 0.05 | 0.08 | 0.17 | 0.6 |
| Comparative Example 7 | 135 | 250 | 0.05 | 0.08 | 0.17 | 0.7 |
| Comparative Example 8 | 140 | 245 | 0.05 | 0.09 | 0.16 | 0.65 |
| Comparative Example 9 | 150 | 245 | 0.03 | 0.09 | 0.15 | 0.85 |
| Comparative Example 10 | 155 | 250 | 0.03 | 0.07 | 0.17 | 0.85 |
| Comparative Example 11 | 140 | 245 | 0.02 | 0.08 | 0.18 | 0.9 |
| Comparative Example 12 | 135 | 245 | 0.02 | 0.06 | 0.18 | 0.75 |
| Comparative Example 13 | 20 | 45 | 2.1 | 4.2 | 8.6 | 11.1 |

It can be seen that by depositing composite bonding layer, composite ceramic layer, reflecting layer, catadioptric layer, insulating layer and carbon foam layer on the aluminum alloy, the service temperature of the aluminum alloy can be increased to 100-500° C. higher than the original melting point. The corrosion resistance can be greatly improved as well. In addition, by controlling the thickness of each coating layer within the range provided by the present disclosure, the best effects of the prepared ultralimit aluminum alloy can be achieved. Compared with the ultralimit aluminum alloy provided by the present disclosure, the aluminum alloy with parameters beyond the range provided in the test examples of the present embodiment has a much lower maximum service temperature and poorer corrosion resistance.

Embodiment 3 (Ultralimit Nickel Alloy)

In this embodiment, the ultralimit alloy is an ultralimit nickel alloy, that is, the alloy matrix is a nickel alloy.

The reference signs in FIG. 1A include: nickel alloy matrix 1, composite bonding layer 2, bonding layer 21, precious metal layer 22, composite ceramic layer 3, ceramic A layer 31, ceramic B layer 32, reflecting layer 4, catadioptric layer 5, insulating layer 6, and carbon foam layer 7.

As shown in FIG. 1A, the present disclosure provides an ultralimit nickel alloy. The ultralimit nickel alloy includes a nickel alloy matrix 1. The surface of the nickel alloy matrix 1 is successively deposited with a composite bonding layer 2 with a thickness of 80-100 μm, a composite ceramic layer 3 with a thickness of 150-500 μm, a reflecting layer 4 with a thickness of 10-30 μm, a catadioptric layer 5 with a thickness of 10-30 μm, an insulating layer 6 with a thickness of 10-200 μm, and a carbon foam layer 7 with a thickness of 20-200 μm. The composite bonding layer 2 includes a bonding layer 21 deposited on the surface of the nickel alloy matrix 1 and a precious metal layer 22 deposited on the surface of the bonding layer 21. The composition of the bonding layer 21 is one or more of MCrAlY, NiAl, NiCr—Al and Mo; MCrAlY is NiCrCoAlY, CoCrAlY, NiCoCrAlY or CoNiCrAlY. The composition of the precious metal layer 22 is one of or an alloy of more of Au, Pt, Ru, Rh, Pd, and Ir. The composite ceramic layer 3 includes a ceramic A layer 31 and a ceramic B layer 32. The ceramic A layer 31 is close to the precious metal layer 22, or, the ceramic B layer 32 is close to the precious metal layer 22. The composition of the ceramic A layer 31 is YSZ or rare earth zirconate ($RE_2Zr_2O_7$, RE=Y, Nd, Eu, Gd, Dy or Sm). The composition of the ceramic B layer 32 is $ZrO_2$-$RETaO_4$; the $ZrO_2$-$RETaO_4$ is spherical in shape and has a particle size of 10-70 μm; the chemical formula of $ZrO_2$-$RETaO_4$ is $RE_{1-x}(Ta/Nb)_{1-x}(Zr/Ce/Ti)_{2x}O_4$, RE=Y, Nd, Eu, Gd, Dy, Er, Yb, Lu or Sm. The composition of the reflecting layer 4 is one or more of $REVO_4$, $RETaO_4$ and $Y_2O_3$, and RE=Y, Nd, Eu, Gd, Dy, Er, Yb, Lu or Sm. The composition of the catadioptric layer 5 is one or two of graphene and boron carbide, and the spatial distribution of the graphene and boron carbide are in a disorderly arranged state. The composition of the insulating layer 6 is one or more of epoxy resin, phenolic resin, and ABS resin.

The present disclosure uses $ZrO_2$-$RETaO_4$ as the ceramic B layer, which has the effects of low thermal conductivity and high expansion rate, and can reduce heat conduction; The method for preparing $ZrO_2$-$RETaO_4$ is the same as that of Embodiment 1, and the $ZrO_2$-$RETaO_4$ can meet the requirements of APS spraying technology.

Based on extensive experiments, the inventors conclude that within the parameter scope of the present disclosure, the prepared ultralimit nickel alloys have the largest increase in service temperature, and small increase in weight of the nickel alloy. In the present disclosure, 30 of them are listed for description.

The parameters of Test Examples 1-30 of an ultralimit nickel alloy and its preparation method according to the present disclosure are shown in Table 3-1, Table 3-2, and Table 3-3 (thickness unit: μm):

TABLE 3-1

Composition and thickness of each coating layer in Test Examples 1-10 of an ultralimit nickel alloy and its preparation method

| | Test Example | | 1 | 2 | 3 | 4 | 5 | 6 | 7 | 8 | 9 | 10 |
|---|---|---|---|---|---|---|---|---|---|---|---|---|
| Composite bonding layer | Thickness of bonding layer | NiCrCoAlY | 45 | 60 | 40 | 20 | 50 | — | — | — | — | — |
| | | CoCrAlY | — | — | — | — | — | — | — | — | — | — |
| | | NiCoCrAlY | — | — | — | — | — | — | — | — | — | — |
| | | CoNiCrAlY | — | — | — | — | — | — | — | — | — | — |
| | | NiAl | — | — | — | — | — | 70 | 50 | 30 | 40 | 20 |
| | | NiCr—Al | — | — | — | — | — | — | — | — | — | — |
| | | Mo | — | — | — | — | — | — | — | — | — | — |
| | Thickness of precious metal layer | Au | 45 | — | — | — | — | — | 40 | — | — | — |
| | | Pt | — | 30 | — | — | — | — | — | 60 | — | — |
| | | Ru | — | — | 40 | — | — | — | — | — | 50 | — |
| | | Rh | — | — | — | 60 | — | — | — | — | — | 70 |
| | | Pd | — | — | — | — | 50 | — | — | — | — | — |
| | | Ir | — | — | — | — | — | 30 | — | — | — | — |
| | | PT-Rh alloy | — | — | — | — | — | — | — | — | — | — |
| | | Pd—Rh alloy | — | — | — | — | — | — | — | — | — | — |
| | | Ru—Rh alloy | — | — | — | — | — | — | — | — | — | — |
| Composite ceramic layer | Thickness of ceramic A layer | YSZ | 70 | 60 | 80 | 50 | 65 | 90 | — | — | — | — |
| | | $Y_2Zr_2O_7$ | — | — | — | — | — | — | 100 | — | — | — |
| | | $Gd_2Zr_2O_7$ | — | — | — | — | — | — | — | 90 | — | — |
| | | $Nd_2Zr_2O_7$ | — | — | — | — | — | — | — | — | 90 | — |
| | | $Sm_2Zr_2O_7$ | — | — | — | — | — | — | — | — | — | 120 |
| | | $Eu_2Zr_2O_7$ | — | — | — | — | — | — | — | — | — | — |
| | | $Dy_2Zr_2O_7$ | — | — | — | — | — | — | — | — | — | — |
| | | YSZ and $Sm_2Zr_2O_7$ | — | — | — | — | — | — | — | — | — | — |
| | | YSZ and $Eu_2Zr_2O_7$ | — | — | — | — | — | — | — | — | — | — |
| | | YSZ and $Nd_2Zr_2O_7$ | — | — | — | — | — | — | — | — | — | — |
| | Thickness of ceramic B layer | $ZrO_2$—$YTaO_4$ | 80 | 90 | — | 100 | — | — | 90 | — | — | — |
| | | $ZrO_2$—$GdTaO_4$ | — | — | 70 | — | 85 | 60 | — | 80 | — | — |
| | | $ZrO_2$—$NdTaO_4$ | — | — | — | — | — | — | — | — | 100 | — |
| | | $ZrO_2$—$SmTaO_4$ | — | — | — | — | — | — | — | — | — | 70 |
| | | $ZrO_2$—$EuTaO_4$ | — | — | — | — | — | — | — | — | — | — |
| | | $ZrO_2$—$DyTaO_4$ | — | — | — | — | — | — | — | — | — | — |
| | | $ZrO_2$—$ErTaO_4$ | — | — | — | — | — | — | — | — | — | — |
| | | $ZrO_2$—$YbTaO_4$ | — | — | — | — | — | — | — | — | — | — |
| | | $ZrO_2$—$LuTaO_4$ | — | — | — | — | — | — | — | — | — | — |
| Thickness of reflecting layer | | $Y_2O_3$ | 10 | 10 | — | — | — | — | — | — | — | — |
| | | $YVO_4$ | — | — | — | — | 30 | — | — | — | — | — |
| | | $NdVO_4$ | — | — | — | 20 | — | — | — | — | — | — |
| | | $SmVO_4$ | — | — | 20 | — | — | — | — | — | — | — |
| | | $EuVO_4$ | — | — | — | — | — | 10 | — | — | — | — |
| | | $GdVO_4$ | — | — | — | — | — | — | — | — | 15 | — |
| | | $DyVO_4$ | — | — | — | — | — | — | — | — | — | 10 |

TABLE 3-1-continued

Composition and thickness of each coating layer in Test Examples 1-10 of an ultralimit nickel alloy and its preparation method

| Test Example | | 1 | 2 | 3 | 4 | 5 | 6 | 7 | 8 | 9 | 10 |
|---|---|---|---|---|---|---|---|---|---|---|---|
| | $ErVO_4$ | — | — | — | — | — | — | — | — | 20 | — |
| | $YbVO_4$ | — | — | — | — | — | — | — | 10 | — | — |
| | $LuVO_4$ | — | — | — | — | — | — | — | — | — | — |
| | $YTaO_4$ | — | — | — | — | — | — | — | — | — | — |
| | $NdTaO_4$ | — | — | — | — | — | — | — | — | — | — |
| | $SmTaO_4$ | — | — | — | — | — | — | — | — | — | — |
| | $EuTaO_4$ | — | — | — | — | — | — | — | — | — | — |
| | $GdTaO_4$ | — | — | — | — | — | — | — | — | — | — |
| | $DyTaO_4$ | — | — | — | — | — | — | — | — | — | — |
| | $ErTaO_4$ | — | — | — | — | — | — | — | — | — | — |
| | $YbTaO_4$ | — | — | — | — | — | — | — | — | — | — |
| | $LuTaO_4$ | — | — | — | — | — | — | — | — | — | — |
| | $Y_2O_3$ and $EuVO_4$ | — | — | — | — | — | — | — | — | — | — |
| | $YVO_4$ and $EuTaO_4$ | — | — | — | — | — | — | — | — | — | — |
| | $Y_2O_3$ and $LuTaO_4$ | — | — | — | — | — | — | — | — | — | — |
| | $YVO_4$ and $LuTaO_4$ | — | — | — | — | — | — | — | — | — | — |
| Thickness of catadioptric layer | Graphene | 10 | 10 | 20 | 20 | 20 | 10 | — | — | — | — |
| | Boron carbide | — | — | — | — | — | — | 30 | 15 | 25 | 20 |
| Thickness of insulating layer | Epoxy resin | 15 | 10 | — | — | — | — | 20 | — | — | 10 |
| | Phenolic resin | — | — | 20 | 20 | — | — | — | — | 15 | — |
| | ABS resin | — | — | — | — | 50 | 100 | — | 10 | — | — |
| Thickness of carbon foam layer | | 20 | 20 | 20 | 20 | 100 | 200 | 30 | 25 | 20 | 35 |

TABLE 3-2

Composition and thickness of each coating layer in Test Examples 21-20 of an ultralimit nickel alloy and its preparation method

| | Test Example | | 11 | 12 | 13 | 14 | 15 | 16 | 17 | 18 | 19 | 20 |
|---|---|---|---|---|---|---|---|---|---|---|---|---|
| Composite bonding layer | Thickness of bonding layer | NiCrCoAlY | — | — | — | — | — | — | — | — | — | — |
| | | CoCrAlY | 70 | — | — | — | — | — | — | — | — | — |
| | | NiCoCrAlY | — | 20 | — | — | — | — | — | — | — | — |
| | | CoNiCrAlY | — | — | 55 | — | — | 35 | — | — | — | 55 |
| | | NiAl | — | — | — | — | 60 | — | — | — | — | — |
| | | NiCr—Al | — | — | — | 30 | — | — | — | 20 | — | — |
| | | Mo | — | — | — | — | — | — | 45 | — | 35 | — |
| | Thickness of precious metal layer | Au | — | — | — | — | — | — | 35 | — | — | — |
| | | Pt | — | — | — | — | — | 55 | — | — | — | — |
| | | Ru | — | — | — | — | — | — | — | 60 | — | — |
| | | Rh | — | — | — | — | — | — | — | — | — | 25 |
| | | Pd | — | — | — | — | — | — | — | — | 50 | — |
| | | Ir | — | — | — | — | — | — | — | — | — | — |
| | | PT-Rh alloy | 20 | — | — | — | 20 | — | — | — | — | — |
| | | Pd—Rh alloy | — | 60 | — | 55 | — | — | — | — | — | — |
| | | Ru—Rh alloy | — | — | 40 | — | — | — | — | — | — | — |
| Composite ceramic layer | Thickness of ceramic A layer | YSZ | — | — | — | — | — | 80 | — | — | — | — |
| | | $Y_2Zr_2O_7$ | — | — | — | — | — | — | 140 | — | — | — |
| | | $Gd_2Zr_2O_7$ | — | — | — | — | — | — | — | — | — | — |
| | | $Nd_2Zr_2O_7$ | — | — | — | — | — | — | — | 100 | — | — |
| | | $Sm_2Zr_2O_7$ | — | — | — | — | — | — | — | — | — | — |
| | | $Eu_2Zr_2O_7$ | 50 | — | — | — | — | — | — | — | 110 | — |
| | | $Dy_2Zr_2O_7$ | — | 70 | — | — | — | — | — | — | — | — |
| | | YSZ and $Sm_2Zr_2O_7$ | — | — | 90 | — | — | — | — | — | — | 180 |
| | | YSZ and $Eu_2Zr_2O_7$ | — | — | — | 60 | — | — | — | — | — | — |
| | | YSZ and $Nd_2Zr_2O_7$ | — | — | — | — | 100 | — | — | — | — | — |
| | Thickness of ceramic B layer | $ZrO_2$—$YTaO_4$ | — | — | — | — | — | 120 | — | — | — | — |
| | | $ZrO_2$—$GdTaO_4$ | — | — | — | — | — | — | — | 50 | — | — |
| | | $ZrO_2$—$NdTaO_4$ | — | — | — | — | — | — | 60 | — | — | — |
| | | $ZrO_2$—$SmTaO_4$ | — | — | — | — | — | — | — | — | 70 | — |
| | | $ZrO_2$—$EuTaO_4$ | 130 | — | — | — | — | — | — | — | — | 100 |
| | | $ZrO_2$—$DyTaO_4$ | — | 90 | — | — | — | — | — | — | — | — |
| | | $ZrO_2$—$ErTaO_4$ | — | — | 70 | — | — | — | — | — | — | — |
| | | $ZrO_2$—$YbTaO_4$ | — | — | — | 90 | — | — | — | — | — | — |
| | | $ZrO_2$—$LuTaO_4$ | — | — | — | — | 60 | — | — | — | — | — |
| Thickness of reflecting layer | | $Y_2O_3$ | — | — | — | — | — | — | — | — | — | — |
| | | $YVO_4$ | — | — | — | — | — | — | — | — | — | — |
| | | $NdVO_4$ | — | — | — | — | — | — | — | — | — | — |
| | | $SmVO_4$ | — | — | — | — | — | — | — | — | — | — |
| | | $EuVO_4$ | — | — | — | — | — | — | — | — | — | — |
| | | $GdVO_4$ | — | — | — | — | — | — | — | — | — | — |
| | | $DyVO_4$ | — | — | — | — | — | — | — | — | — | — |

TABLE 3-2-continued

Composition and thickness of each coating layer in Test Examples
21-20 of an ultralimit nickel alloy and its preparation method

| | Test Example | 11 | 12 | 13 | 14 | 15 | 16 | 17 | 18 | 19 | 20 |
|---|---|---|---|---|---|---|---|---|---|---|---|
| | $ErVO_4$ | — | — | — | — | — | — | — | — | — | — |
| | $YbVO_4$ | — | — | — | — | — | — | — | — | — | — |
| | $LuVO_4$ | — | — | — | — | — | — | — | 20 | — | — |
| | $YTaO_4$ | — | — | — | — | — | — | — | — | — | 18 |
| | $NdTaO_4$ | — | — | — | — | — | — | — | — | 25 | — |
| | $SmTaO_4$ | — | — | — | — | — | — | — | — | — | — |
| | $EuTaO_4$ | — | — | — | — | — | — | — | — | — | — |
| | $GdTaO_4$ | — | — | — | — | — | — | — | — | — | — |
| | $DyTaO_4$ | — | — | — | — | — | — | — | — | — | — |
| | $ErTaO_4$ | — | — | — | — | — | — | 15 | — | — | — |
| | $YbTaO_4$ | — | — | — | — | — | 10 | — | — | — | — |
| | $LuTaO_4$ | — | — | — | — | 20 | — | — | — | — | — |
| | $Y_2O_3$ and $EuVO_4$ | 15 | — | — | — | — | — | — | — | — | — |
| | $YVO_4$ and $EuTaO_4$ | — | 20 | — | — | — | — | — | — | — | — |
| | $Y_2O_3$ and $LuTaO_4$ | — | — | 10 | — | — | — | — | — | — | — |
| | $YVO_4$ and $LuTaO_4$ | — | — | — | 15 | — | — | — | — | — | — |
| Thickness of catadioptric layer | Graphene | 15 | 30 | — | — | 25 | — | 20 | — | — | 23 |
| | Boron carbide | — | — | 15 | 20 | — | 25 | — | 30 | 23 | — |
| Thickness of insulating layer | Epoxy resin | 15 | — | — | 15 | — | — | 25 | 30 | — | 35 |
| | Phenolic resin | — | 10 | — | — | — | — | — | — | 200 | — |
| | ABS resin | — | — | 20 | — | 10 | 20 | — | — | — | — |
| Thickness of carbon foam layer | | 30 | 40 | 45 | 50 | 70 | 50 | 60 | 80 | 100 | 200 |

TABLE 3-3

Composition and thickness of each coating layer in Test Examples
21-30 of an ultralimit nickel alloy and its preparation method

| | | Test Example | 21 | 22 | 23 | 24 | 25 | 26 | 27 | 28 | 29 | 30 |
|---|---|---|---|---|---|---|---|---|---|---|---|---|
| Composite bonding layer | Thickness of bonding layer | NiCrCoAlY | 35 | — | 40 | — | — | — | — | — | — | 45 |
| | | CoCrAlY | — | 50 | — | — | — | — | — | — | — | — |
| | | NiCoCrAlY | — | — | — | — | — | 20 | — | — | — | — |
| | | CoNiCrAlY | — | — | — | — | 60 | — | — | — | — | — |
| | | NiAl | — | — | — | 30 | — | — | — | — | — | — |
| | | NiCr—Al | — | — | — | — | — | — | 80 | 45 | — | — |
| | | Mo | — | — | — | — | — | — | — | — | 65 | — |
| | Thickness of precious metal layer | Au | 55 | — | — | — | — | — | — | — | — | 45 |
| | | Pt | — | 30 | — | — | — | — | — | — | — | — |
| | | Ru | — | — | 60 | — | 40 | — | — | — | 35 | — |
| | | Rh | — | — | — | 70 | — | — | — | — | — | — |
| | | Pd | — | — | — | — | — | 80 | — | 55 | — | — |
| | | Ir | — | — | — | — | — | — | 20 | — | — | — |
| | | PT-Rh alloy | — | — | — | — | — | — | — | — | — | — |
| | | Pd—Rh alloy | — | — | — | — | — | — | — | — | — | — |
| | | Ru—Rh alloy | — | — | — | — | — | — | — | — | — | — |
| Composite ceramic layer | Thickness of ceramic A layer | YSZ | 90 | — | — | — | — | — | — | — | — | 70 |
| | | $Y_2Zr_2O_7$ | — | 50 | — | — | — | — | — | 90 | — | — |
| | | $Gd_2Zr_2O_7$ | — | — | — | — | — | 80 | — | — | — | — |
| | | $Nd_2Zr_2O_7$ | — | — | 150 | — | — | — | 300 | — | 85 | — |
| | | $Sm_2Zr_2O_7$ | — | — | — | 100 | 80 | — | — | — | — | — |
| | | $Eu_2Zr_2O_7$ | — | — | — | — | — | — | — | — | — | — |
| | | $Dy_2Zr_2O_7$ | — | — | — | — | — | — | — | — | — | — |
| | | YSZ and $Sm_2Zr_2O_7$ | — | — | — | — | — | — | — | — | — | — |
| | | YSZ and $Eu_2Zr_2O_7$ | — | — | — | — | — | — | — | — | — | — |
| | | YSZ and $Nd_2Zr_2O_7$ | — | — | — | — | — | — | — | — | — | — |
| | Thickness of ceramic B layer | $ZrO_2$—$YTaO_4$ | — | — | — | — | — | — | — | — | — | 100 |
| | | $ZrO_2$—$GdTaO_4$ | — | — | — | — | — | — | — | — | — | — |
| | | $ZrO_2$—$NdTaO_4$ | — | — | — | — | — | — | — | — | 75 | — |
| | | $ZrO_2$—$SmTaO_4$ | — | — | — | — | — | — | — | — | — | — |
| | | $ZrO_2$—$EuTaO_4$ | — | — | — | — | — | — | — | — | — | — |
| | | $ZrO_2$—$DyTaO_4$ | 80 | — | — | — | — | — | — | 100 | — | — |
| | | $ZrO_2$—$ErTaO_4$ | — | — | — | — | 90 | — | 200 | — | — | — |
| | | $ZrO_2$—$YbTaO_4$ | — | 150 | — | — | — | 100 | — | — | — | — |
| | | $ZrO_2$—$LuTaO_4$ | — | — | 50 | 70 | — | — | — | — | — | — |
| Thickness of reflecting layer | | $Y_2O_3$ | — | — | — | — | — | — | — | — | — | 20 |
| | | $YVO_4$ | — | — | — | — | — | — | — | — | — | — |
| | | $NdVO_4$ | — | — | — | — | — | — | — | — | — | — |
| | | $SmVO_4$ | — | — | — | — | — | — | — | — | — | — |
| | | $EuVO_4$ | — | — | — | — | — | — | — | — | — | — |
| | | $GdVO_4$ | — | — | — | — | — | — | — | — | — | — |
| | | $DyVO_4$ | — | — | — | 22 | — | — | — | — | — | — |

TABLE 3-3-continued

Composition and thickness of each coating layer in Test Examples 21-30 of an ultralimit nickel alloy and its preparation method

| Test Example | | 21 | 22 | 23 | 24 | 25 | 26 | 27 | 28 | 29 | 30 |
|---|---|---|---|---|---|---|---|---|---|---|---|
| | $ErVO_4$ | — | — | — | — | — | 10 | — | — | — | — |
| | $YbVO_4$ | — | — | — | — | — | — | — | — | — | — |
| | $LuVO_4$ | — | — | — | — | — | — | — | — | — | — |
| | $YTaO_4$ | — | — | — | — | — | — | — | — | — | — |
| | $NdTaO_4$ | — | — | — | — | — | — | — | — | — | — |
| | $SmTaO_4$ | 18 | — | — | — | — | — | — | — | — | — |
| | $EuTaO_4$ | — | — | 12 | — | — | — | — | — | — | — |
| | $GdTaO_4$ | — | — | — | — | 15 | — | — | — | — | — |
| | $DyTaO_4$ | — | 12 | — | — | — | — | — | — | — | — |
| | $ErTaO_4$ | — | — | — | — | — | — | — | 30 | — | — |
| | $YbTaO_4$ | — | — | — | — | — | — | 28 | — | — | — |
| | $LuTaO_4$ | — | — | — | — | — | — | — | — | 30 | — |
| | $Y_2O_3$ and $EuVO_4$ | — | — | — | — | — | — | — | — | — | — |
| | $YVO_4$ and $EuTaO_4$ | — | — | — | — | — | — | — | — | — | — |
| | $Y_2O_3$ and $LuTaO_4$ | — | — | — | — | — | — | — | — | — | — |
| | $YVO_4$ and $LuTaO_4$ | — | — | — | — | — | — | — | — | — | — |
| Thickness of catadioptric layer | Graphene | 15 | 28 | — | 18 | — | 13 | 10 | 10 | — | 20 |
| | Boron carbide | — | — | 18 | — | 13 | — | — | — | 15 | — |
| Thickness of insulating layer | Epoxy resin | — | 10 | — | — | — | 180 | — | 160 | — | 15 |
| | Phenolic resin | 30 | — | — | 80 | 100 | — | — | — | — | — |
| | ABS resin | — | — | 60 | — | — | — | 150 | — | 170 | — |
| Thickness of carbon foam layer | | 130 | 150 | 160 | 170 | 175 | 180 | 185 | 190 | 200 | 30 |

Take Test Example 1 of Embodiment 3 as an example to illustrate another technical solution of the present disclosure, that is, a method for preparing an ultralimit nickel alloy. A method for preparing an ultralimit nickel alloy, including the following operations:

Operation 1: basically the same as operation 1 of preparing ultralimit magnesium alloy in Embodiment 1, except that GH4099 nickel alloy serves as the alloy matrix in this test example.

Operation 2: basically the same as that in Embodiment 1, except that the thickness of the deposited bonding layer is 45 μm, and the thickness of the precious metal layer is 45 μm.

Operation 3: a layer of YSZ is sprayed on the surface of the bonding layer as a ceramic A layer by the HVOF method. Then, a layer of $YTaO_4$ is sprayed on the ceramic A layer as a ceramic B layer by the HVOF method, such that a composite ceramic layer is formed. The thickness of the ceramic A layer is 70 μm, and the thickness of the ceramic B layer is 80 μm.

Operation 4: same as that in Embodiment 1.

Operation 5: same as that in Embodiment 1.

Operation 6: a layer of epoxy resin is brushed on the surface of the catadioptric layer as an insulating layer, and the thickness of the insulating layer is 15 μm.

Operation 7: a layer of carbon foam layer is brushed on the insulating layer. The thickness of the carbon foam layer is 20 μm. The ultralimit nickel alloy is obtained.

The only difference between Test Examples 2-29 and Test Example 1 is that the parameters are different as shown in Table 3-1. The difference between Test Example 30 and Test Example 1 is that the spraying sequence of the ceramic A layer and the ceramic B layer in operation 3 is different.

Experiments:

13 groups of Comparative Examples are provided to perform comparative experiments with Test Examples 1-30. The parameters of Comparative Examples 1-12 are shown in Table 3-4 (thickness unit: μm):

TABLE 3-4

Composition and thickness of each coating layer in Comparative Examples 1-12

| Comparative Example | | | 1 | 2 | 3 | 4 | 5 | 6 | 7 | 8 | 9 | 10 | 11 | 12 |
|---|---|---|---|---|---|---|---|---|---|---|---|---|---|---|
| Composite bonding layer | Thickness of bonding layer | NiCrCoAlY | 45 | 50 | 30 | 20 | 40 | — | — | — | — | 45 | 45 | 50 |
| | | MCrAlY | — | — | — | — | — | 40 | — | 30 | 40 | — | — | — |
| | | NiAl | — | — | — | — | — | — | — | — | — | — | — | — |
| | | NiCr—Al | — | — | — | — | — | — | — | — | — | — | — | — |
| | | Mo | 30 | — | — | — | — | — | 50 | — | — | 90 | 50 | 45 |
| | Thickness of precious metal layer | Au | — | 20 | — | — | — | — | — | 60 | — | — | — | — |
| | | Pt | — | — | 40 | — | — | — | — | — | 50 | — | — | — |
| | | Ru | — | — | — | 40 | — | — | — | — | — | — | — | — |
| | | Rh | — | — | — | — | 30 | — | — | — | — | — | — | — |
| | | Pd | — | — | — | — | — | 30 | — | — | — | — | — | — |
| | | Ir | — | — | — | — | — | — | 60 | — | — | — | — | — |
| Composite ceramic layer | Thickness of ceramic A layer | YSZ | — | — | 60 | 55 | — | — | — | — | — | — | — | — |
| | | $Y_2Zr_2O_7$ | 50 | — | — | — | 35 | — | — | — | — | — | — | — |
| | | $Gd_2Zr_2O_7$ | — | 45 | — | — | — | — | — | — | — | — | — | — |
| | | $Nd_2Zr_2O_7$ | — | — | — | — | — | 300 | — | — | — | — | — | — |
| | | $Sm_2Zr_2O_7$ | — | — | — | — | — | — | — | 200 | — | — | — | — |
| | | $Eu_2Zr_2O_7$ | — | — | — | — | — | — | — | — | 250 | — | — | — |
| | | $Dy_2Zr_2O_7$ | — | — | — | — | — | — | 350 | — | — | — | — | — |

TABLE 3-4-continued

Composition and thickness of each coating layer in Comparative Examples 1-12

| | Comparative Example | 1 | 2 | 3 | 4 | 5 | 6 | 7 | 8 | 9 | 10 | 11 | 12 |
|---|---|---|---|---|---|---|---|---|---|---|---|---|---|
| Thickness of ceramic B layer | ZrO$_2$—YTaO$_4$ | 40 | — | — | — | — | — | — | — | — | — | — | — |
| | ZrO$_2$—GdTaO$_4$ | — | — | — | 30 | — | — | — | — | — | — | — | — |
| | ZrO$_2$—NdTaO$_4$ | — | 50 | — | — | — | — | — | — | — | — | — | — |
| | ZrO$_2$—SmTaO$_4$ | — | — | — | — | — | — | — | 450 | — | — | — | — |
| | ZrO$_2$—EuTaO$_4$ | — | — | 20 | — | — | — | — | — | — | — | — | — |
| | ZrO$_2$—DyTaO$_4$ | — | — | — | — | — | 350 | — | — | — | — | — | — |
| | ZrO$_2$—ErTaO$_4$ | — | — | — | — | 30 | — | — | — | — | — | — | — |
| | ZrO$_2$—YbTaO$_4$ | — | — | — | — | — | — | 250 | — | — | — | — | — |
| | ZrO$_2$—LuTaO$_4$ | — | — | — | — | — | — | — | — | 300 | — | — | — |
| Thickness of reflecting layer | Y$_2$O$_3$ | 5 | — | — | — | — | — | — | — | — | 20 | — | — |
| | YVO$_4$ | — | 8 | — | — | — | — | — | — | 35 | — | — | — |
| | GdVO$_4$ | — | — | 5 | — | — | 38 | — | — | — | — | — | 20 |
| | YTaO$_4$ | — | — | — | 35 | — | — | — | 8 | — | — | — | — |
| | GdTaO$_4$ | — | — | — | — | 8 | 35 | — | — | — | — | — | — |
| Thickness of catadioptric layer | Graphene | 5 | — | 9 | — | 35 | 38 | — | 45 | 50 | 20 | 20 | 20 |
| | Boron carbide | — | 8 | — | 6 | — | — | 40 | — | — | — | — | — |
| Thickness of insulating layer | Epoxy resin | 5 | — | — | — | 25 | — | 30 | — | — | 15 | 15 | 15 |
| | Phenolic resin | — | 9 | — | — | — | — | — | — | 40 | — | — | — |
| | ABS resin | — | — | 8 | 5 | — | 28 | — | 35 | — | — | — | — |
| Thickness of carbon foam layer | | 15 | 10 | 18 | 5 | 250 | 220 | 230 | 260 | 280 | 10 | 10 | — |

The only difference between Comparative Examples 1-12 and Test Example 1 is that the parameters as shown in Table 3-3 are different; the Comparative Example 13 uses GH4099 nickel alloy.

Figure 2C:
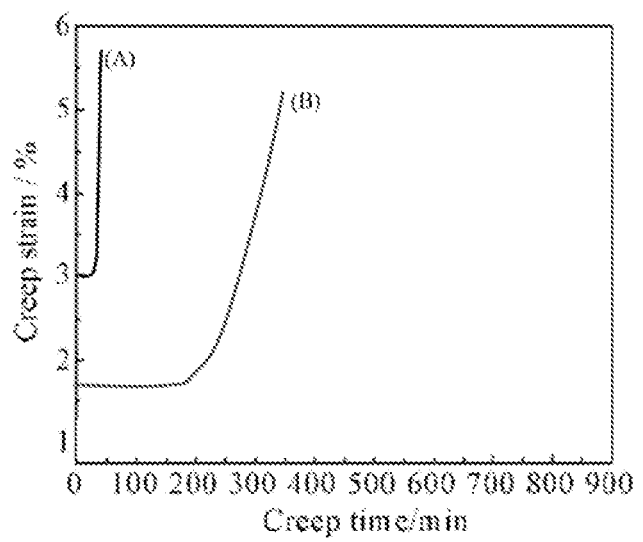
FIG. 2C shows creep test curves of Test Example 1 and Comparative Example 13 at 50 MPa and 1800° C. according to Embodiment 3 (ultralimit nickel alloy) of the present disclosure.

The following experiments are performed using the nickel alloys provided in Test Examples 1-30 and Comparative Examples 1-13:

High Temperature Creep Test:

The nickel alloys provided in Test Examples 1-30 and Comparative Examples 1-13 are processed into columnar test pieces with a length of 187 mm and a diameter of 16 mm. The procedure of the high temperature creep test is basically the same as that in Embodiment 1, except that when the temperature of the test machine reaches 1800° C., the stress of the test machine is adjusted to 50 MPa, and the high temperature creep test is carried out. Take Test Example 1 and Comparative Example 13 as examples, the experimental results are shown in FIG. 2C (in FIG. 2C, (A) represents Comparative Example 13, and (B) represents Test Example 1). The specific experimental results of Test Examples 1-30 and Comparative Examples 1-13 are shown in Table 3-5.

It can be observed from FIG. 2C that there are three stages of creep in both test pieces (A) and (B). However, when the temperature exceeds the melting point of GH4099 nickel alloy, the creep rupture of test piece (A) occurs within a very short period of time. Therefore, it can be concluded that GH4099 nickel alloy can hardly carry loads at a temperature higher than its melting point. Compared with test piece (A), the creep resistance of test piece (B) is significantly improved. The steady-state creep time of the test piece (B) is longer. It can be observed that after a long steady-state creep stage, the creep curve enters an accelerated creep stage, and the creep rupture occurs. Therefore, it can be concluded that, compared with the original GH4099 nickel alloy, the ultralimit nickel alloy provided by the present disclosure maintains good mechanical properties without rupturing at a temperature exceeding the melting point of GH4099 nickel alloy, and has excellent high-temperature resistance.

Figure 3C:
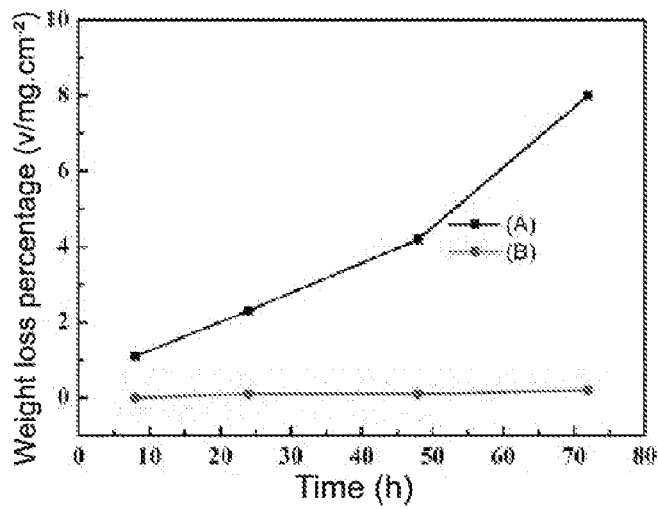
FIG. 3C is a schematic diagram of the salt-spray corrosion test results of Test Example 1 and Comparative Example 13 according to Embodiment 3 (ultralimit nickel alloy) of the present disclosure.

Salt-Spray Corrosion Test:

The nickel alloy provided in Test Examples 1-30 and Comparative Examples 1-13 are processed into test pieces of 50 mm×25 mm×2 mm, and the subsequent operations and experimental conditions are the same as those of Embodiment 1. The weight loss of the test pieces is shown in FIG. 3C (in FIG. 3C, (A) represents Comparative Example 13, and (B) represents Test Example 1). The specific experimental results of Test Examples 1-30 and Comparative Examples 1-13 are shown in Table 3-5.

It can be concluded from FIG. 3C that test pieces (A) and (B) have obviously different corrosion patterns. For test piece (A), the corrosion weight loss value tends to increase as the corrosion time extends. In the early stage of corrosion (8-24 h), there is an oxidation film on the surface of the test piece, which prevents the nickel alloy matrix from contacting the solution; the corrosion rate is low. In the middle stage of corrosion (24-48 h), the Cl$^-$ in the solution has penetrated the oxidation film, and a large amount of Cl$^-$ is adsorbed on the matrix, which increases the corrosion pit points and deepens the original corrosion pit points; the corrosion rate is obviously accelerated. After 48 hours of continuous spraying, the corrosion products are evenly distributed and the thickness increases, covering almost the entire surface of the test piece. Cl$^-$ needs to pass through the corrosion products to contact the nickel alloy matrix, which reduces the amount of Cl$^-$ adsorbed on the matrix surface and reduces the corrosion rate. In general, the corrosion loss weight of test piece (A) is much higher than that of test piece (B). Basically, the test piece (B) has no corrosion due to the existence of the coating layers, and the mass of the test piece (B) has hardly changed. Therefore, the ultralimit nickel alloy provided by the present disclosure has good corrosion resistance.

The experimental results are shown in Table 3-5: (A. the steady creep time of the test pieces under 50 Mpa and 1800° C. (min); B. the time when creep rupture of the test pieces happens under 50 Mpa and 1800° C. (min); C. the weight loss (v/mg·cm$^2$) of the test pieces after continuously spraying NaCl solution on the test pieces for 8 hours; D. the weight loss (v/mg·cm$^2$) of the test pieces after continuously spraying NaCl solution on the test pieces for 24 hours; E. the weight loss (v/mg·cm$^2$) of the test pieces after continuously spraying NaCl solution on the test pieces for 48 hours; F. the weight loss (v/mg·cm$^2$) of the test pieces after continuously spraying NaCl solution on the test pieces for 72 hours))

TABLE 3-5

Experimental results of high temperature creep test and salt-spray test

| | A | B | C | D | E | F |
|---|---|---|---|---|---|---|
| Test Example 1 | 180 | 330 | 0 | 0.01 | 0.02 | 0.1 |
| Test Example 2 | 165 | 320 | 0 | 0.01 | 0.025 | 0.15 |
| Test Example 3 | 165 | 315 | 0 | 0.015 | 0.027 | 0.13 |
| Test Example 4 | 170 | 315 | 0.005 | 0.015 | 0.027 | 0.15 |
| Test Example 5 | 170 | 320 | 0.004 | 0.017 | 0.027 | 0.16 |
| Test Example 6 | 165 | 320 | 0.005 | 0.018 | 0.028 | 0.13 |
| Test Example 7 | 170 | 325 | 0 | 0.018 | 0.03 | 0.13 |
| Test Example 8 | 165 | 320 | 0 | 0.018 | 0.03 | 0.14 |
| Test Example 9 | 165 | 320 | 0.006 | 0.018 | 0.028 | 0.15 |
| Test Example 10 | 165 | 335 | 0.006 | 0.017 | 0.028 | 0.15 |
| Test Example 11 | 160 | 315 | 0.005 | 0.017 | 0.028 | 0.14 |
| Test Example 12 | 160 | 315 | 0.005 | 0.018 | 0.029 | 0.14 |
| Test Example 13 | 160 | 315 | 0.004 | 0.018 | 0.028 | 0.14 |
| Test Example 14 | 165 | 315 | 0 | 0.019 | 0.029 | 0.15 |
| Test Example 15 | 165 | 320 | 0 | 0.018 | 0.028 | 0.15 |
| Test Example 16 | 170 | 320 | 0.005 | 0.019 | 0.029 | 0.15 |
| Test Example 17 | 160 | 325 | 0.005 | 0.018 | 0.028 | 0.14 |
| Test Example 18 | 170 | 315 | 0.005 | 0.019 | 0.03 | 0.14 |
| Test Example 19 | 165 | 315 | 0 | 0.019 | 0.029 | 0.15 |
| Test Example 20 | 165 | 320 | 0 | 0.019 | 0.03 | 0.15 |
| Test Example 21 | 160 | 320 | 0 | 0.018 | 0.028 | 0.13 |
| Test Example 22 | 165 | 325 | 0.005 | 0.019 | 0.028 | 0.13 |
| Test Example 23 | 165 | 325 | 0.003 | 0.018 | 0.029 | 0.15 |
| Test Example 24 | 160 | 320 | 0.004 | 0.019 | 0.028 | 0.14 |
| Test Example 25 | 165 | 320 | 0.003 | 0.018 | 0.029 | 0.15 |
| Test Example 26 | 160 | 315 | 0.004 | 0.018 | 0.03 | 0.14 |
| Test Example 27 | 160 | 315 | 0.003 | 0.018 | 0.03 | 0.17 |
| Test Example 28 | 160 | 320 | 0.004 | 0.019 | 0.028 | 0.18 |
| Test Example 29 | 165 | 320 | 0 | 0.019 | 0.029 | 0.16 |
| Test Example 30 | 165 | 315 | 0.002 | 0.018 | 0.029 | 0.15 |
| Comparative Example 1 | 145 | 285 | 0.03 | 0.025 | 0.038 | 0.25 |
| Comparative Example 2 | 145 | 285 | 0.01 | 0.025 | 0.041 | 0.25 |
| Comparative Example 3 | 140 | 275 | 0.01 | 0.025 | 0.041 | 0.21 |
| Comparative Example 4 | 150 | 275 | 0.009 | 0.023 | 0.035 | 0.21 |
| Comparative Example 5 | 155 | 285 | 0.009 | 0.021 | 0.035 | 0.21 |
| Comparative Example 6 | 150 | 290 | 0.008 | 0.021 | 0.036 | 0.22 |
| Comparative Example 7 | 150 | 285 | 0.01 | 0.023 | 0.038 | 0.21 |
| Comparative Example 8 | 150 | 385 | 0.01 | 0.022 | 0.036 | 0.22 |
| Comparative Example 9 | 150 | 285 | 0.009 | 0.021 | 0.036 | 0.22 |
| Comparative Example 10 | 140 | 265 | 0.02 | 0.021 | 0.041 | 0.26 |
| Comparative Example 11 | 135 | 275 | 0.02 | 0.025 | 0.042 | 0.27 |
| Comparative Example 12 | 145 | 265 | 0.02 | 0.025 | 0.041 | 0.25 |

In summary, the ultralimit nickel alloy prepared by the ultralimit nickel alloy preparation method of the present disclosure has a wide service temperature range and strong corrosion resistance; the effects of Test Example 1 are the best. Compared with the ultralimit nickel alloy provided by the present disclosure, the nickel alloy with parameters beyond the range provided in the test examples of the present embodiment has a much lower maximum service temperature and poorer corrosion resistance.

Embodiment 4 (Ultralimit Titanium Alloy)

In this embodiment, the ultralimit alloy is an ultralimit titanium alloy, that is, the alloy matrix is a titanium alloy matrix.

Figure 1B:
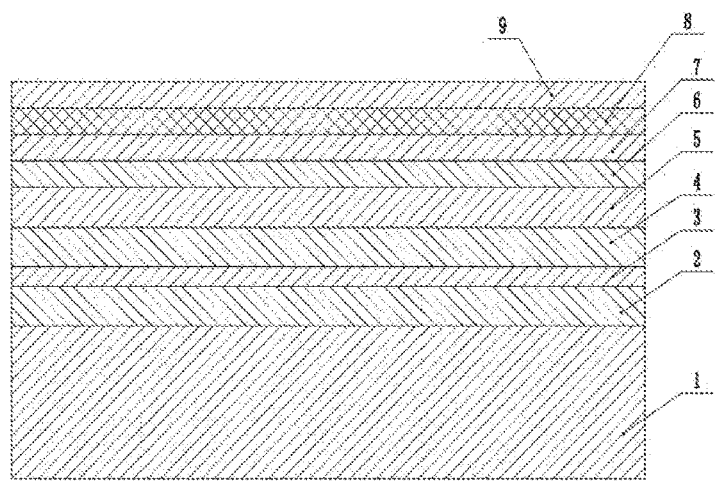
FIG. 1B is a schematic diagram of the ultralimit titanium alloy (Embodiment 4), ultralimit iron alloy (Embodiment 5) and ultralimit copper alloy (Embodiment 6) of the present disclosure.

The reference signs in FIG. 1B include: titanium alloy matrix 1, bonding layer 2, precious metal layer 3, ceramic A layer 4, ceramic B layer 5, reflecting layer 6, catadioptric layer 7, insulating layer 8, and carbon foam layer 9.

As shown in FIG. 1B, the present disclosure provides an ultralimit titanium alloy, including an titanium alloy matrix 1. The surface of the titanium alloy matrix 1 is successively deposited with a composite bonding layer, a composite ceramic layer with a thickness of 100-150 μm, a reflecting layer 6 with a thickness of 10-30 μm, a catadioptric layer 7 with a thickness of 20-30 μm, an insulating layer 8 with a thickness of 100-200 μm and a carbon foam layer 9 with a thickness of 20-200 μm. The composite bonding layer includes a bonding layer 2 deposited on the surface of the titanium alloy matrix 1 and a precious metal layer 3 deposited on the surface of the bonding layer 2. The thickness of the bonding layer 2 is 20-30 μm, and the thickness of the precious metal layer is 40-60 μm. The composition of the bonding layer 2 is one or more of MCrAlY, NiAl, NiCr—Al and Mo; MCrAlY is NiCrCoAlY, NiCoCrAlY, CoNiCrAlY or CoCrAlY. The composition of the precious metal layer 3 is one of or an alloy of more of Au, Pt, Ru, Rh, Pd, and Ir. The composite ceramic layer includes a ceramic A layer 4 and a ceramic B layer 5. The composition of the ceramic A layer 4 is YSZ or rare earth zirconate ($RE_2Zr_2O_7$, RE=Y, Gd, Nd, Sm, Eu or Dy). The composition of the ceramic B layer 5 is $ZrO_2$-$RETaO_4$ (RE=Y, Gd, Nd, Sm, Eu, Dy, Er, Yb or Lu). The reflecting layer 6 is one or more of $REVO_4$, $RETaO_4$ and $Y_2O_3$, and RE=Y, Nd, Sm, Eu, Gd, Dy, Er, Yb or Lu. The composition of the catadioptric layer 7 is one or two of graphene and boron carbide, and the spatial distribution of the graphene and boron carbide are in a disorderly arranged state. The composition of the insulating layer 8 is one or more of epoxy resin, phenolic resin, and ABS resin.

The present disclosure uses $ZrO_2$-$RETaO_4$ as the ceramic B layer, which has the effects of low thermal conductivity and high expansion rate, and can reduce heat conduction; The method for preparing $ZrO_2$-$RETaO_4$ is the same as that of Embodiment 1, and the $ZrO_2$-$RETaO_4$ can meet the requirements of APS spraying technology on powder particle size and shape. Based on extensive experiments, the inventors obtain ultralimit titanium alloys with the largest increase in service temperature, small increase in weight of the titanium alloy and the best composition and thickness of the coating layers within the parameter scope of the present disclosure. In the present disclosure, 30 of them are listed for description.

The parameters of Test Examples 1-30 of an ultralimit titanium alloy and its preparation method according to the present disclosure are shown in Table 4-1, Table 4-2, and Table 4-3 (thickness unit: μm):

TABLE 4-1

Composition and thickness of each coating layer in Test Examples 1-10 of an ultralimit titanium alloy and its preparation method

| Test Example | | | 1 | 2 | 3 | 4 | 5 | 6 | 7 | 8 | 9 | 10 |
|---|---|---|---|---|---|---|---|---|---|---|---|---|
| Composite bonding layer | Composition and thickness of bonding layer | NiCrCoAlY | 20 | 30 | 20 | 25 | 30 | — | — | — | — | — |
| | | CoCrAlY | — | — | — | — | — | — | — | — | — | — |
| | | NiCoCrAlY | — | — | — | — | — | — | — | — | — | — |
| | | CoNiCrAlY | — | — | — | — | — | — | — | — | — | — |
| | | NiAl | — | — | — | — | — | 30 | 20 | 25 | 20 | 25 |
| | | NiCr—Al | — | — | — | — | — | — | — | — | — | — |
| | | Mo alloy | — | — | — | — | — | — | — | — | — | — |

TABLE 4-1-continued

Composition and thickness of each coating layer in Test Examples
1-10 of an ultralimit titanium alloy and its preparation method

| | Test Example | | 1 | 2 | 3 | 4 | 5 | 6 | 7 | 8 | 9 | 10 |
|---|---|---|---|---|---|---|---|---|---|---|---|---|
| | Composition and thickness of precious layer | Au | 50 | — | — | — | — | — | 45 | — | — | — |
| | | Pt | — | 40 | — | — | — | — | — | 60 | — | — |
| | | Ru | — | — | 60 | — | — | — | — | — | 50 | — |
| | | Rh | — | — | — | 50 | — | — | — | — | — | 50 |
| | | Pd | — | — | — | — | 40 | — | — | — | — | — |
| | | Ir | — | — | — | — | — | 50 | — | — | — | — |
| | | PT-Rh alloy | — | — | — | — | — | — | — | — | — | — |
| | | Pd—Rh alloy | — | — | — | — | — | — | — | — | — | — |
| | | Ru—Rh alloy | — | — | — | — | — | — | — | — | — | — |
| Composite ceramic layer | Composition and thickness of ceramic A layer | YSZ | 70 | 60 | 80 | 90 | 110 | 50 | — | — | — | — |
| | | $Y_2Zr_2O_7$ | — | — | — | — | — | — | 40 | — | — | — |
| | | $Gd_2Zr_2O_7$ | — | — | — | — | — | — | — | 80 | — | — |
| | | $Nd_2Zr_2O_7$ | — | — | — | — | — | — | — | — | 60 | — |
| | | $Sm_2Zr_2O_7$ | — | — | — | — | — | — | — | — | — | 60 |
| | | $Eu_2Zr_2O_7$ | — | — | — | — | — | — | — | — | — | — |
| | | $Dy_2Zr_2O_7$ | — | — | — | — | — | — | — | — | — | — |
| | | YSZ and $Sm_2Zr_2O_7$ | — | — | — | — | — | — | — | — | — | — |
| | | YSZ and $Eu_2Zr_2O_7$ | — | — | — | — | — | — | — | — | — | — |
| | | YSZ and $Nd_2Zr_2O_7$ | — | — | — | — | — | — | — | — | — | — |
| | Composition and thickness of ceramic B layer | $ZrO_2$—$YTaO_4$ | 80 | 90 | — | 50 | — | — | 70 | — | — | — |
| | | $ZrO_2$—$GdTaO_4$ | — | — | 70 | — | 40 | 50 | — | 50 | — | — |
| | | $ZrO_2$—$NdTaO_4$ | — | — | — | — | — | — | — | — | 60 | — |
| | | $ZrO_2$—$SmTaO_4$ | — | — | — | — | — | — | — | — | — | 70 |
| | | $ZrO_2$—$EuTaO_4$ | — | — | — | — | — | — | — | — | — | — |
| | | $ZrO_2$—$DyTaO_4$ | — | — | — | — | — | — | — | — | — | — |
| | | $ZrO_2$—$ErTaO_4$ | — | — | — | — | — | — | — | — | — | — |
| | | $ZrO_2$—$YbTaO_4$ | — | — | — | — | — | — | — | — | — | — |
| | | $ZrO_2$—$LuTaO_4$ | — | — | — | — | — | — | — | — | — | — |
| Composition and thickness of reflecting layer | | $Y_2O_3$ | 10 | 10 | — | — | — | — | 15 | — | — | — |
| | | $YVO_4$ | — | — | 20 | — | 30 | 10 | — | — | — | — |
| | | $NdVO_4$ | — | — | — | — | — | — | — | — | — | — |
| | | $SmVO_4$ | — | — | — | — | — | — | — | — | — | — |
| | | $EuVO_4$ | — | — | — | — | — | — | — | — | — | — |
| | | $GdVO_4$ | — | — | — | — | — | — | — | — | — | 10 |
| | | $DyVO_4$ | — | — | — | — | — | — | — | — | — | — |
| | | $ErVO_4$ | — | — | — | — | — | — | — | — | — | — |
| | | $YbVO_4$ | — | — | — | — | — | — | — | — | — | — |
| | | $LuVO_4$ | — | — | — | — | — | — | — | — | — | — |
| | | $YTaO_4$ | — | — | — | 20 | — | — | — | 10 | 20 | — |
| | | $NdTaO_4$ | — | — | — | — | — | — | — | — | — | — |
| | | $SmTaO_4$ | — | — | — | — | — | — | — | — | — | — |
| | | $EuTaO_4$ | — | — | — | — | — | — | — | — | — | — |
| | | $GdTaO_4$ | — | — | — | — | — | — | — | — | — | — |
| | | $DyTaO_4$ | — | — | — | — | — | — | — | — | — | — |
| | | $ErTaO_4$ | — | — | — | — | — | — | — | — | — | — |
| | | $YbTaO_4$ | — | — | — | — | — | — | — | — | — | — |
| | | $LuTaO_4$ | — | — | — | — | — | — | — | — | — | — |
| | | $Y_2O_3$ and $EuVO_4$ | — | — | — | — | — | — | — | — | — | — |
| | | $YVO_4$ and $EuTaO_4$ | — | — | — | — | — | — | — | — | — | — |
| | | $Y_2O_3$ and $LuTaO_4$ | — | — | — | — | — | — | — | — | — | — |
| | | $YVO_4$ and $LuTaO_4$ | — | — | — | — | — | — | — | — | — | — |
| Composition and thickness of catadioptric layer | | Graphene | 20 | 20 | 20 | 20 | 30 | 20 | — | — | — | — |
| | | Boron carbide | — | — | — | — | — | — | 30 | 25 | 25 | 20 |
| Composition and thickness of insulating layer | | Epoxy resin | 150 | 100 | — | — | — | — | 200 | — | — | 100 |
| | | Phenolic resin | — | — | 200 | 200 | — | — | — | — | 150 | — |
| | | ABS resin | — | — | — | — | 150 | 100 | — | 100 | — | — |
| Thickness of carbon foam layer | | | 20 | 20 | 20 | 20 | 100 | 200 | 30 | 25 | 20 | 35 |

TABLE 4-2

Composition and thickness of each coating layer in Test Examples
11-20 of an ultralimit titanium alloy and its preparation method

| | Test Example | | 11 | 12 | 13 | 14 | 15 | 16 | 17 | 18 | 19 | 20 |
|---|---|---|---|---|---|---|---|---|---|---|---|---|
| Composite bonding layer | Composition and thickness of bonding layer | NiCrCoAlY | — | — | — | — | — | — | — | — | — | — |
| | | CoCrAlY | 20 | — | — | — | — | — | — | — | — | — |
| | | NiCoCrAlY | — | 25 | — | — | — | — | — | — | — | — |
| | | CoNiCrAlY | — | — | 25 | — | — | 30 | — | — | — | 30 |
| | | NiAl | — | — | — | — | 30 | — | — | — | — | — |

TABLE 4-2-continued

Composition and thickness of each coating layer in Test Examples
11-20 of an ultralimit titanium alloy and its preparation method

| | | Test Example | 11 | 12 | 13 | 14 | 15 | 16 | 17 | 18 | 19 | 20 |
|---|---|---|---|---|---|---|---|---|---|---|---|---|
| | | NiCr—Al | — | — | — | 25 | — | — | — | 25 | — | — |
| | | Mo alloy | — | — | — | — | — | — | 30 | — | 25 | — |
| | Composition and | Au | — | — | — | — | — | — | 50 | — | — | — |
| | thickness of | Pt | — | — | — | — | — | 50 | — | — | — | — |
| | precious layer | Ru | — | — | — | — | — | — | — | 60 | — | — |
| | | Rh | — | — | — | — | — | — | — | — | — | 50 |
| | | Pd | — | — | — | — | — | — | — | — | 45 | — |
| | | Ir | — | — | — | — | — | — | — | — | — | — |
| | | PT-Rh alloy | 40 | — | — | — | 50 | — | — | — | — | — |
| | | Pd—Rh alloy | — | 40 | — | 50 | — | — | — | — | — | — |
| | | Ru—Rh alloy | — | — | 60 | — | — | — | — | — | — | — |
| Composite | Composition and | YSZ | — | — | — | — | — | 80 | — | — | — | — |
| ceramic layer | thickness of | $Y_2Zr_2O_7$ | — | — | — | — | — | — | 70 | — | — | — |
| | ceramic A layer | $Gd_2Zr_2O_7$ | — | — | — | — | — | — | — | — | — | — |
| | | $Nd_2Zr_2O_7$ | — | — | — | — | — | — | — | 100 | — | — |
| | | $Sm_2Zr_2O_7$ | — | — | — | — | — | — | — | — | — | — |
| | | $Eu_2Zr_2O_7$ | 50 | — | — | — | — | — | — | — | 80 | — |
| | | $Dy_2Zr_2O_7$ | — | 40 | — | — | — | — | — | — | — | — |
| | | YSZ and $Sm_2Zr_2O_7$ | — | — | 60 | — | — | — | — | — | — | 50 |
| | | YSZ and $Eu_2Zr_2O_7$ | — | — | — | 60 | — | — | — | — | — | — |
| | | YSZ and $Nd_2Zr_2O_7$ | — | — | — | — | 80 | — | — | — | — | — |
| | Composition and | $ZrO_2$—$YTaO_4$ | — | — | — | — | — | 60 | — | — | — | — |
| | thickness of | $ZrO_2$—$GdTaO_4$ | — | — | — | — | — | — | — | 50 | — | — |
| | ceramic B layer | $ZrO_2$—$NdTaO_4$ | — | — | — | — | — | — | 60 | — | — | — |
| | | $ZrO_2$—$SmTaO_4$ | — | — | — | — | — | — | — | — | 70 | — |
| | | $ZrO_2$—$EuTaO_4$ | 100 | — | — | — | — | — | — | — | — | 100 |
| | | $ZrO_2$—$DyTaO_4$ | — | 110 | — | — | — | — | — | — | — | — |
| | | $ZrO_2$—$ErTaO_4$ | — | — | 80 | — | — | — | — | — | — | — |
| | | $ZrO_2$—$YbTaO_4$ | — | — | — | 90 | — | — | — | — | — | — |
| | | $ZrO_2$—$LuTaO_4$ | — | — | — | — | 50 | — | — | — | — | — |
| Composition and | | $Y_2O_3$ | — | — | — | — | — | — | — | — | — | — |
| thickness of | | $YVO_4$ | — | — | — | — | — | — | — | — | — | — |
| reflecting layer | | $NdVO_4$ | — | — | — | — | — | — | — | — | — | — |
| | | $SmVO_4$ | — | — | — | — | — | — | — | — | — | — |
| | | $EuVO_4$ | — | — | — | — | — | — | — | 20 | — | — |
| | | $GdVO_4$ | — | — | — | — | — | — | — | — | — | — |
| | | $DyVO_4$ | — | — | — | — | — | — | — | — | — | — |
| | | $ErVO_4$ | — | — | — | — | — | — | — | — | — | 18 |
| | | $YbVO_4$ | — | — | — | — | — | — | — | — | — | — |
| | | $LuVO_4$ | — | — | — | — | — | — | — | — | — | — |
| | | $YTaO_4$ | — | — | — | — | — | — | — | — | — | — |
| | | $NdTaO_4$ | — | — | — | — | — | — | — | — | — | — |
| | | $SmTaO_4$ | — | — | — | — | — | — | — | — | — | — |
| | | $EuTaO_4$ | — | — | — | — | — | — | — | — | 25 | — |
| | | $GdTaO_4$ | — | — | — | — | — | — | — | — | — | — |
| | | $DyTaO_4$ | — | — | — | — | — | — | — | — | — | — |
| | | $ErTaO_4$ | — | — | — | — | — | — | — | — | — | — |
| | | $YbTaO_4$ | — | — | — | — | — | — | — | — | — | — |
| | | $LuTaO_4$ | — | — | — | — | — | — | — | — | — | — |
| | | $Y_2O_3$ and $EuVO_4$ | 15 | — | — | — | — | 10 | — | — | — | — |
| | | $YVO_4$ and $EuTaO_4$ | — | 20 | — | — | — | — | 15 | — | — | — |
| | | $Y_2O_3$ and $LuTaO_4$ | — | — | 10 | — | 20 | — | — | — | — | — |
| | | $YVO_4$ and $LuTaO_4$ | — | — | — | 15 | — | — | — | — | — | — |
| Composition and | | Graphene | 25 | 30 | — | — | 25 | — | 20 | — | — | 23 |
| thickness of | | Boron carbide | — | — | 25 | 20 | — | 25 | — | 30 | 23 | — |
| catadioptric layer | | | | | | | | | | | | |
| Composition and | | Epoxy resin | 150 | — | — | 150 | — | — | 250 | 200 | — | 135 |
| thickness of | | Phenolic resin | — | 100 | — | — | — | — | — | — | 150 | — |
| insulating layer | | ABS resin | — | — | 200 | — | 110 | 200 | — | — | — | — |
| Thickness of carbon foam layer | | | 30 | 40 | 45 | 50 | 70 | 50 | 60 | 80 | 100 | 120 |

TABLE 4-3

Composition and thickness of each coating layer in Test Examples
21-30 of an ultralimit titanium alloy and its preparation method

| | | Test Example | 21 | 22 | 23 | 24 | 25 | 26 | 27 | 28 | 29 | 30 |
|---|---|---|---|---|---|---|---|---|---|---|---|---|
| Composite | Composition and | NiCrCoAlY | 20 | — | 30 | — | — | — | — | — | — | 95 |
| bonding layer | thickness of | CoCrAlY | — | 20 | — | — | — | — | — | — | — | — |
| | bonding layer | NiCoCrAlY | — | — | — | — | — | 25 | — | — | — | — |
| | | CoNiCrAlY | — | — | — | — | 25 | — | — | — | — | — |

TABLE 4-3-continued

Composition and thickness of each coating layer in Test Examples
21-30 of an ultralimit titanium alloy and its preparation method

| | | Test Example | 21 | 22 | 23 | 24 | 25 | 26 | 27 | 28 | 29 | 30 |
|---|---|---|---|---|---|---|---|---|---|---|---|---|
| | | NiAl | — | — | — | 30 | — | — | — | — | — | — |
| | | NiCr—Al | — | — | — | — | — | — | 20 | 20 | — | — |
| | | Mo alloy | — | — | — | — | — | — | — | — | 30 | — |
| | Composition and thickness of precious layer | Au | 40 | — | — | — | — | — | — | — | — | 45 |
| | | Pt | — | 60 | — | — | — | — | — | — | — | — |
| | | Ru | — | — | 60 | — | 50 | — | — | — | 55 | — |
| | | Rh | — | — | — | 50 | — | — | — | — | — | — |
| | | Pd | — | — | — | — | — | 40 | — | 55 | — | — |
| | | Ir | — | — | — | — | — | — | 40 | — | — | — |
| | | PT-Rh alloy | — | — | — | — | — | — | — | — | — | — |
| | | Pd—Rh alloy | — | — | — | — | — | — | — | — | — | — |
| | | Ru—Rh alloy | — | — | — | — | — | — | — | — | — | — |
| Composite ceramic layer | Composition and thickness of ceramic A layer | YSZ | 90 | — | — | — | — | — | — | — | — | 70 |
| | | $Y_2Zr_2O_7$ | — | 50 | — | — | — | — | — | 90 | — | — |
| | | $Gd_2Zr_2O_7$ | — | — | — | — | — | 80 | — | — | — | — |
| | | $Nd_2Zr_2O_7$ | — | — | 100 | — | — | — | 70 | — | 75 | — |
| | | $Sm_2Zr_2O_7$ | — | — | — | 100 | 80 | — | — | — | — | — |
| | | $Eu_2Zr_2O_7$ | — | — | — | — | — | — | — | — | — | — |
| | | $Dy_2Zr_2O_7$ | — | — | — | — | — | — | — | — | — | — |
| | | YSZ and $Sm_2Zr_2O_7$ | — | — | — | — | — | — | — | — | — | — |
| | | YSZ and $Eu_2Zr_2O_7$ | — | — | — | — | — | — | — | — | — | — |
| | | YSZ and $Nd_2Zr_2O_7$ | — | — | — | — | — | — | — | — | — | — |
| | Composition and thickness of ceramic B layer | $ZrO_2$—$YTaO_4$ | — | — | — | — | — | — | — | — | — | 80 |
| | | $ZrO_2$—$GdTaO_4$ | — | — | — | — | — | — | — | — | — | — |
| | | $ZrO_2$—$NdTaO_4$ | — | — | — | — | — | — | — | — | 75 | — |
| | | $ZrO_2$—$SmTaO_4$ | — | — | — | — | — | — | — | — | — | — |
| | | $ZrO_2$—$EuTaO_4$ | — | — | — | — | — | — | — | — | — | — |
| | | $ZrO_2$—$DyTaO_4$ | 80 | — | — | — | — | — | — | 60 | — | — |
| | | $ZrO_2$—$ErTaO_4$ | — | — | — | — | 90 | — | 80 | — | — | — |
| | | $ZrO_2$—$YbTaO_4$ | — | 100 | — | — | — | 60 | — | — | — | — |
| | | $ZrO_2$—$LuTaO_4$ | — | — | 50 | 40 | — | — | — | — | — | — |
| Composition and thickness of reflecting layer | | $Y_2O_3$ | — | — | — | — | — | — | — | — | — | 20 |
| | | $YVO_4$ | — | — | — | — | — | — | — | — | — | — |
| | | $NdVO_4$ | — | 12 | — | — | — | — | — | — | — | — |
| | | $SmVO_4$ | — | — | — | — | — | — | — | — | — | — |
| | | $EuVO_4$ | — | — | — | — | — | — | — | — | — | — |
| | | $GdVO_4$ | — | — | — | — | — | — | — | — | — | — |
| | | $DyVO_4$ | — | — | — | 22 | — | — | — | — | — | — |
| | | $ErVO_4$ | — | — | — | — | — | 10 | — | — | — | — |
| | | $YbVO_4$ | — | — | — | — | — | 18 | — | — | — | — |
| | | $LuVO_4$ | — | — | — | — | — | — | — | — | 30 | — |
| | | $YTaO_4$ | — | — | — | — | — | — | — | — | — | — |
| | | $NdTaO_4$ | — | — | 12 | — | — | — | — | — | — | — |
| | | $SmTaO_4$ | — | — | — | — | — | — | — | — | — | — |
| | | $EuTaO_4$ | — | — | — | — | — | — | — | — | — | — |
| | | $GdTaO_4$ | — | — | — | — | — | — | — | — | — | — |
| | | $DyTaO_4$ | — | — | — | — | 12 | — | — | — | — | — |
| | | $ErTaO_4$ | 18 | — | — | — | — | — | — | — | — | — |
| | | $YbTaO_4$ | — | — | — | — | 10 | — | 28 | — | — | — |
| | | $LuTaO_4$ | — | — | — | — | — | — | — | — | 30 | — |
| | | $Y_2O_3$ and $EuVO_4$ | — | — | — | — | — | — | — | — | — | — |
| | | $YVO_4$ and $EuTaO_4$ | — | — | — | — | — | — | — | — | — | — |
| | | $Y_2O_3$ and $LuTaO_4$ | — | — | — | — | — | — | — | — | — | — |
| | | $YVO_4$ and $LuTaO_4$ | — | — | — | — | — | — | — | — | — | — |
| Composition and thickness of catadioptric layer | | Graphene | 25 | 28 | 28 | 28 | 23 | 23 | 20 | 20 | 25 | 20 |
| | | Boron carbide | — | — | — | — | — | — | — | — | — | — |
| Composition and thickness of insulating layer | Epoxy resin | | — | — | — | — | — | 180 | — | 160 | — | 150 |
| | Phenolic resin | | 130 | — | — | 180 | 100 | — | — | — | — | — |
| | ABS resin | | — | 130 | 160 | — | — | — | 150 | — | 170 | — |
| Thickness of carbon foam layer | | | 130 | 150 | 160 | 170 | 175 | 180 | 185 | 190 | 200 | 30 |

Take Test Example 1 of Embodiment 4 as an example to illustrate another technical solution of the present disclosure, that is, a method for preparing an ultralimit titanium alloy. A method for preparing an ultralimit titanium alloy, including the following operations:

Operation 1: the oil stains and impurities on the surface of titanium alloy matrix are removed by a soaking method. In this test example, TC4 titanium alloy serves as the material of the titanium alloy matrix. The titanium alloy matrix is soaked in a solvent for 0.5-1.5 h; the main components of the solvent are ethanol and surfactant. After the oil stains and impurities are cleaned up, the titanium alloy matrix is taken out and then rinsed with deionized water and dried. The surface of the titanium alloy matrix is shot peened by a shot peening machine. The shot peening machine used is a JCK-SS500-6A automatic transmission shot peening machine. The shot peening material used is any one of iron sand, glass shot and ceramic shot. In this test example, iron sand is used, and the particle size of the iron sand may be 0.3-0.8 mm; the particle size of the iron sand in this test example is 0.5 mm. The surface roughness of the titanium alloy matrix after shot peening is 60-100 μm. In this test example, the surface roughness of the titanium alloy matrix is 80 μm, which facilitates the bonding of the coating layer to the titanium alloy matrix.

Operation 2: a composite bonding layer is deposited on the surface of the titanium alloy after the shot peening. First, a layer of NiCrCoAlY is sprayed on the surface of the titanium alloy matrix as a bonding layer by a high velocity oxygen fuel (HVOF) method or supersonic arc spraying method. In this test example, the HVOF method is used. The process parameters of the HVOF method are as follows: the powder particle size is 25-65 μm, the oxygen flow rate is 2000SCFH, the kerosene flow rate is 18.17 LPH, the carrier gas is 12.2SCFH, the powder feed rate is 5 RPM, the barrel length is 5 in, and the spraying distance is 254 mm.

Then, a layer of Au is deposited on the NiCrCoAlY bonding layer as a precious metal layer by an electron beam physical vapor deposition (EB-PVD) method, such that a composite bonding layer is formed. The gas pressure when depositing Au is less than 0.01 Pa. The process parameters of EB-PVD method are as follows: the gas pressure is 0.008 Pa, the deposition rate is 6 μm/min, and the ratio of the temperature of the titanium alloy matrix to the melting point of the titanium alloy matrix is less than 0.3. The thickness of the deposited bonding layer is 20 μm, and the thickness of the precious metal layer is 50 μm.

Operation 3: a layer of YSZ is sprayed on the surface of the composite bonding layer as a ceramic A layer by the HVOF method. Then, a layer of 2-YTaO$_4$ is sprayed on the YSZ ceramic A layer as a ceramic B layer by the HVOF method, such that a composite ceramic layer is formed. The thickness of the ceramic A layer is 70 μm, and the thickness of the ceramic B layer is 80 μm.

Operation 4: a layer of Y$_2$O$_3$ transparent ceramic material is sprayed on the surface of the composite ceramic layer as a reflecting layer by the HVOF method. The thickness of the sprayed reflecting layer is 10 μm.

Operation 5: a layer of graphene is brushed on the surface of the Y$_2$O$_3$ reflecting layer as a catadioptric layer by a brushing method, and the thickness of the catadioptric layer is 20 μm.

Operation 6: a layer of epoxy resin is brushed on the surface of the graphene catadioptric layer as an insulating layer by a brushing method, and the thickness of the insulating layer is 150 μm.

Operation 7: a layer of carbon foam layer is brushed on the epoxy resin insulating layer by a brushing method, and the thickness of the carbon foam layer is 20 μm. The ultralimit titanium alloy is obtained.

The preparation process of Test Examples 2-29 is the same as that of Test Example 1, except that the composition and thickness of the coating layers as shown in Table 4-1 are different. The difference between Test Example 30 and Test Example 1 is that the spraying sequence of the ceramic A layer and the ceramic B layer in operation 3 is different.

13 groups of Comparative Examples are provided to perform comparative experiments with Test Examples 1-30. The parameters of Comparative Examples 1-12 are shown in Table 4-4 (thickness unit: μm):

TABLE 4-4

| | Composition and thickness of each coating layer in Comparative Examples 1-12 | | | | | | | | | | | | |
|---|---|---|---|---|---|---|---|---|---|---|---|---|---|
| | Comparative Example | | 1 | 2 | 3 | 4 | 5 | 6 | 7 | 8 | 9 | 10 | 11 | 12 |
| Composite bonding layer | Composition and thickness of bonding layer | NiCrCoAlY | 45 | 60 | 40 | 20 | 50 | — | — | — | — | 45 | 45 | 45 |
| | | MCrAlY | — | — | — | — | — | 70 | 50 | 30 | 40 | — | — | — |
| | | NiAl | — | — | — | — | — | — | — | — | — | — | — | — |
| | | NiCr—Al | — | — | — | — | — | — | — | — | — | — | — | — |
| | | Mo | 45 | — | — | — | — | — | 40 | — | — | 45 | 45 | 45 |
| | Composition and thickness of precious layer | Au | — | 30 | — | — | — | — | — | 60 | — | — | — | — |
| | | Pt | — | — | 40 | — | — | — | — | — | 50 | — | — | — |
| | | Ru | — | — | — | 60 | — | — | — | — | — | — | — | — |
| | | Rh | — | — | — | — | 50 | — | — | — | — | — | — | — |
| | | Pd | — | — | — | — | — | 30 | — | — | — | — | — | — |
| | | Ir | — | — | — | — | — | — | — | — | — | — | — | — |
| Composite ceramic layer | Composition and thickness of ceramic A layer | YSZ | — | — | — | — | — | — | — | — | — | 60 | 40 | — |
| | | RE$_2$Zr$_2$O$_7$ | 50 | 45 | 60 | 55 | 35 | 100 | 100 | 50 | 80 | — | — | — |
| | Composition and thickness of ceramic B layer | ZrO$_2$—YTaO$_4$ | 40 | — | — | — | — | — | — | — | — | — | — | — |
| | | ZrO$_2$—GdTaO$_4$ | — | — | — | 30 | — | — | — | — | — | — | — | — |
| | | ZrO$_2$—NdTaO$_4$ | — | 50 | — | — | — | — | — | — | — | — | — | — |
| | | ZrO$_2$—SmTaO$_4$ | — | — | — | — | — | — | — | 60 | — | — | — | — |
| | | ZrO$_2$—EuTaO$_4$ | — | — | 20 | — | — | — | — | — | — | — | — | — |
| | | ZrO$_2$—DyTaO$_4$ | — | — | — | — | — | 10 | — | — | — | — | — | — |
| | | ZrO$_2$—ErTaO$_4$ | — | — | — | — | 30 | — | — | — | — | — | — | — |
| | | ZrO$_2$—YbTaO$_4$ | — | — | — | — | — | — | 20 | — | — | — | — | — |
| | | ZrO$_2$—LuTaO$_4$ | — | — | — | — | — | — | — | — | 20 | — | — | — |
| Composition and thickness of reflecting layer | | Y$_2$O$_3$ | 5 | — | — | — | — | — | — | — | — | 20 | — | — |
| | | YVO$_4$ | — | 8 | — | — | — | — | — | — | 35 | — | — | — |
| | | GdVO$_4$ | — | — | 5 | — | — | — | 38 | — | — | — | — | 20 |
| | | YTaO$_4$ | — | — | — | 35 | — | — | — | 8 | — | — | — | — |
| | | GdTaO$_4$ | — | — | — | — | 8 | 35 | — | — | — | — | — | — |
| Composition and thickness of catadioptric layer | | Graphene | 5 | — | 9 | — | 35 | 38 | — | 45 | 50 | 20 | 20 | 20 |
| | | Boron carbide | — | 8 | — | 6 | — | — | 40 | — | — | — | — | — |
| Composition and thickness of insulating layer | | Epoxy resin | 50 | — | — | — | 250 | — | 300 | — | — | 150 | 150 | 150 |
| | | Phenolic resin | — | 90 | — | — | — | — | — | — | 400 | — | — | — |
| | | ABS resin | — | — | 80 | 50 | — | 280 | — | 350 | — | — | — | — |
| Thickness of carbon foam layer | | | 15 | 10 | 18 | 5 | 250 | 220 | 230 | 260 | 280 | 30 | 30 | — |

The preparation method of Comparative Examples 1-12 is the same as that of Test Example 1, except that the composition and thickness of the coating layers as shown in Table 4-3 are different. Comparative Example 13 is a TC4 titanium alloy matrix without deposited coating layers.

The following experiments are performed using the titanium alloys provided in Test Examples 1-30 and Comparative Examples 1-13:

High Temperature Creep Test:

The titanium alloys prepared in Test Examples 1-30 and Comparative Examples 1-13 are processed into tensile test pieces. The high temperature creep test is carried out with an electronic high temperature creep rupture strength test machine (model: RMT-D5). The maximum test load is 50 KN, the test load control accuracy is within ±5%, the deformation measuring range is 0-10 mm, the speed adjustment range is 0-50 mm/min−1, the deformation resolution is 0.001 mm, the temperature control range of high temperature furnace is 200-2000° C., and the uniform temperature zone length is 150 mm.

The test pieces of Test Examples 1-30 and Comparative Examples 1-13 are placed into the electronic high temperature creep rupture strength test machine, and the test pieces are in a stress-free state (in a stress-free state, the test pieces can expand freely; the high-temperature creep means that the deformation increases with time under the combined action of temperature and stress, therefore, the heating rate has no influence on the creep). The test machine is adjusted to a stress of 50 MPa and a temperature of 1300° C., and the following data are recorded. As shown in Table 4-5, a represents the steady creep time (min) of the test pieces; b represents the time when creep rupture of the test pieces happens (min).

Figure 2D:
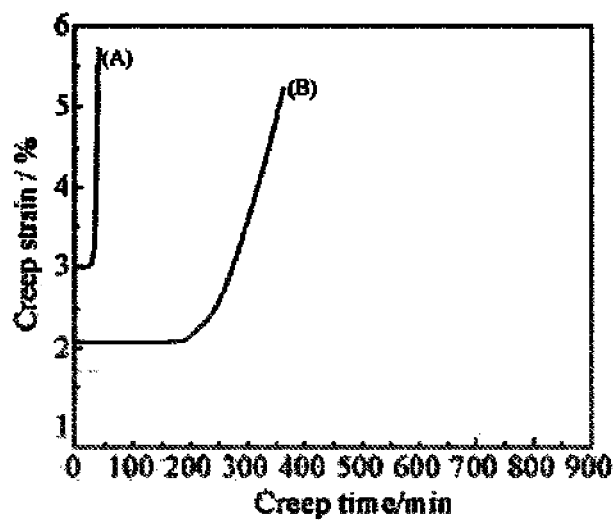
FIG. 2D shows creep test curves of Test Example 1 and Comparative Example 13 at 50 MPa and 1900° C. according to Embodiment 4 (ultralimit titanium alloy) of the present disclosure.

Take Test Example 1 and Comparative Example 13 as examples. FIG. 2D shows the high temperature creep test curves of Test Example 1 and Comparative Example 13. In FIG. 2D, (A) represents the TC4 titanium alloy matrix material without deposited coating layers in Comparative Example 13, and (B) represents the material prepared in Test Example 1.

It can be seen from FIG. 2D that under a stress of 50 MPa and a temperature of 1900° C., there are three stages of creep in test pieces (A) and (B): the first stage is short, and the creep rate is high, which quickly transitions to the second stage of creep; the creep rate of the second stage reaches a minimum value, and the second stage is long and is basically in a steady-state creep process; in the third stage, the creep rate increases rapidly, and the creep deformation develops rapidly until the material is broken and the creep rupture occurs. Meanwhile, it can be found that under a stress of 50 MPa and a temperature of 1900° C., the test piece (A) ruptures in a very short time, indicating that the titanium alloy can hardly bear the load at the temperature higher than the melting point, while the test piece (B) can maintain good mechanical properties under the condition of 1900° C. without rupturing for a long time and has excellent high-temperature resistance.

Figure 3D:
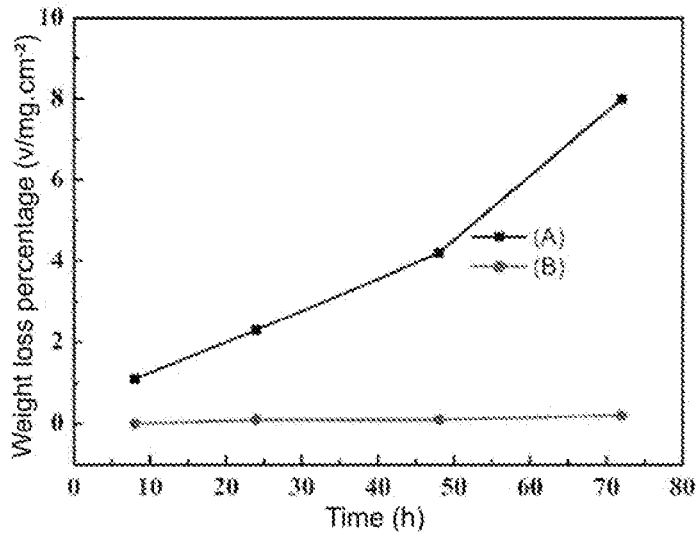
FIG. 3D is a schematic diagram of the salt-spray corrosion test results of Test Example 1 and Comparative Example 13 according to Embodiment 4 (ultralimit titanium alloy) of the present disclosure.

Salt-Spray Corrosion Test:

The titanium alloy provided in Test Examples 1-30 and Comparative Examples 1-13 are processed into test pieces of 50 mm×25 mm×2 mm, and the subsequent operations are the same as those of Embodiment 1. The weight loss of the test pieces is shown in FIG. 3D (in FIG. 3D, (A) represents the TC4 titanium alloy matrix material without deposited coating layers in Comparative Example 13, and (B) represents Test Example 1). The specific experimental results of Test Examples 1-30 and Comparative Examples 1-13 are shown in Table 4-5.

It can be seen from FIG. 3D that the two titanium alloys have obviously different corrosion patterns. For test piece (A) (TC4 titanium alloy test piece), the corrosion weight loss value tends to increase as the corrosion time extends. In the early stage of corrosion (8-24 h), there is an oxidation film on the surface of the test piece, which prevents the titanium alloy matrix from contacting the solution; the corrosion rate is low. In the middle stage of corrosion (24-48 h), the Cl− (chloridion) in the solution has penetrated the oxidation film, and a large amount of Cl− is adsorbed on the matrix, which increases the corrosion pit points and deepens the original corrosion pit points; the corrosion rate is obviously accelerated. After 48 hours of continuous spraying, the corrosion products are evenly distributed and the thickness increases, covering almost the entire surface of the test piece. Cl− needs to pass through the corrosion products to contact the titanium alloy matrix, which reduces the amount of Cl− adsorbed on the matrix surface and reduces the corrosion rate. In general, the corrosion loss weight of TC4 titanium alloy is much higher than that of the titanium matrix surface composite material. Basically, the titanium matrix surface composite material has no corrosion due to the existence of the coating layers, and the mass of the titanium matrix surface composite material has hardly changed.

The experimental results are shown in Table 4-5: a represents the steady creep time (min) of the test pieces;

b represents the time when creep rupture of the test pieces happens (min);

c represents the weight loss (v/mg·cm$^2$) of the test pieces after continuously spraying NaCl solution on the test pieces for 8 hours;

d represents the weight loss (v/mg·cm$^2$) of the test pieces after continuously spraying NaCl solution on the test pieces for 24 hours;

e represents the weight loss (v/mg·cm$^2$) of the test pieces after continuously spraying NaCl solution on the test pieces for 48 hours;

f represents the weight loss (v/mg·cm$^2$) of the test pieces after continuously spraying NaCl solution on the test pieces for 72 hours.

TABLE 4-5

Experimental results of high temperature creep test and salt-spray test

| | a | b | c | d | e | f |
|---|---|---|---|---|---|---|
| Test Example 1 | 245 | 360 | 0 | 0.01 | 0.02 | 0.08 |
| Test Example 2 | 235 | 350 | 0 | 0.01 | 0.02 | 0.08 |
| Test Example 3 | 237 | 355 | 0 | 0.01 | 0.02 | 0.08 |
| Test Example 4 | 238 | 355 | 0 | 0.02 | 0.03 | 0.12 |
| Test Example 5 | 235 | 354 | 0 | 0.03 | 0.05 | 0.13 |
| Test Example 6 | 235 | 354 | 0 | 0.03 | 0.05 | 0.13 |
| Test Example 7 | 235 | 354 | 0.005 | 0.02 | 0.03 | 0.12 |
| Test Example 8 | 237 | 356 | 0 | 0.01 | 0.02 | 0.08 |
| Test Example 9 | 240 | 358 | 0.006 | 0.02 | 0.03 | 0.12 |
| Test Example 10 | 240 | 358 | 0 | 0.02 | 0.03 | 0.12 |
| Test Example 11 | 240 | 358 | 0 | 0.01 | 0.02 | 0.08 |
| Test Example 12 | 242 | 359 | 0.004 | 0.02 | 0.03 | 0.11 |
| Test Example 13 | 242 | 359 | 0 | 0.02 | 0.03 | 0.11 |
| Test Example 14 | 242 | 359 | 0 | 0.02 | 0.03 | 0.11 |
| Test Example 15 | 243 | 359 | 0 | 0.01 | 0.03 | 0.11 |
| Test Example 16 | 243 | 359 | 0 | 0.03 | 0.05 | 0.13 |
| Test Example 17 | 242 | 359 | 0.005 | 0.02 | 0.03 | 0.11 |
| Test Example 18 | 239 | 352 | 0.006 | 0.02 | 0.03 | 0.12 |
| Test Example 19 | 240 | 357 | 0.006 | 0.03 | 0.05 | 0.13 |
| Test Example 20 | 242 | 359 | 0 | 0.01 | 0.02 | 0.08 |

TABLE 4-5-continued

Experimental results of high temperature creep test and salt-spray test

|  | a | b | c | d | e | f |
|---|---|---|---|---|---|---|
| Test Example 21 | 242 | 359 | 0 | 0.01 | 0.02 | 0.08 |
| Test Example 22 | 242 | 356 | 0.006 | 0.02 | 0.03 | 0.11 |
| Test Example 23 | 242 | 357 | 0 | 0.02 | 0.03 | 0.11 |
| Test Example 24 | 242 | 359 | 0 | 0.02 | 0.03 | 0.11 |
| Test Example 25 | 245 | 359 | 0 | 0.03 | 0.05 | 0.13 |
| Test Example 26 | 238 | 352 | 0 | 0.02 | 0.04 | 0.13 |
| Test Example 27 | 238 | 353 | 0.004 | 0.01 | 0.02 | 0.09 |
| Test Example 28 | 238 | 352 | 0.004 | 0.02 | 0.04 | 0.14 |
| Test Example 29 | 244 | 359 | 0.005 | 0.02 | 0.04 | 0.14 |
| Test Example 30 | 243 | 358 | 0 | 0.02 | 0.03 | 0.11 |
| Comparative Example 1 | 90 | 185 | 0.07 | 0.13 | 0.25 | 0.55 |
| Comparative Example 2 | 95 | 190 | 0.07 | 0.13 | 0.25 | 0.5 |
| Comparative Example 3 | 125 | 220 | 0.06 | 0.12 | 0.24 | 0.51 |
| Comparative Example 4 | 130 | 230 | 0.05 | 0.11 | 0.22 | 0.52 |
| Comparative Example 5 | 120 | 220 | 0.05 | 0.11 | 0.22 | 0.52 |
| Comparative Example 6 | 100 | 205 | 0.05 | 0.11 | 0.22 | 0.53 |
| Comparative Example 7 | 110 | 220 | 0.05 | 0.11 | 0.22 | 0.56 |
| Comparative Example 8 | 110 | 220 | 0.05 | 0.11 | 0.22 | 0.53 |
| Comparative Example 9 | 95 | 195 | 0.03 | 0.09 | 0.21 | 0.52 |
| Comparative Example 10 | 130 | 235 | 0.03 | 0.09 | 0.19 | 0.58 |
| Comparative Example 11 | 115 | 225 | 0.02 | 0.07 | 0.18 | 0.56 |
| Comparative Example 12 | 120 | 230 | 0.02 | 0.06 | 0.14 | 0.52 |
| Comparative Example 13 | 40 | 50 | 1.1 | 2.2 | 4.1 | 8.1 |

As can be seen from Table 4-5, the titanium alloy obtained by the comparative examples beyond the parameter range of the present disclosure has a significant decrease in stability at high temperature; the rupture occurs in a short period of time, and the corrosion resistance is poor.

In summary, by depositing composite bonding layer, composite ceramic layer, reflecting layer, catadioptric layer, insulating layer and carbon foam layer on the titanium alloy, the service temperature of the titanium alloy can be increased to 100-500° C. higher than the original melting point. The corrosion resistance can be greatly improved as well. The ultralimit titanium alloy prepared by the ultralimit titanium alloy preparation method of the present disclosure has a wide service temperature range and strong corrosion resistance; the effects of Test Example 1 are the best.

Embodiment 5 (Ultralimit Iron Alloy)

In this embodiment, the ultralimit alloy is an ultralimit iron alloy, that is, the alloy matrix is an iron alloy matrix.

The reference signs in FIG. 1B include: iron alloy matrix 1, bonding layer 2, precious metal layer 3, ceramic A layer 4, ceramic B layer 5, reflecting layer 6, catadioptric layer 7, insulating layer 8, and carbon foam layer 9.

As shown in FIG. 1B, the present disclosure provides an ultralimit iron alloy, including an iron alloy matrix 1. The surface of the iron alloy matrix 1 is successively deposited with a composite bonding layer with a thickness of 100-200 μm, a composite ceramic layer with a thickness of 150-500 μm, a reflecting layer 6 with a thickness of 10-30 μm, a catadioptric layer 7 with a thickness of 10-30 μm, an insulating layer 8 with a thickness of 10-200 μm, and a carbon foam layer 9 with a thickness of 20-200 μm. The composite bonding layer includes a bonding layer 2 deposited on the surface of the titanium alloy matrix 1 and a precious metal layer 3 deposited on the surface of the bonding layer 2. The composition of the bonding layer 2 is one or more of MCrAlY, NiAl, NiCr—Al and Mo; MCrAlY is NiCrCoAlY, NiCoCrAlY, CoNiCrAlY or CoCrAlY. The composition of the precious metal layer 3 is one of or an alloy of more of Au, Pt, Ru, Rh, Pd, and Ir. The composite ceramic layer includes a ceramic A layer 4 and a ceramic B layer 5. The composition of the ceramic A layer 4 is YSZ or rare earth zirconate ($RE_2Zr_2O_7$, RE=Y, Gd, Nd, Sm, Eu or Dy). The composition of the ceramic B layer 5 is $ZrO_2$-$RETaO_4$ (RE=Y, Gd, Nd, Sm, Eu, Dy, Er, Yb or Lu). The reflecting layer 6 is one or more of $REVO_4$, $RETaO_4$ and $Y_2O_3$, and RE=Y, Nd, Sm, Eu, Gd, Dy, Er, Yb or Lu. The composition of the catadioptric layer 7 is one or two of graphene and boron carbide, and the spatial distribution of the graphene and boron carbide are in a disorderly arranged state. The composition of the insulating layer 8 is one or more of epoxy resin, phenolic resin, and ABS resin.

The present disclosure uses $ZrO_2$-$RETaO_4$ as the ceramic B layer, which has the effects of low thermal conductivity and high expansion rate, and can reduce heat conduction; the method for preparing $ZrO_2$-$RETaO_4$ is consistent with that of Embodiment 1, and the $ZrO_2$-$RETaO_4$ can meet the requirements of APS spraying technology on powder particle size and shape.

Based on extensive experiments, the inventors obtain ultralimit iron alloys with the largest increase in service temperature, small increase in weight of the iron alloy and the best composition and thickness of the coating layers within the parameter scope of the present disclosure. In the present disclosure, 30 of them are listed for description.

The parameters of Test Examples 1-30 of an ultralimit iron alloy and its preparation method according to the present disclosure are shown in Table 5-1, Table 5-2, and Table 5-3

(Thickness unit: μm):

TABLE 5-1

Composition and thickness of each coating layer in Test Examples 1-10 of an ultralimit iron alloy and its preparation method

| Test Example | | | 1 | 2 | 3 | 4 | 5 | 6 | 7 | 8 | 9 | 10 |
|---|---|---|---|---|---|---|---|---|---|---|---|---|
| Composite bonding layer | Composition and thickness of bonding layer | NiCrCoAlY | 50 | 60 | 40 | 60 | 70 | — | — | — | — | — |
| | | CoCrAlY | — | — | — | — | — | — | — | — | — | — |
| | | NiCoCrAlY | — | — | — | — | — | — | — | — | — | — |
| | | CoNiCrAlY | — | — | — | — | — | — | — | — | — | — |
| | | NiAl | — | — | — | — | — | 70 | 50 | 60 | 70 | 60 |
| | | NiCr—Al | — | — | — | — | — | — | — | — | — | — |
| | | Mo alloy | — | — | — | — | — | — | — | — | — | — |
| | Composition and thickness of precious layer | Au | 50 | — | — | — | — | — | 150 | — | — | — |
| | | Pt | — | 40 | — | — | — | — | — | 60 | — | — |
| | | Ru | — | — | 60 | — | — | — | — | — | 50 | — |
| | | Rh | — | — | — | 60 | — | — | — | — | — | 70 |
| | | Pd | — | — | — | — | 50 | — | — | — | — | — |
| | | Ir | — | — | — | — | — | 100 | — | — | — | — |

TABLE 5-1-continued

Composition and thickness of each coating layer in Test Examples 1-10 of an ultralimit iron alloy and its preparation method

| | | Test Example | 1 | 2 | 3 | 4 | 5 | 6 | 7 | 8 | 9 | 10 |
|---|---|---|---|---|---|---|---|---|---|---|---|---|
| Composite ceramic layer | Composition and thickness of ceramic A layer | PT-Rh alloy | — | — | — | — | — | — | — | — | — | — |
| | | Pd—Rh alloy | — | — | — | — | — | — | — | — | — | — |
| | | Ru—Rh alloy | — | — | — | — | — | — | — | — | — | — |
| | | YSZ | 70 | 60 | 80 | 90 | 110 | 180 | — | — | — | — |
| | | $Y_2Zr_2O_7$ | — | — | — | — | — | — | 200 | — | — | — |
| | | $Gd_2Zr_2O_7$ | — | — | — | — | — | — | — | 80 | — | — |
| | | $Nd_2Zr_2O_7$ | — | — | — | — | — | — | — | — | 90 | — |
| | | $Sm_2Zr_2O_7$ | — | — | — | — | — | — | — | — | — | 120 |
| | | $Eu_2Zr_2O_7$ | — | — | — | — | — | — | — | — | — | — |
| | | $Dy_2Zr_2O_7$ | — | — | — | — | — | — | — | — | — | — |
| | | YSZ and $Sm_2Zr_2O_7$ | — | — | — | — | — | — | — | — | — | — |
| | | YSZ and $Eu_2Zr_2O_7$ | — | — | — | — | — | — | — | — | — | — |
| | | YSZ and $Nd_2Zr_2O_7$ | — | — | — | — | — | — | — | — | — | — |
| | Composition and thickness of ceramic B layer | $ZrO_2$—$YTaO_4$ | 80 | 90 | — | 100 | — | — | 300 | — | — | — |
| | | $ZrO_2$—$GdTaO_4$ | — | — | 70 | — | 85 | 150 | — | 80 | — | — |
| | | $ZrO_2$—$NdTaO_4$ | — | — | — | — | — | — | — | — | 100 | — |
| | | $ZrO_2$—$SmTaO_4$ | — | — | — | — | — | — | — | — | — | 70 |
| | | $ZrO_2$—$EuTaO_4$ | — | — | — | — | — | — | — | — | — | — |
| | | $ZrO_2$—$DyTaO_4$ | — | — | — | — | — | — | — | — | — | — |
| | | $ZrO_2$—$ErTaO_4$ | — | — | — | — | — | — | — | — | — | — |
| | | $ZrO_2$—$YbTaO_4$ | — | — | — | — | — | — | — | — | — | — |
| | | $ZrO_2$—$LuTaO_4$ | — | — | — | — | — | — | — | — | — | — |
| Composition and thickness of reflecting layer | | $Y_2O_3$ | 10 | 10 | — | — | — | — | 15 | — | — | — |
| | | $YVO_4$ | — | — | 20 | — | 30 | 10 | — | — | — | — |
| | | $NdVO_4$ | — | — | — | — | — | — | — | — | — | — |
| | | $SmVO_4$ | — | — | — | — | — | — | — | — | — | — |
| | | $EuVO_4$ | — | — | — | — | — | — | — | — | — | — |
| | | $GdVO_4$ | — | — | — | — | — | — | — | — | — | 10 |
| | | $DyVO_4$ | — | — | — | — | — | — | — | — | — | — |
| | | $ErVO_4$ | — | — | — | — | — | — | — | — | — | — |
| | | $YbVO_4$ | — | — | — | — | — | — | — | — | — | — |
| | | $LuVO_4$ | — | — | — | — | — | — | — | — | — | — |
| | | $YTaO_4$ | — | — | — | 20 | — | — | — | 10 | 20 | — |
| | | $NdTaO_4$ | — | — | — | — | — | — | — | — | — | — |
| | | $SmTaO_4$ | — | — | — | — | — | — | — | — | — | — |
| | | $EuTaO_4$ | — | — | — | — | — | — | — | — | — | — |
| | | $GdTaO_4$ | — | — | — | — | — | — | — | — | — | — |
| | | $DyTaO_4$ | — | — | — | — | — | — | — | — | — | — |
| | | $ErTaO_4$ | — | — | — | — | — | — | — | — | — | — |
| | | $YbTaO_4$ | — | — | — | — | — | — | — | — | — | — |
| | | $LuTaO_4$ | — | — | — | — | — | — | — | — | — | — |
| | | $Y_2O_3$ and $EuVO_4$ | — | — | — | — | — | — | — | — | — | — |
| | | $YVO_4$ and $EuTaO_4$ | — | — | — | — | — | — | — | — | — | — |
| | | $Y_2O_3$ and $LuTaO_4$ | — | — | — | — | — | — | — | — | — | — |
| | | $YVO_4$ and $LuTaO_4$ | — | — | — | — | — | — | — | — | — | — |
| Composition and thickness of catadioptric layer | | Graphene | 10 | 10 | 20 | 20 | 30 | 10 | — | — | — | — |
| | | Boron carbide | — | — | — | — | — | — | 30 | 15 | 25 | 20 |
| Composition and thickness of insulating layer | | Epoxy resin | 15 | 10 | — | — | — | — | 20 | — | — | 10 |
| | | Phenolic resin | — | — | 20 | 20 | — | — | — | — | 15 | — |
| | | ABS resin | — | — | — | — | 50 | 100 | — | 10 | — | — |
| Thickness of carbon foam layer | | | 20 | 20 | 20 | 20 | 100 | 200 | 30 | 25 | 20 | 35 |

TABLE 5-2

Composition and thickness of each coating layer in Test Examples 11-20 of an ultralimit iron alloy and its preparation method

| | | Test Example | 11 | 12 | 13 | 14 | 15 | 16 | 17 | 18 | 19 | 20 |
|---|---|---|---|---|---|---|---|---|---|---|---|---|
| Composite bonding layer | Composition and thickness of bonding layer | NiCrCoAlY | — | — | — | — | — | — | — | — | — | — |
| | | CoCrAlY | 70 | — | — | — | — | — | — | — | — | — |
| | | NiCoCrAlY | — | 80 | — | — | — | — | — | — | — | — |
| | | CoNiCrAlY | — | — | 55 | — | — | 75 | — | — | — | 55 |
| | | NiAl | — | — | — | — | 80 | — | — | — | — | — |
| | | NiCr—Al | — | — | — | 80 | — | — | — | 100 | — | — |
| | | Mo alloy | — | — | — | — | — | — | 95 | — | 35 | — |
| | Composition and thickness of precious layer | Au | — | — | — | — | — | — | 105 | — | — | — |
| | | Pt | — | — | — | — | — | 85 | — | — | — | — |
| | | Ru | — | — | — | — | — | — | — | 60 | — | — |

TABLE 5-2-continued

Composition and thickness of each coating layer in Test Examples 11-20 of an ultralimit iron alloy and its preparation method

| | | Test Example | 11 | 12 | 13 | 14 | 15 | 16 | 17 | 18 | 19 | 20 |
|---|---|---|---|---|---|---|---|---|---|---|---|---|
| | | Rh | — | — | — | — | — | — | — | — | — | 70 |
| | | Pd | — | — | — | — | — | — | — | — | 110 | — |
| | | Ir | — | — | — | — | — | — | — | — | — | — |
| | | PT-Rh alloy | 70 | — | — | — | 70 | — | — | — | — | — |
| | | Pd—Rh alloy | — | 60 | — | 55 | — | — | — | — | — | — |
| | | Ru—Rh alloy | — | — | 100 | — | — | — | — | — | — | — |
| Composite ceramic layer | Composition and thickness of ceramic A layer | YSZ | — | — | — | — | — | 80 | — | — | — | — |
| | | $Y_2Zr_2O_7$ | — | — | — | — | — | — | 140 | — | — | — |
| | | $Gd_2Zr_2O_7$ | — | — | — | — | — | — | — | — | — | — |
| | | $Nd_2Zr_2O_7$ | — | — | — | — | — | — | — | — | 100 | — |
| | | $Sm_2Zr_2O_7$ | — | — | — | — | — | — | — | — | — | — |
| | | $Eu_2Zr_2O_7$ | 50 | — | — | — | — | — | — | — | 110 | — |
| | | $Dy_2Zr_2O_7$ | — | 70 | — | — | — | — | — | — | — | — |
| | | YSZ and $Sm_2Zr_2O_7$ | — | — | 60 | — | — | — | — | — | — | 180 |
| | | YSZ and $Eu_2Zr_2O_7$ | — | — | — | 60 | — | — | — | — | — | — |
| | | YSZ and $Nd_2Zr_2O_7$ | — | — | — | — | 100 | — | — | — | — | — |
| | Composition and thickness of ceramic B layer | $ZrO_2$—$YTaO_4$ | — | — | — | — | — | 120 | — | — | — | — |
| | | $ZrO_2$—$GdTaO_4$ | — | — | — | — | — | — | — | 50 | — | — |
| | | $ZrO_2$—$NdTaO_4$ | — | — | — | — | — | — | 60 | — | — | — |
| | | $ZrO_2$—$SmTaO_4$ | — | — | — | — | — | — | — | — | 70 | — |
| | | $ZrO_2$—$EuTaO_4$ | 130 | — | — | — | — | — | — | — | — | 100 |
| | | $ZrO_2$—$DyTaO_4$ | — | 160 | — | — | — | — | — | — | — | — |
| | | $ZrO_2$—$ErTaO_4$ | — | — | 170 | — | — | — | — | — | — | — |
| | | $ZrO_2$—$YbTaO_4$ | — | — | — | 190 | — | — | — | — | — | — |
| | | $ZrO_2$—$LuTaO_4$ | — | — | — | — | 140 | — | — | — | — | — |
| Composition and thickness of reflecting layer | | $Y_2O_3$ | — | — | — | — | — | — | — | — | — | — |
| | | $YVO_4$ | — | — | — | — | — | — | — | — | — | — |
| | | $NdVO_4$ | — | — | — | — | — | — | — | — | — | — |
| | | $SmVO_4$ | — | — | — | — | — | — | — | — | — | — |
| | | $EuVO_4$ | — | — | — | — | — | — | — | — | 20 | — |
| | | $GdVO_4$ | — | — | — | — | — | — | — | — | — | — |
| | | $DyVO_4$ | — | — | — | — | — | — | — | — | — | — |
| | | $ErVO_4$ | — | — | — | — | — | — | — | — | — | 18 |
| | | $YbVO_4$ | — | — | — | — | — | — | — | — | — | — |
| | | $LuVO_4$ | — | — | — | — | — | — | — | — | — | — |
| | | $YTaO_4$ | — | — | — | — | — | — | — | — | — | — |
| | | $NdTaO_4$ | — | — | — | — | — | — | — | — | — | — |
| | | $SmTaO_4$ | — | — | — | — | — | — | — | — | — | — |
| | | $EuTaO_4$ | — | — | — | — | — | — | — | — | 25 | — |
| | | $GdTaO_4$ | — | — | — | — | — | — | — | — | — | — |
| | | $DyTaO_4$ | — | — | — | — | — | — | — | — | — | — |
| | | $ErTaO_4$ | — | — | — | — | — | — | — | — | — | — |
| | | $YbTaO_4$ | — | — | — | — | — | — | — | — | — | — |
| | | $LuTaO_4$ | — | — | — | — | — | — | — | — | — | — |
| | | $Y_2O_3$ and $EuVO_4$ | 15 | — | — | — | — | 10 | — | — | — | — |
| | | $YVO_4$ and $EuTaO_4$ | — | 20 | — | — | — | — | 15 | — | — | — |
| | | $Y_2O_3$ and $LuTaO_4$ | — | — | 10 | — | 20 | — | — | — | — | — |
| | | $YVO_4$ and $LuTaO_4$ | — | — | — | 15 | — | — | — | — | — | — |
| Composition and thickness of catadioptric layer | | Graphene | 15 | 30 | — | — | 25 | — | 20 | — | — | 23 |
| | | Boron carbide | — | — | 15 | 20 | — | 25 | — | 30 | 23 | — |
| Composition and thickness of insulating layer | | Epoxy resin | 15 | — | — | 15 | — | — | 25 | 30 | — | 35 |
| | | Phenolic resin | — | 10 | — | — | — | — | — | — | 40 | — |
| | | ABS resin | — | — | 20 | — | 110 | 200 | — | — | — | — |
| Thickness of carbon foam layer | | | 30 | 40 | 45 | 50 | 70 | 50 | 60 | 80 | 100 | 120 |

TABLE 5-3

Composition and thickness of each coating layer in Test Examples 21-30 of an ultralimit iron alloy and its preparation method

| | | Test Example | 21 | 22 | 23 | 24 | 25 | 26 | 27 | 28 | 29 | 30 |
|---|---|---|---|---|---|---|---|---|---|---|---|---|---|
| Composite bonding layer | Composition and thickness of bonding layer | NiCrCoAlY | 75 | — | 40 | — | — | — | — | — | — | 95 |
| | | CoCrAlY | — | 50 | — | — | — | — | — | — | — | — |
| | | NiCoCrAlY | — | — | — | — | — | 40 | — | — | — | — |
| | | CoNiCrAlY | — | — | — | — | 60 | — | — | — | — | — |
| | | NiAl | — | — | — | 30 | — | — | — | — | — | — |
| | | NiCr—Al | — | — | — | — | — | — | — | 80 | 95 | — |
| | | Mo alloy | — | — | — | — | — | — | — | — | 65 | — |
| | Composition and thickness of | Au | 55 | — | — | — | — | — | — | — | — | 45 |
| | | Pt | — | 60 | — | — | — | — | — | — | — | — |

TABLE 5-3-continued

Composition and thickness of each coating layer in Test Examples 21-30 of an ultralimit iron alloy and its preparation method

| | Test Example | | 21 | 22 | 23 | 24 | 25 | 26 | 27 | 28 | 29 | 30 |
|---|---|---|---|---|---|---|---|---|---|---|---|---|
| | precious layer | Ru | — | — | 60 | — | 40 | — | — | — | 55 | — |
| | | Rh | — | — | — | 70 | — | — | — | — | — | — |
| | | Pd | — | — | — | — | — | 80 | — | 55 | — | — |
| | | Ir | — | — | — | — | — | — | 70 | — | — | — |
| | | PT-Rh alloy | — | — | — | — | — | — | — | — | — | — |
| | | Pd—Rh alloy | — | — | — | — | — | — | — | — | — | — |
| | | Ru—Rh alloy | — | — | — | — | — | — | — | — | — | — |
| Composite ceramic layer | Composition and thickness of ceramic A layer | YSZ | 90 | — | — | — | — | — | — | — | — | 70 |
| | | $Y_2Zr_2O_7$ | — | 50 | — | — | — | — | — | 90 | — | — |
| | | $Gd_2Zr_2O_7$ | — | — | — | — | — | 80 | — | — | — | — |
| | | $Nd_2Zr_2O_7$ | — | — | 150 | — | — | — | 300 | — | 85 | — |
| | | $Sm_2Zr_2O_7$ | — | — | — | 100 | 180 | — | — | — | — | — |
| | | $Eu_2Zr_2O_7$ | — | — | — | — | — | — | — | — | — | — |
| | | $Dy_2Zr_2O_7$ | — | — | — | — | — | — | — | — | — | — |
| | | YSZ and $Sm_2Zr_2O_7$ | — | — | — | — | — | — | — | — | — | — |
| | | YSZ and $Eu_2Zr_2O_7$ | — | — | — | — | — | — | — | — | — | — |
| | | YSZ and $Nd_2Zr_2O_7$ | — | — | — | — | — | — | — | — | — | — |
| | Composition and thickness of ceramic B layer | $ZrO_2$—$YTaO_4$ | — | — | — | — | — | — | — | — | — | 150 |
| | | $ZrO_2$—$GdTaO_4$ | — | — | — | — | — | — | — | — | — | — |
| | | $ZrO_2$—$NdTaO_4$ | — | — | — | — | — | — | — | — | 75 | — |
| | | $ZrO_2$—$SmTaO_4$ | — | — | — | — | — | — | — | — | — | — |
| | | $ZrO_2$—$EuTaO_4$ | — | — | — | — | — | — | — | — | — | — |
| | | $ZrO_2$—$DyTaO_4$ | 80 | — | — | — | — | — | — | 100 | — | — |
| | | $ZrO_2$—$ErTaO_4$ | — | — | — | — | 90 | — | 130 | — | — | — |
| | | $ZrO_2$—$YbTaO_4$ | — | 150 | — | — | — | 100 | — | — | — | — |
| | | $ZrO_2$—$LuTaO_4$ | — | — | 50 | 70 | — | — | — | — | — | — |
| Composition and thickness of reflecting layer | | $Y_2O_3$ | — | — | — | — | — | — | — | — | — | 20 |
| | | $YVO_4$ | — | — | — | — | — | — | — | — | — | — |
| | | $NdVO_4$ | — | 12 | — | — | — | — | — | — | — | — |
| | | $SmVO_4$ | — | — | — | — | — | — | — | — | — | — |
| | | $EuVO_4$ | — | — | — | — | — | — | — | — | — | — |
| | | $GdVO_4$ | — | — | — | — | — | — | — | — | — | — |
| | | $DyVO_4$ | — | — | — | 22 | — | — | — | — | — | — |
| | | $ErVO_4$ | — | — | — | — | — | 10 | — | — | — | — |
| | | $YbVO_4$ | — | — | — | — | — | 18 | — | — | — | — |
| | | $LuVO_4$ | — | — | — | — | — | — | — | 30 | — | — |
| | | $YTaO_4$ | — | — | — | — | — | — | — | — | — | — |
| | | $NdTaO_4$ | — | — | 12 | — | — | — | — | — | — | — |
| | | $SmTaO_4$ | — | — | — | — | — | — | — | — | — | — |
| | | $EuTaO_4$ | — | — | — | — | — | — | — | — | — | — |
| | | $GdTaO_4$ | — | — | — | — | — | — | — | — | — | — |
| | | $DyTaO_4$ | — | — | — | — | 12 | — | — | — | — | — |
| | | $ErTaO_4$ | 18 | — | — | — | — | — | — | — | — | — |
| | | $YbTaO_4$ | — | — | — | — | 10 | — | 28 | — | — | — |
| | | $LuTaO_4$ | — | — | — | — | — | — | — | — | 30 | — |
| | | $Y_2O_3$ and $EuVO_4$ | — | — | — | — | — | — | — | — | — | — |
| | | $YVO_4$ and $EuTaO_4$ | — | — | — | — | — | — | — | — | — | — |
| | | $Y_2O_3$ and $LuTaO_4$ | — | — | — | — | — | — | — | — | — | — |
| | | $YVO_4$ and $LuTaO_4$ | — | — | — | — | — | — | — | — | — | — |
| Composition and thickness of catadioptric layer | | Graphene | 15 | 28 | 18 | 18 | 13 | 13 | 10 | 10 | 15 | 20 |
| | | Boron carbide | — | — | — | — | — | — | — | — | — | — |
| Composition and thickness of insulating layer | | Epoxy resin | — | — | — | — | — | 180 | — | 160 | — | 15 |
| | | Phenolic resin | 30 | — | — | 80 | 100 | — | — | — | — | — |
| | | ABS resin | — | 30 | 60 | — | — | — | 150 | — | 170 | — |
| Thickness of carbon foam layer | | | 130 | 150 | 160 | 170 | 175 | 180 | 185 | 190 | 200 | 30 |

Take Test Example 1 of Embodiment 5 as an example to illustrate another technical solution of the present disclosure, that is, a method for preparing an ultralimit iron alloy. A method for preparing an ultralimit iron alloy, including the following operations:

Operation 1: basically the same as operation 1 of preparing ultralimit titanium alloy in Embodiment 4, except that Q235 iron alloy serves as the alloy matrix in this test example.

Operation 2: the experimental procedures and parameters are consistent with that in Embodiment 4, except that the thickness of the deposited bonding layer is 45 μm, and the thickness of the precious metal layer is 45 μm.

Operation 3: the experimental procedures and parameters are consistent with that in Embodiment 4, except that the thickness of the ceramic A layer is 70 μm, and the thickness of the ceramic B layer is 50 μm.

Operation 4: a layer of $Y_2O_3$ transparent ceramic material is sprayed on the surface of the composite ceramic layer as a reflecting layer by the HVOF method. The thickness of the sprayed reflecting layer is 20 μm.

Operation 5: a layer of graphene is brushed on the surface of the $Y_2O_3$ reflecting layer as a catadioptric layer by a brushing method, and the thickness of the catadioptric layer is 10 μm.

Operation 6: a layer of epoxy resin is brushed on the surface of the catadioptric layer as an insulating layer, and the thickness of the insulating layer is 15 μm.

Operation 7: a layer of carbon foam is brushed on the insulating layer. The thickness of the carbon foam layer is 20 μm. The ultralimit iron alloy is obtained.

The only difference between Test Examples 2-29 and Test Example 1 is that the parameters are different as shown in Table 5-1. The difference between Test Example 30 and Test Example 1 is that the spraying sequence of the ceramic A layer and the ceramic B layer in operation 3 is different.

Experiments:

13 groups of Comparative Examples are provided to perform comparative experiments with Test Examples 1-30. The parameters of Comparative Examples 1-12 are shown in Table 5-4 (thickness unit: μm):

of the test pieces; b represents the time when creep rupture of the test pieces happens (min).

Figure 2E:
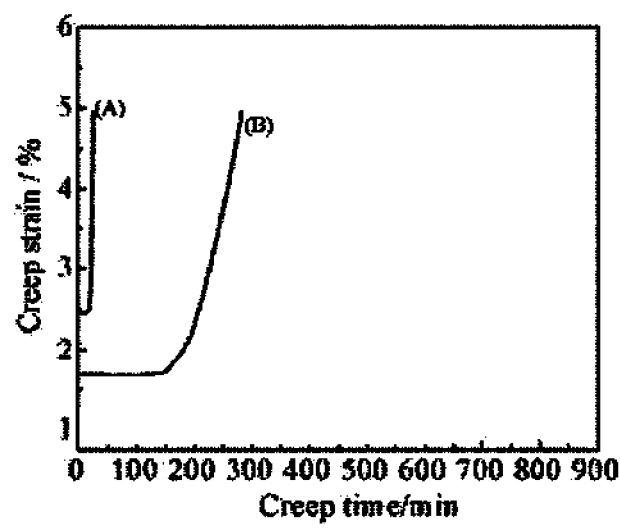
FIG. 2E shows creep test curves of Test Example 1 and Comparative Example 13 at 50 MPa and 1900° C. according to Embodiment 5 (ultralimit iron alloy) of the present disclosure.

Take Test Example 1 and Comparative Example 13 as examples. FIG. 2E shows the high temperature creep test curves of Test Example 1 and Comparative Example 13. In FIG. 2E, (A) represents the Q235 iron alloy matrix material without deposited coating layers in Comparative Example 13, and (B) represents the material prepared in Test Example 1.

It can be seen from FIG. 2E that under a stress of 50 MPa and a temperature of 1900° C., there are three stages of creep in test pieces (A) and (B): the first stage is short and has a high creep rate, which quickly transitions to the second stage of creep; the creep rate of the second stage reaches a minimum value, and the second stage is long and is basically in a steady-state creep process; in the third stage, the creep

TABLE 5-4

Composition and thickness of each coating layer in Comparative Examples 1-12

| Comparative Example | | | 1 | 2 | 3 | 4 | 5 | 6 | 7 | 8 | 9 | 10 | 11 | 12 |
|---|---|---|---|---|---|---|---|---|---|---|---|---|---|---|
| Composite bonding layer | Composition and thickness of bonding layer | NiCrCoAlY | 45 | 60 | 40 | 20 | 50 | — | — | — | — | 45 | 45 | 45 |
| | | MCrAlY | — | — | — | — | — | 70 | 50 | 30 | 40 | — | — | — |
| | | NiAl | — | — | — | — | — | — | — | — | — | — | — | — |
| | | NiCr—Al | — | — | — | — | — | — | — | — | — | — | — | — |
| | | Mo | 45 | — | — | — | — | — | 40 | — | — | 45 | 45 | 45 |
| | Composition and thickness of precious layer | Au | — | 30 | — | — | — | — | — | 60 | — | — | — | — |
| | | Pt | — | — | 40 | — | — | — | — | — | 50 | — | — | — |
| | | Ru | — | — | — | 60 | — | — | — | — | — | — | — | — |
| | | Rh | — | — | — | — | 50 | — | — | — | — | — | — | — |
| | | Pd | — | — | — | — | — | 30 | — | — | — | — | — | — |
| | | Ir | — | — | — | — | — | — | — | — | — | — | — | — |
| Composite ceramic layer | Composition and thickness of ceramic A layer | YSZ | — | — | — | — | — | — | — | — | — | 60 | 40 | — |
| | | $RE_2Zr_2O_7$ | 50 | 45 | 60 | 55 | 35 | 100 | 100 | 50 | 80 | — | — | — |
| | Composition and thickness of ceramic B layer | $ZrO_2$—$YTaO_4$ | 40 | — | — | — | — | — | — | — | — | — | — | — |
| | | $ZrO_2$—$GdTaO_4$ | — | — | — | 30 | — | — | — | — | — | — | — | — |
| | | $ZrO_2$—$NdTaO_4$ | — | 50 | — | — | — | — | — | — | — | — | — | — |
| | | $ZrO_2$—$SmTaO_4$ | — | — | — | — | — | — | — | 60 | — | — | — | — |
| | | $ZrO_2$—$EuTaO_4$ | — | — | 20 | — | — | — | — | — | — | — | — | — |
| | | $ZrO_2$—$DyTaO_4$ | — | — | — | — | — | 10 | — | — | — | — | — | — |
| | | $ZrO_2$—$ErTaO_4$ | — | — | — | — | 30 | — | — | — | — | — | — | — |
| | | $ZrO_2$—$YbTaO_4$ | — | — | — | — | — | — | 20 | — | — | — | — | — |
| | | $ZrO_2$—$LuTaO_4$ | — | — | — | — | — | — | — | — | 20 | — | — | — |
| Composition and thickness of reflecting layer | | $Y_2O_3$ | 5 | — | — | — | — | — | — | — | — | 20 | — | — |
| | | $YVO_4$ | — | 8 | — | — | — | — | — | — | 35 | — | — | — |
| | | $GdVO_4$ | — | — | 5 | — | — | 38 | — | — | — | — | — | 20 |
| | | $YTaO_4$ | — | — | — | 35 | — | — | — | 8 | — | — | — | — |
| | | $GdTaO_4$ | — | — | — | — | 8 | 35 | — | — | — | — | — | — |
| Composition and thickness of catadioptric layer | | Graphene | 5 | — | 9 | — | 35 | 38 | — | 45 | 50 | 20 | 20 | 20 |
| | | Boron carbide | — | 8 | — | 6 | — | — | 40 | — | — | — | — | — |
| Composition and thickness of insulating layer | | Epoxy resin | 5 | — | — | — | 25 | — | 30 | — | — | 15 | 15 | 15 |
| | | Phenolic resin | — | 9 | — | — | — | — | — | — | 40 | — | — | — |
| | | ABS resin | — | — | 8 | 5 | — | 28 | — | 35 | — | — | — | — |
| Thickness of carbon foam layer | | | 15 | 10 | 18 | 5 | 250 | 220 | 230 | 260 | 280 | 30 | 30 | — |

The preparation method of Comparative Examples 1-12 is the same as that of Test Example 1, except that the composition and thickness of the coating layers as shown in Table 5-3 are different. Comparative Example 13 is a Q235 iron alloy matrix without deposited coating layers.

The following experiments are performed using the iron alloys provided in Test Examples 1-30 and Comparative Examples 1-13:

1. High Temperature Creep Test:

The iron alloys prepared in Test Examples 1-30 and Comparative Examples 1-13 are processed into tensile test pieces. The experimental procedures and parameters are the same as those in Embodiment 4. The data are recorded. As shown in Table 5-5, a represents the steady creep time (min)

rate increases rapidly, and the creep deformation develops rapidly until the material is broken and the creep rupture occurs. It can be found that under a stress of 50 MPa and a temperature of 1900° C., the test piece (A) ruptures in a very short time, indicating that the iron alloy can hardly bear the load at the temperature higher than the melting point, while the test piece (B) can maintain good mechanical properties under the condition of 1900° C. without rupturing for a long time and has excellent high-temperature resistance.

Figure 3E:
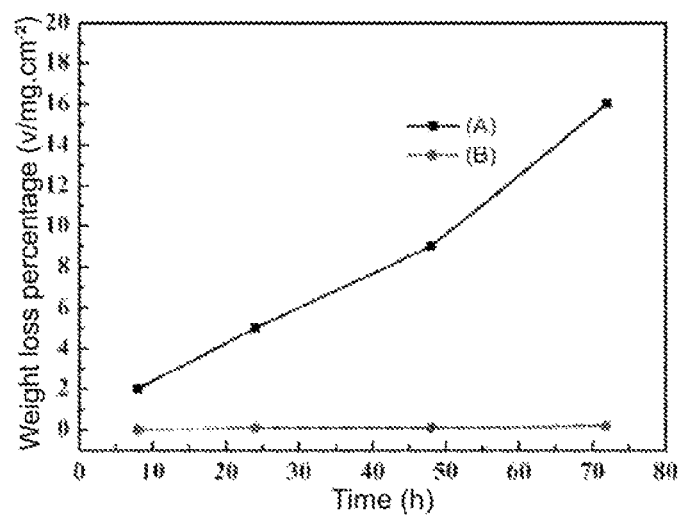
FIG. 3E is a schematic diagram of the salt-spray corrosion test results of Test Example 1 and Comparative Example 13 according to Embodiment 5 (ultralimit iron alloy) of the present disclosure.

2. Salt-Spray Corrosion Test:

The iron alloy provided in Test Examples 1-30 and Comparative Examples 1-13 are processed into test pieces of 50 mm×25 mm×2 mm, and the subsequent operations are the same as those of Embodiment 1. FIG. 3E shows the relationship curves between salt-spray corrosion weight loss and corrosion time of Test Example 1 and Comparative Example 13. In FIG. 3E, (A) represents the Q235 iron alloy matrix material without deposited coating layers in Comparative Example 13, and (B) represents the material prepared in Test Example 1. The specific experimental results of Test Examples 1-30 and Comparative Examples 1-13 are shown in Table 5-5.

It can be seen from FIG. 3E that the two iron alloys have obviously different corrosion patterns. For test piece (A) (Q235 iron alloy test piece), the corrosion weight loss value tends to increase as the corrosion time extends. In the early stage of corrosion (8-24 h), there is an oxidation film on the surface of the test piece, which prevents the iron alloy matrix from contacting the solution; the corrosion rate is low. In the middle stage of corrosion (24-48 h), the Cl⁻ (chloridion) in the solution has penetrated the oxidation film, and a large amount of Cl⁻ is adsorbed on the matrix, which increases the corrosion pit points and deepens the original corrosion pit points; the corrosion rate is obviously accelerated. After 48 hours of continuous spraying, the corrosion products are evenly distributed and the thickness increases, covering almost the entire surface of the test piece. Cl⁻ needs to pass through the corrosion products to contact the iron alloy matrix, which reduces the amount of Cl⁻ adsorbed on the matrix surface and reduces the corrosion rate. In general, the corrosion loss weight of Q235 iron alloy is much higher than that of the iron matrix surface composite material. Basically, the iron matrix surface composite material has no corrosion due to the existence of the coating layers, and the mass of the iron matrix surface composite material has hardly changed.

The experimental results are shown in Table 5-5: a represents the steady creep time (min) of the test pieces;

b represents the time when creep rupture of the test pieces happens (min);

c represents the weight loss (v/mg·cm²) of the test pieces after continuously spraying NaCl solution on the test pieces for 8 hours;

d represents the weight loss (v/mg·cm²) of the test pieces after continuously spraying NaCl solution on the test pieces for 24 hours;

e represents the weight loss (v/mg·cm²) of the test pieces after continuously spraying NaCl solution on the test pieces for 48 hours;

f represents the weight loss (v/mg·cm²) of the test pieces after continuously spraying NaCl solution on the test pieces for 72 hours.

TABLE 5-5

Experimental results of high temperature creep test and salt-spray test

| | a | b | c | d | e | f |
|---|---|---|---|---|---|---|
| Test Example 1 | 170 | 280 | 0 | 0.01 | 0.07 | 0.11 |
| Test Example 2 | 165 | 279 | 0 | 0.02 | 0.08 | 0.14 |
| Test Example 3 | 160 | 273 | 0 | 0.04 | 0.09 | 0.13 |
| Test Example 4 | 159 | 277 | 0 | 0.03 | 0.07 | 0.16 |
| Test Example 5 | 161 | 278 | 0 | 0.03 | 0.08 | 0.13 |
| Test Example 6 | 167 | 278 | 0 | 0.03 | 0.09 | 0.13 |
| Test Example 7 | 163 | 275 | 0.005 | 0.02 | 0.09 | 0.12 |
| Test Example 8 | 163 | 275 | 0 | 0.05 | 0.06 | 0.13 |
| Test Example 9 | 164 | 275 | 0.006 | 0.04 | 0.09 | 0.15 |
| Test Example 10 | 164 | 272 | 0 | 0.04 | 0.08 | 0.11 |
| Test Example 11 | 166 | 260 | 0 | 0.05 | 0.08 | 0.11 |
| Test Example 12 | 169 | 270 | 0.004 | 0.03 | 0.08 | 0.12 |
| Test Example 13 | 168 | 275 | 0 | 0.03 | 0.07 | 0.13 |
| Test Example 14 | 168 | 275 | 0 | 0.05 | 0.09 | 0.14 |
| Test Example 15 | 168 | 275 | 0 | 0.05 | 0.09 | 0.13 |
| Test Example 16 | 168 | 275 | 0 | 0.03 | 0.07 | 0.12 |

TABLE 5-5-continued

Experimental results of high temperature creep test and salt-spray test

| | a | b | c | d | e | f |
|---|---|---|---|---|---|---|
| Test Example 17 | 164 | 272 | 0.005 | 0.02 | 0.09 | 0.11 |
| Test Example 18 | 164 | 273 | 0.006 | 0.02 | 0.08 | 0.11 |
| Test Example 19 | 164 | 271 | 0.006 | 0.03 | 0.08 | 0.11 |
| Test Example 20 | 164 | 278 | 0 | 0.04 | 0.09 | 0.12 |
| Test Example 21 | 164 | 278 | 0 | 0.05 | 0.09 | 0.12 |
| Test Example 22 | 162 | 278 | 0.006 | 0.04 | 0.09 | 0.12 |
| Test Example 23 | 162 | 270 | 0 | 0.04 | 0.07 | 0.13 |
| Test Example 24 | 161 | 270 | 0 | 0.02 | 0.09 | 0.11 |
| Test Example 25 | 165 | 270 | 0 | 0.03 | 0.09 | 0.15 |
| Test Example 26 | 165 | 275 | 0 | 0.02 | 0.08 | 0.12 |
| Test Example 27 | 165 | 275 | 0.004 | 0.05 | 0.08 | 0.15 |
| Test Example 28 | 165 | 275 | 0.004 | 0.02 | 0.06 | 0.12 |
| Test Example 29 | 165 | 274 | 0.005 | 0.02 | 0.08 | 0.14 |
| Test Example 30 | 167 | 279 | 0 | 0.02 | 0.08 | 0.11 |
| Comparative Example 1 | 72 | 125 | 0.07 | 0.13 | 0.27 | 0.63 |
| Comparative Example 2 | 77 | 120 | 0.07 | 0.15 | 0.31 | 0.65 |
| Comparative Example 3 | 70 | 124 | 0.06 | 0.13 | 0.29 | 0.63 |
| Comparative Example 4 | 75 | 125 | 0.05 | 0.1 | 0.27 | 0.59 |
| Comparative Example 5 | 68 | 120 | 0.05 | 0.11 | 0.27 | 0.58 |
| Comparative Example 6 | 75 | 129 | 0.05 | 0.11 | 0.27 | 0.58 |
| Comparative Example 7 | 75 | 125 | 0.05 | 0.13 | 0.29 | 0.61 |
| Comparative Example 8 | 75 | 112 | 0.05 | 0.13 | 0.29 | 0.61 |
| Comparative Example 9 | 75 | 113 | 0.03 | 0.1 | 0.26 | 0.6 |
| Comparative Example 10 | 69 | 118 | 0.03 | 0.1 | 0.26 | 0.6 |
| Comparative Example 11 | 68 | 119 | 0.02 | 0.08 | 0.2 | 0.55 |
| Comparative Example 12 | 65 | 110 | 0.02 | 0.09 | 0.21 | 0.57 |
| Comparative Example 13 | 10 | 30 | 2.1 | 5.1 | 8.5 | 16 |

As can be seen from Table 5-5, the iron alloy obtained by the comparative examples beyond the parameter range of the present disclosure has a significant decrease in stability at high temperature; the rupture occurs in a relatively short period of time, and the corrosion resistance is poor.

In summary, by depositing composite bonding layer, composite ceramic layer, reflecting layer, catadioptric layer, insulating layer and carbon foam layer on the iron alloy, the service temperature of the iron alloy can be increased to 100-500° C. higher than the original melting point. The corrosion resistance can be greatly improved as well. The ultralimit iron alloy prepared by the ultralimit iron alloy preparation method of the present disclosure has a wide service temperature range and strong corrosion resistance; the effects of Test Example 1 are the best.

Embodiment 6 (Ultralimit Copper Alloy)

In this embodiment, the ultralimit alloy is an ultralimit copper alloy, that is, the alloy matrix is a copper alloy.

The reference signs in FIG. 1B include: copper alloy matrix 1, bonding layer 2, precious metal layer 3, ceramic A layer 4, ceramic B layer 5, reflecting layer 6, catadioptric layer 7, insulating layer 8, and carbon foam layer 9.

As shown in FIG. 1B, the present disclosure provides an ultralimit copper alloy, including an copper alloy matrix 1. The surface of the copper alloy matrix 1 is successively deposited with a composite bonding layer with a thickness of 100-200 μm, a composite ceramic layer with a thickness of 150-500 μm, a reflecting layer 6 with a thickness of 10-30 μm, a catadioptric layer 7 with a thickness of 10-30 μm, an insulating layer 8 with a thickness of 10-200 μm and a carbon foam layer 9 with a thickness of 20-200 μm. The composite bonding layer includes a bonding layer 2 deposited on the surface of the copper alloy matrix 1 and a precious metal layer 3 deposited on the surface of the bonding layer 2. The composition of the bonding layer 2 is one or more of MCrAlY, NiAl, NiCr—Al and Mo; MCrAlY is NiCrCoAlY, NiCoCrAlY, CoNiCrAlY or CoCrAlY. The composition of the precious metal layer 3 is one of or an alloy of more of Au, Pt, Ru, Rh, Pd, and Ir. The composite ceramic layer includes a ceramic A layer 4 and a ceramic B layer 5. The composition of the ceramic A layer 4 is YSZ or rare earth zirconate ($RE_2Zr_2O_7$, RE=Y, Gd, Nd, Sm, Eu or Dy). The composition of the ceramic B layer 5 is $ZrO_2$-$RETaO_4$ (RE=Y, Gd, Nd, Sm, Eu, Dy, Er, Yb or Lu). The reflecting layer 6 is one or more of $REVO_4$, $RETaO_4$ and $Y_2O_3$, and RE=Y, Nd, Sm, Eu, Gd, Dy, Er, Yb or Lu. The composition of the catadioptric layer 7 is one or two of graphene and boron carbide, and the spatial distribution of the graphene and boron carbide are in a disorderly arranged state. The composition of the insulating layer 8 is one or more of epoxy resin, phenolic resin, and ABS resin.

The present disclosure uses $ZrO_2$-$RETaO_4$ as the ceramic B layer, which has the effects of low thermal conductivity and high expansion rate, and can reduce heat conduction; The method for preparing $ZrO_2$-$RETaO_4$ is the same as that of Embodiment 1, and the $ZrO_2$-$RETaO_4$ can meet the requirements of APS spraying technology on powder particle size and morphology.

Based on extensive experiments, the inventors obtain ultralimit copper alloys with the largest increase in service temperature, small increase in weight of the copper alloy and the best composition and thickness of the coating layers within the parameter scope of the present disclosure. In the present disclosure, 30 of them are listed for description.

The parameters of Test Examples 1-30 of an ultralimit copper alloy and its preparation method according to the present disclosure are shown in Table 6-1, Table 6-2, and Table 6-3 (thickness unit: μm):

TABLE 6-1

Composition and thickness of each coating layer in Test Examples 1-10 of an ultralimit copper alloy and its preparation method

| | | Test Example | 1 | 2 | 3 | 4 | 5 | 6 | 7 | 8 | 9 | 10 |
|---|---|---|---|---|---|---|---|---|---|---|---|---|
| Composite bonding layer | Composition and thickness of bonding layer | NiCrCoAlY | 50 | 60 | 40 | 60 | 70 | — | — | — | — | — |
| | | CoCrAlY | — | — | — | — | — | — | — | — | — | — |
| | | NiCoCrAlY | — | — | — | — | — | — | — | — | — | — |
| | | CoNiCrAlY | — | — | — | — | — | — | — | — | — | — |
| | | NiAl | — | — | — | — | — | 70 | 50 | 60 | 70 | 60 |
| | | NiCr—Al | — | — | — | — | — | — | — | — | — | — |
| | | Mo alloy | — | — | — | — | — | — | — | — | — | — |
| | Composition and thickness of precious layer | Au | 50 | — | — | — | — | — | 150 | — | — | — |
| | | Pt | — | 40 | — | — | — | — | — | 60 | — | — |
| | | Ru | — | — | 60 | — | — | — | — | — | 50 | — |
| | | Rh | — | — | — | 60 | — | — | — | — | — | 70 |
| | | Pd | — | — | — | — | 50 | — | — | — | — | — |
| | | Ir | — | — | — | — | — | 100 | — | — | — | — |
| | | PT-Rh alloy | — | — | — | — | — | — | — | — | — | — |
| | | Pd—Rh alloy | — | — | — | — | — | — | — | — | — | — |
| | | Ru—Rh alloy | — | — | — | — | — | — | — | — | — | — |
| Composite ceramic layer | Composition and thickness of ceramic A layer | YSZ | 70 | 60 | 80 | 90 | 110 | 180 | — | — | — | — |
| | | $Y_2Zr_2O_7$ | — | — | — | — | — | — | 200 | — | — | — |
| | | $Gd_2Zr_2O_7$ | — | — | — | — | — | — | — | 80 | — | — |
| | | $Nd_2Zr_2O_7$ | — | — | — | — | — | — | — | — | 90 | — |
| | | $Sm_2Zr_2O_7$ | — | — | — | — | — | — | — | — | — | 120 |
| | | $Eu_2Zr_2O_7$ | — | — | — | — | — | — | — | — | — | — |
| | | $Dy_2Zr_2O_7$ | — | — | — | — | — | — | — | — | — | — |
| | | YSZ and $Sm_2Zr_2O_7$ | — | — | — | — | — | — | — | — | — | — |
| | | YSZ and $Eu_2Zr_2O_7$ | — | — | — | — | — | — | — | — | — | — |
| | | YSZ and $Nd_2Zr_2O_7$ | — | — | — | — | — | — | — | — | — | — |
| | Composition and thickness of ceramic B layer | $ZrO_2$—$YTaO_4$ | 80 | 90 | — | 100 | — | — | 300 | — | — | — |
| | | $ZrO_2$—$GdTaO_4$ | — | — | 70 | — | 85 | 150 | — | 80 | — | — |
| | | $ZrO_2$—$NdTaO_4$ | — | — | — | — | — | — | — | — | 100 | — |
| | | $ZrO_2$—$SmTaO_4$ | — | — | — | — | — | — | — | — | — | 70 |
| | | $ZrO_2$—$EuTaO_4$ | — | — | — | — | — | — | — | — | — | — |
| | | $ZrO_2$—$DyTaO_4$ | — | — | — | — | — | — | — | — | — | — |
| | | $ZrO_2$—$ErTaO_4$ | — | — | — | — | — | — | — | — | — | — |
| | | $ZrO_2$—$YbTaO_4$ | — | — | — | — | — | — | — | — | — | — |
| | | $ZrO_2$—$LuTaO_4$ | — | — | — | — | — | — | — | — | — | — |
| Composition and thickness of reflecting layer | | $Y_2O_3$ | 10 | 10 | — | — | — | — | 15 | — | — | — |
| | | $YVO_4$ | — | — | 20 | — | 30 | 10 | — | — | — | — |
| | | $NdVO_4$ | — | — | — | — | — | — | — | — | — | — |
| | | $SmVO_4$ | — | — | — | — | — | — | — | — | — | — |
| | | $EuVO_4$ | — | — | — | — | — | — | — | — | — | — |
| | | $GdVO_4$ | — | — | — | — | — | — | — | — | — | 10 |
| | | $DyVO_4$ | — | — | — | — | — | — | — | — | — | — |
| | | $ErVO_4$ | — | — | — | — | — | — | — | — | — | — |
| | | $YbVO_4$ | — | — | — | — | — | — | — | — | — | — |
| | | $LuVO_4$ | — | — | — | — | — | — | — | — | — | — |
| | | $YTaO_4$ | — | — | — | 20 | — | — | — | 10 | 20 | — |
| | | $NdTaO_4$ | — | — | — | — | — | — | — | — | — | — |
| | | $SmTaO_4$ | — | — | — | — | — | — | — | — | — | — |
| | | $EuTaO_4$ | — | — | — | — | — | — | — | — | — | — |
| | | $GdTaO_4$ | — | — | — | — | — | — | — | — | — | — |
| | | $DyTaO_4$ | — | — | — | — | — | — | — | — | — | — |
| | | $ErTaO_4$ | — | — | — | — | — | — | — | — | — | — |
| | | $YbTaO_4$ | — | — | — | — | — | — | — | — | — | — |
| | | $LuTaO_4$ | — | — | — | — | — | — | — | — | — | — |

TABLE 6-1-continued

Composition and thickness of each coating layer in Test Examples 1-10 of an ultralimit copper alloy and its preparation method

| Test Example | | 1 | 2 | 3 | 4 | 5 | 6 | 7 | 8 | 9 | 10 |
|---|---|---|---|---|---|---|---|---|---|---|---|
| | $Y_2O_3$ and $EuVO_4$ | — | — | — | — | — | — | — | — | — | — |
| | $YVO_4$ and $EuTaO_4$ | — | — | — | — | — | — | — | — | — | — |
| | $Y_2O_3$ and $LuTaO_4$ | — | — | — | — | — | — | — | — | — | — |
| | $YVO_4$ and $LuTaO_4$ | — | — | — | — | — | — | — | — | — | — |
| Composition and thickness of catadioptric layer | Graphene | 10 | 10 | 20 | 20 | 30 | 10 | — | — | — | — |
| | Boron carbide | — | — | — | — | — | — | 30 | 15 | 25 | 20 |
| Composition and thickness of insulating layer | Epoxy resin | 15 | 10 | — | — | — | — | 20 | — | — | 10 |
| | Phenolic resin | — | — | 20 | 20 | — | — | — | — | 15 | — |
| | ABS resin | — | — | — | — | 50 | 100 | — | 10 | — | — |
| Thickness of carbon foam layer | | 20 | 20 | 20 | 20 | 100 | 200 | 30 | 25 | 20 | 35 |

TABLE 6-2

Composition and thickness of each coating layer in Test Examples 11-20 of an ultralimit copper alloy and its preparation method

| | Test Example | | 11 | 12 | 13 | 14 | 15 | 16 | 17 | 18 | 19 | 20 |
|---|---|---|---|---|---|---|---|---|---|---|---|---|
| Composite bonding layer | Composition and thickness of bonding layer | NiCrCoAlY | — | — | — | — | — | — | — | — | — | — |
| | | CoCrAlY | 70 | — | — | — | — | — | — | — | — | — |
| | | NiCoCrAlY | — | 80 | — | — | — | — | — | — | — | — |
| | | CoNiCrAlY | — | — | 55 | — | — | 75 | — | — | — | 55 |
| | | NiAl | — | — | — | — | 80 | — | — | — | — | — |
| | | NiCr—Al | — | — | — | 80 | — | — | — | 100 | — | — |
| | | Mo alloy | — | — | — | — | — | — | 95 | — | 35 | — |
| | Composition and thickness of precious layer | Au | — | — | — | — | — | — | 105 | — | — | — |
| | | Pt | — | — | — | — | — | 85 | — | — | — | — |
| | | Ru | — | — | — | — | — | — | — | 60 | — | — |
| | | Rh | — | — | — | — | — | — | — | — | — | 70 |
| | | Pd | — | — | — | — | — | — | — | — | 110 | — |
| | | Ir | — | — | — | — | — | — | — | — | — | — |
| | | PT-Rh alloy | 70 | — | — | — | 70 | — | — | — | — | — |
| | | Pd—Rh alloy | — | 60 | — | 55 | — | — | — | — | — | — |
| | | Ru—Rh alloy | — | — | 100 | — | — | — | — | — | — | — |
| Composite ceramic layer | Composition and thickness of ceramic A layer | YSZ | — | — | — | — | — | 80 | — | — | — | — |
| | | $Y_2Zr_2O_7$ | — | — | — | — | — | — | 140 | — | — | — |
| | | $Gd_2Zr_2O_7$ | — | — | — | — | — | — | — | — | — | — |
| | | $Nd_2Zr_2O_7$ | — | — | — | — | — | — | — | 100 | — | — |
| | | $Sm_2Zr_2O_7$ | — | — | — | — | — | — | — | — | — | — |
| | | $Eu_2Zr_2O_7$ | 50 | — | — | — | — | — | — | — | 110 | — |
| | | $Dy_2Zr_2O_7$ | — | 70 | — | — | — | — | — | — | — | — |
| | | YSZ and $Sm_2Zr_2O_7$ | — | — | 60 | — | — | — | — | — | — | 180 |
| | | YSZ and $Eu_2Zr_2O_7$ | — | — | — | 60 | — | — | — | — | — | — |
| | | YSZ and $Nd_2Zr_2O_7$ | — | — | — | — | 100 | — | — | — | — | — |
| | Composition and thickness of ceramic B layer | $ZrO_2$—$YTaO_4$ | — | — | — | — | — | 120 | — | — | — | — |
| | | $ZrO_2$—$GdTaO_4$ | — | — | — | — | — | — | — | 50 | — | — |
| | | $ZrO_2$—$NdTaO_4$ | — | — | — | — | — | — | 60 | — | — | — |
| | | $ZrO_2$—$SmTaO_4$ | — | — | — | — | — | — | — | — | 70 | — |
| | | $ZrO_2$—$EuTaO_4$ | 130 | — | — | — | — | — | — | — | — | 100 |
| | | $ZrO_2$—$DyTaO_4$ | — | 160 | — | — | — | — | — | — | — | — |
| | | $ZrO_2$—$ErTaO_4$ | — | — | 170 | — | — | — | — | — | — | — |
| | | $ZrO_2$—$YbTaO_4$ | — | — | — | 190 | — | — | — | — | — | — |
| | | $ZrO_2$—$LuTaO_4$ | — | — | — | — | 140 | — | — | — | — | — |
| Composition and thickness of reflecting layer | | $Y_2O_3$ | — | — | — | — | — | — | — | — | — | — |
| | | $YVO_4$ | — | — | — | — | — | — | — | — | — | — |
| | | $NdVO_4$ | — | — | — | — | — | — | — | — | — | — |
| | | $SmVO_4$ | — | — | — | — | — | — | — | — | — | — |
| | | $EuVO_4$ | — | — | — | — | — | — | — | 20 | — | — |
| | | $GdVO_4$ | — | — | — | — | — | — | — | — | — | — |
| | | $DyVO_4$ | — | — | — | — | — | — | — | — | — | — |
| | | $ErVO_4$ | — | — | — | — | — | — | — | — | — | 18 |
| | | $YbVO_4$ | — | — | — | — | — | — | — | — | — | — |
| | | $LuVO_4$ | — | — | — | — | — | — | — | — | — | — |
| | | $YTaO_4$ | — | — | — | — | — | — | — | — | — | — |
| | | $NdTaO_4$ | — | — | — | — | — | — | — | — | — | — |
| | | $SmTaO_4$ | — | — | — | — | — | — | — | — | — | — |
| | | $EuTaO_4$ | — | — | — | — | — | — | — | — | 25 | — |
| | | $GdTaO_4$ | — | — | — | — | — | — | — | — | — | — |
| | | $DyTaO_4$ | — | — | — | — | — | — | — | — | — | — |
| | | $ErTaO_4$ | — | — | — | — | — | — | — | — | — | — |
| | | $YbTaO_4$ | — | — | — | — | — | — | — | — | — | — |

TABLE 6-2-continued

Composition and thickness of each coating layer in Test Examples 11-20 of an ultralimit copper alloy and its preparation method

| Test Example | | 11 | 12 | 13 | 14 | 15 | 16 | 17 | 18 | 19 | 20 |
|---|---|---|---|---|---|---|---|---|---|---|---|
| | $LuTaO_4$ | — | — | — | — | — | — | — | — | — | — |
| | $Y_2O_3$ and $EuVO_4$ | 15 | — | — | — | — | 10 | — | — | — | — |
| | $YVO_4$ and $EuTaO_4$ | — | 20 | — | — | — | — | 15 | — | — | — |
| | $Y_2O_3$ and $LuTaO_4$ | — | — | 10 | — | 20 | — | — | — | — | — |
| | $YVO_4$ and $LuTaO_4$ | — | — | — | 15 | — | — | — | — | — | — |
| Composition and thickness of catadioptric layer | Graphene | 15 | 30 | — | — | 25 | — | 20 | — | — | 23 |
| | Boron carbide | — | — | 15 | 20 | — | 25 | — | 30 | 23 | — |
| Composition and thickness of insulating layer | Epoxy resin | 15 | — | — | 15 | — | — | 25 | 30 | — | 35 |
| | Phenolic resin | — | 10 | — | — | — | — | — | — | 40 | — |
| | ABS resin | — | — | 20 | — | 110 | 200 | — | — | — | — |
| Thickness of carbon foam layer | | 30 | 40 | 45 | 50 | 70 | 50 | 60 | 80 | 100 | 120 |

TABLE 6-3

Composition and thickness of each coating layer in Test Examples 21-30 of an ultralimit copper alloy and its preparation method

| Test Example | | | 21 | 22 | 23 | 24 | 25 | 26 | 27 | 28 | 29 | 30 |
|---|---|---|---|---|---|---|---|---|---|---|---|---|
| Composite bonding layer | Composition and thickness of bonding layer | NiCrCoAlY | 75 | — | 40 | — | — | — | — | — | — | 95 |
| | | CoCrAlY | — | 50 | — | — | — | — | — | — | — | — |
| | | NiCoCrAlY | — | — | — | — | — | 40 | — | — | — | — |
| | | CoNiCrAlY | — | — | — | — | 60 | — | — | — | — | — |
| | | NiAl | — | — | — | 30 | — | — | — | — | — | — |
| | | NiCr—Al | — | — | — | — | — | — | 80 | 95 | — | — |
| | | Mo alloy | — | — | — | — | — | — | — | — | 65 | — |
| | Composition and thickness of precious layer | Au | 55 | — | — | — | — | — | — | — | — | 45 |
| | | Pt | — | 60 | — | — | — | — | — | — | — | — |
| | | Ru | — | — | 60 | — | 40 | — | — | — | 55 | — |
| | | Rh | — | — | — | 70 | — | — | — | — | — | — |
| | | Pd | — | — | — | — | — | 80 | — | 55 | — | — |
| | | Ir | — | — | — | — | — | — | 70 | — | — | — |
| | | PT-Rh alloy | — | — | — | — | — | — | — | — | — | — |
| | | Pd—Rh alloy | — | — | — | — | — | — | — | — | — | — |
| | | Ru—Rh alloy | — | — | — | — | — | — | — | — | — | — |
| Composite ceramic layer | Composition and thickness of ceramic A layer | YSZ | 90 | — | — | — | — | — | — | — | — | 70 |
| | | $Y_2Zr_2O_7$ | — | 50 | — | — | — | — | — | 90 | — | — |
| | | $Gd_2Zr_2O_7$ | — | — | — | — | — | 80 | — | — | — | — |
| | | $Nd_2Zr_2O_7$ | — | — | 150 | — | — | — | 300 | — | 85 | — |
| | | $SmZr_2O_7$ | — | — | — | 100 | 180 | — | — | — | — | — |
| | | $Eu_2Zr_2O_7$ | — | — | — | — | — | — | — | — | — | — |
| | | $Dy_2Zr_2O_7$ | — | — | — | — | — | — | — | — | — | — |
| | | YSZ and $Sm_2Zr_2O_7$ | — | — | — | — | — | — | — | — | — | — |
| | | YSZ and $Eu_2Zr_2O_7$ | — | — | — | — | — | — | — | — | — | — |
| | | YSZ and $Nd_2Zr_2O_7$ | — | — | — | — | — | — | — | — | — | — |
| | Composition and thickness of ceramic B layer | $ZrO_2$—$YTaO_4$ | — | — | — | — | — | — | — | — | — | 150 |
| | | $ZrO_2$—$GdTaO_4$ | — | — | — | — | — | — | — | — | — | — |
| | | $ZrO_2$—$NdTaO_4$ | — | — | — | — | — | — | — | — | 75 | — |
| | | $ZrO_2$—$SmTaO_4$ | — | — | — | — | — | — | — | — | — | — |
| | | $ZrO_2$—$EuTaO_4$ | — | — | — | — | — | — | — | — | — | — |
| | | $ZrO_2$—$DyTaO_4$ | 80 | — | — | — | — | — | — | 100 | — | — |
| | | $ZrO_2$—$ErTaO_4$ | — | — | — | — | 90 | — | 130 | — | — | — |
| | | $ZrO_2$—$YbTaO_4$ | — | 150 | — | — | — | 100 | — | — | — | — |
| | | $ZrO_2$—$LuTaO_4$ | — | — | 50 | 70 | — | — | — | — | — | — |
| Composition and thickness of reflecting layer | | $Y_2O_3$ | — | — | — | — | — | — | — | — | — | 20 |
| | | $YVO_4$ | — | — | — | — | — | — | — | — | — | — |
| | | $NdVO_4$ | — | 12 | — | — | — | — | — | — | — | — |
| | | $SmVO_4$ | — | — | — | — | — | — | — | — | — | — |
| | | $EuVO_4$ | — | — | — | — | — | — | — | — | — | — |
| | | $GdVO_4$ | — | — | — | — | — | — | — | — | — | — |
| | | $DyVO_4$ | — | — | — | 22 | — | — | — | — | — | — |
| | | $ErVO_4$ | — | — | — | — | — | 10 | — | — | — | — |
| | | $YbVO_4$ | — | — | — | — | — | — | 18 | — | — | — |
| | | $LuVO_4$ | — | — | — | — | — | — | — | — | 30 | — |
| | | $YTaO_4$ | — | — | — | — | — | — | — | — | — | — |
| | | $NdTaO_4$ | — | — | 12 | — | — | — | — | — | — | — |
| | | $SmTaO_4$ | — | — | — | — | — | — | — | — | — | — |
| | | $EuTaO_4$ | — | — | — | — | — | — | — | — | — | — |
| | | $GdTaO_4$ | — | — | — | — | — | — | — | — | — | — |
| | | $DyTaO_4$ | — | — | — | — | 12 | — | — | — | — | — |
| | | $ErTaO_4$ | 18 | — | — | — | — | — | — | — | — | — |

TABLE 6-3-continued

Composition and thickness of each coating layer in Test Examples 21-30 of an ultralimit copper alloy and its preparation method

| Test Example | | 21 | 22 | 23 | 24 | 25 | 26 | 27 | 28 | 29 | 30 |
|---|---|---|---|---|---|---|---|---|---|---|---|
| | $YbTaO_4$ | — | — | — | — | 10 | — | 28 | — | — | — |
| | $LuTaO_4$ | — | — | — | — | — | — | — | — | 30 | — |
| | $Y_2O_3$ and $EuVO_4$ | — | — | — | — | — | — | — | — | — | — |
| | $YVO_4$ and $EuTaO_4$ | — | — | — | — | — | — | — | — | — | — |
| | $Y_2O_3$ and $LuTaO_4$ | — | — | — | — | — | — | — | — | — | — |
| | $YVO_4$ and $LuTaO_4$ | — | — | — | — | — | — | — | — | — | — |
| Composition and thickness of catadioptric layer | Graphene | 15 | 28 | 18 | 18 | 13 | 13 | 10 | 10 | 15 | 20 |
| | Boron carbide | — | — | — | — | — | — | — | — | — | — |
| Composition and thickness of insulating layer | Epoxy resin | — | — | — | — | — | 180 | — | 160 | — | 15 |
| | Phenolic resin | 30 | — | — | 80 | 100 | — | — | — | — | — |
| | ABS resin | — | 30 | 60 | — | — | — | 150 | — | 170 | — |
| Thickness of carbon foam layer | | 130 | 150 | 160 | 170 | 175 | 180 | 185 | 190 | 200 | 30 |

Now, take Test Example 1 of Embodiment 6 as an example to illustrate another technical solution of the present disclosure, that is, a method for preparing an ultralimit copper alloy. A method for preparing an ultralimit copper alloy, including the following operations:

Operation 1: basically the same as the operation 1 of preparing ultralimit titanium alloy in Embodiment 4, except that C86100 copper alloy serves as the alloy matrix in this test example.

Operation 2: basically the same as the operation 2 of preparing ultralimit titanium alloy in Embodiment 4, except that the thickness of the deposited bonding layer is 45 μm, and the thickness of the precious metal layer is 45 μm.

Operation 3: basically the same as the operation 3 of preparing ultralimit titanium alloy in Embodiment 4, except that the thickness of the ceramic A layer is 70 μm, and the thickness of the ceramic B layer is 50 μm.

Operation 4: a layer of $Y_2O_3$ transparent ceramic material is sprayed on the surface of the composite ceramic layer as a reflecting layer by the HVOF method. The thickness of the sprayed reflecting layer is 20 μm.

Operation 5: a layer of graphene is brushed on the surface of the $Y_2O_3$ reflecting layer as a catadioptric layer by a brushing method, and the thickness of the catadioptric layer is 10 μm.

Operation 6: a layer of epoxy resin is brushed on the surface of the graphene catadioptric layer as an insulating layer by a brushing method, and the thickness of the insulating layer is 15 μm.

Operation 7: a layer of carbon foam layer is brushed on the epoxy resin insulating layer by a brushing method, and the thickness of the carbon foam layer is 20 μm. The ultralimit copper alloy is obtained.

The preparation process of Test Examples 2-29 is the same as that of Test Examples 1, except that the composition and thickness of the coating layers as shown in Table 6-1 are different. The difference between Test Example 30 and Test Example 1 is that the spraying sequence of the ceramic A layer and the ceramic B layer in operation 3 is different.

13 groups of Comparative Examples are provided to perform comparative experiments with Test Examples 1-30. The parameters of Comparative Examples 1-12 are shown in Table 6-4 (thickness unit: μm):

Table 6-4 Composition and thickness of each coating layer in Comparative Examples 1-12

| | | Comparative Example | 1 | 2 | 3 | 4 | 5 | 6 | 7 | 8 | 9 | 10 | 11 | 12 |
|---|---|---|---|---|---|---|---|---|---|---|---|---|---|---|
| Composite bonding layer | Composition and thickness of bonding layer | NiCrCoAlY | 45 | 60 | 40 | 20 | 50 | — | — | — | — | 45 | 45 | 45 |
| | | MCrAlY | — | — | — | — | — | 70 | 50 | 30 | 40 | — | — | — |
| | | NiAl | — | — | — | — | — | — | — | — | — | — | — | — |
| | | NiCr—Al | — | — | — | — | — | — | — | — | — | — | — | — |
| | | Mo alloy | 45 | — | — | — | — | — | 40 | — | — | 45 | 45 | 45 |
| | Composition and thickness of precious layer | Au | — | 30 | — | — | — | — | — | 60 | — | — | — | — |
| | | Pt | — | — | 40 | — | — | — | — | — | 50 | — | — | — |
| | | Ru | — | — | — | 60 | — | — | — | — | — | — | — | — |
| | | Rh | — | — | — | — | 50 | — | — | — | — | — | — | — |
| | | Pd | — | — | — | — | — | 30 | — | — | — | — | — | — |
| | | Ir | — | — | — | — | — | — | — | — | — | — | — | — |
| Composite ceramic layer | Composition and thickness of ceramic A layer | YSZ | — | — | — | — | — | — | — | — | — | 60 | 40 | — |
| | | $RE_2Zr_2O_7$ | 50 | 45 | 60 | 55 | 35 | 100 | 100 | 50 | 80 | — | — | — |
| | Composition and thickness of ceramic B layer | $ZrO_2$—$YTaO_4$ | 40 | — | — | — | — | — | — | — | — | — | — | — |
| | | $ZrO_2$—$GdTaO_4$ | — | — | — | 30 | — | — | — | — | — | — | — | — |
| | | $ZrO_2$—$NdTaO_4$ | — | 50 | — | — | — | — | — | — | — | — | — | — |
| | | $ZrO_2$—$SmTaO_4$ | — | — | — | — | — | — | — | 60 | — | — | — | — |
| | | $ZrO_2$—$EuTaO_4$ | — | — | 20 | — | — | — | — | — | — | — | — | — |
| | | $ZrO_2$—$DyTaO_4$ | — | — | — | — | — | 10 | — | — | — | — | — | — |
| | | $ZrO_2$—$ErTaO_4$ | — | — | — | — | 30 | — | — | — | — | — | — | — |
| | | $ZrO_2$—$YbTaO_4$ | — | — | — | — | — | — | 20 | — | — | — | — | — |
| | | $ZrO_2$—$LuTaO_4$ | — | — | — | — | — | — | — | — | 20 | — | — | — |
| Composition and thickness of reflecting layer | | $Y_2O_3$ | 5 | — | — | — | — | — | — | — | — | — | 20 | — |
| | | $YVO_4$ | — | 8 | — | — | — | — | — | — | — | 35 | — | — |
| | | $GdVO_4$ | — | — | 5 | — | — | — | 38 | — | — | — | — | 20 |

-continued

| Comparative Example | | 1 | 2 | 3 | 4 | 5 | 6 | 7 | 8 | 9 | 10 | 11 | 12 |
|---|---|---|---|---|---|---|---|---|---|---|---|---|---|
| Composition and thickness of catadioptric layer | YTaO$_4$ | — | — | — | 35 | — | — | — | 8 | — | — | — | — |
| | GdTaO$_4$ | — | — | — | — | 8 | 35 | — | — | — | — | — | — |
| | Graphene | 5 | — | 9 | — | 35 | 38 | — | 45 | 50 | 20 | 20 | 20 |
| | Boron carbide | — | 8 | — | 6 | — | — | 40 | — | — | — | — | — |
| Composition and thickness of insulating layer | Epoxy resin | 5 | — | — | — | 25 | — | 30 | — | — | 15 | 15 | 15 |
| | Phenolic resin | — | 9 | — | — | — | — | — | — | 40 | — | — | — |
| | ABS resin | — | — | 8 | 5 | — | 28 | — | 35 | — | — | — | — |
| Thickness of carbon foam layer | | 15 | 10 | 18 | 5 | 250 | 220 | 230 | 260 | 280 | 30 | 30 | — |

The preparation method of Comparative Examples 1-12 is the same as that of Test Example 1, except that the composition and thickness of the coating layers as shown in Table 6-3 are different. Comparative Example 13 is a C86100 copper alloy matrix without deposited coating layers.

The following experiments are performed using the copper alloys provided in Test Examples 1-30 and Comparative Examples 1-13:

1. High Temperature Creep Test:

The copper alloys prepared by Test Examples 1-30 and Comparative Examples 1-13 are processed into tensile test pieces and placed into an electronic high temperature creep rupture strength test machine. The experimental conditions are the same as in Embodiment 4. The test machine is adjusted to a stress of 50 MPa and a temperature of 1300° C., and the following data are recorded. As shown in Table 6-5, a represents the steady creep time (min) of the test pieces; b represents the time when creep rupture of the test pieces happens (min).

Figure 2F:
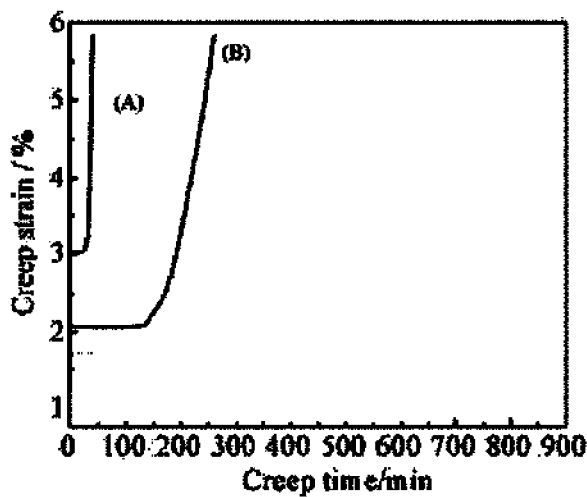
FIG. 2F shows creep test curves of Test Example 1 and Comparative Example 13 at 50 MPa and 1300° C. according to Embodiment 6 (ultralimit copper alloy) of the present disclosure.

Take Test Example 1 and Comparative Example 13 as examples. FIG. 2F shows the high temperature creep test curves of Test Example 1 and Comparative Example 13. In FIG. 2F, (A) represents the C86100 copper alloy matrix material without deposited coating layers in Comparative Example 13, and (B) represents the material prepared in Test Example 1.

It can be seen from FIG. 2F that under a stress of 50 MPa and a temperature of 1300° C., there are three stages of creep in test pieces (A) and (B): the first stage is short and has a high creep rate, which quickly transitions to the second stage of creep; the creep rate of the second stage reaches a minimum value, and the second stage is long and is basically in a steady-state creep process; in the third stage, the creep rate increases rapidly, and the creep deformation develops rapidly until the material is broken and the creep rupture occurs. It can be found that under a stress of 50 MPa and a temperature of 1300° C., the test piece (A) ruptures in a very short time, indicating that the copper alloy can hardly bear the load at the temperature higher than the melting point, while the test piece (B) can maintain good mechanical properties under the condition of 1300° C. without rupturing for a long time and has excellent high-temperature resistance.

Figure 3F:
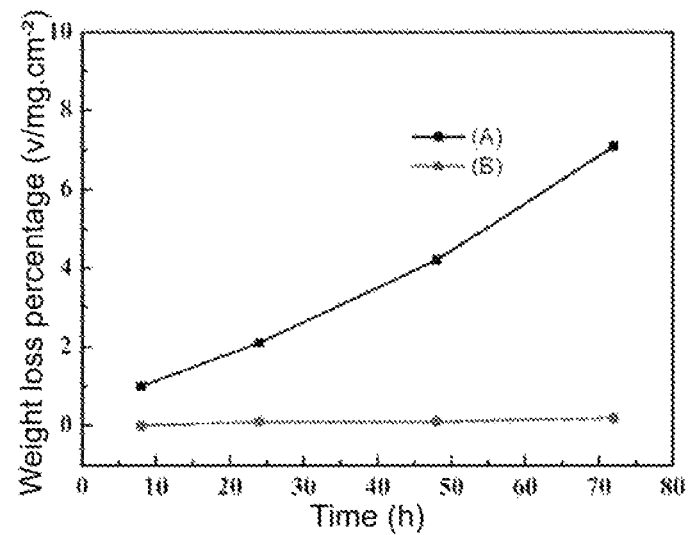
FIG. 3F is a schematic diagram of the salt-spray corrosion test results of Test Example 1 and Comparative Example 13 according to Embodiment 6 (ultralimit copper alloy) of the present disclosure.

Salt-Spray Corrosion Test:

The copper alloy provided in Test Examples 1-30 and Comparative Examples 1-13 are processed into test pieces of 50 mm×25 mm×2 mm, and the subsequent operations are the same as those of Embodiment 1. The weight loss of the test pieces is shown in FIG. 3F (in FIG. 3F, (A) represents the C86100 copper alloy matrix material without deposited coating layers in Comparative Example 13, and (B) represents Test Example 1). The specific experimental results of Test Examples 1-30 and Comparative Examples 1-13 are shown in Table 6-5.

It can be seen from FIG. 3F that the two copper alloys have obviously different corrosion patterns. For test piece (A) (C86100 copper alloy test piece), the corrosion weight loss value tends to increase as the corrosion time extends. In the early stage of corrosion (8-24 h), there is an oxidation film on the surface of the test piece, which prevents the copper alloy matrix from contacting the solution; the corrosion rate is low. In the middle stage of corrosion (24-48 h), the Cl$^-$ (chloridion) in the solution has penetrated the oxidation film, and a large amount of Cl$^-$ is adsorbed on the matrix, which increases the corrosion pit points and deepens the original corrosion pit points; the corrosion rate is obviously accelerated. After 48 hours of continuous spraying, the corrosion products are evenly distributed and the thickness increases, covering almost the entire surface of the test piece. Cl$^-$ needs to pass through the corrosion products to contact the copper alloy matrix, which reduces the amount of Cl$^-$ adsorbed on the matrix surface and reduces the corrosion rate. In general, the corrosion loss weight of C86100 copper alloy is much higher than that of the copper matrix surface composite material. Basically, the copper matrix surface composite material has no corrosion due to the existence of the coating layers, and the mass of the copper matrix surface composite material has hardly changed.

In Table 6-5, a represents the steady creep time (min) of the test pieces;

b represents the time when creep rupture of the test pieces happens (min);

c represents the weight loss (v/mg·cm$^2$) of the test pieces after continuously spraying NaCl solution on the test pieces for 8 hours;

d represents the weight loss (v/mg·cm$^2$) of the test pieces after continuously spraying NaCl solution on the test pieces for 24 hours;

e represents the weight loss (v/mg·cm$^2$) of the test pieces after continuously spraying NaCl solution on the test pieces for 48 hours;

f represents the weight loss (v/mg·cm$^2$) of the test pieces after continuously spraying NaCl solution on the test pieces for 72 hours.

TABLE 6-5

Experimental results of high temperature creep test and salt-spray test

| | a | b | c | d | e | f |
|---|---|---|---|---|---|---|
| Test Example 1 | 160 | 270 | 0 | 0.01 | 0.07 | 0.11 |
| Test Example 2 | 155 | 269 | 0 | 0.05 | 0.08 | 0.17 |
| Test Example 3 | 160 | 263 | 0 | 0.04 | 0.08 | 0.17 |
| Test Example 4 | 159 | 267 | 0 | 0.03 | 0.07 | 0.18 |
| Test Example 5 | 161 | 268 | 0 | 0.03 | 0.07 | 0.13 |
| Test Example 6 | 155 | 268 | 0 | 0.03 | 0.07 | 0.13 |
| Test Example 7 | 157 | 265 | 0.005 | 0.02 | 0.06 | 0.12 |
| Test Example 8 | 157 | 265 | 0 | 0.05 | 0.09 | 0.13 |
| Test Example 9 | 152 | 265 | 0.006 | 0.04 | 0.07 | 0.15 |
| Test Example 10 | 156 | 262 | 0 | 0.04 | 0.07 | 0.11 |
| Test Example 11 | 158 | 260 | 0 | 0.05 | 0.09 | 0.11 |
| Test Example 12 | 159 | 260 | 0.004 | 0.03 | 0.06 | 0.12 |
| Test Example 13 | 159 | 265 | 0 | 0.03 | 0.06 | 0.13 |

TABLE 6-5-continued

Experimental results of high temperature creep test and salt-spray test

| | a | b | c | d | e | f |
|---|---|---|---|---|---|---|
| Test Example 14 | 155 | 265 | 0 | 0.05 | 0.09 | 0.14 |
| Test Example 15 | 154 | 265 | 0 | 0.05 | 0.09 | 0.13 |
| Test Example 16 | 159 | 265 | 0 | 0.03 | 0.06 | 0.12 |
| Test Example 17 | 159 | 262 | 0.005 | 0.02 | 0.05 | 0.11 |
| Test Example 18 | 156 | 263 | 0.006 | 0.02 | 0.05 | 0.11 |
| Test Example 19 | 153 | 261 | 0.006 | 0.03 | 0.06 | 0.11 |
| Test Example 20 | 152 | 268 | 0 | 0.04 | 0.09 | 0.12 |
| Test Example 21 | 157 | 268 | 0 | 0.05 | 0.09 | 0.12 |
| Test Example 22 | 155 | 268 | 0.006 | 0.04 | 0.09 | 0.12 |
| Test Example 23 | 154 | 270 | 0 | 0.04 | 0.09 | 0.13 |
| Test Example 24 | 161 | 270 | 0 | 0.02 | 0.05 | 0.11 |
| Test Example 25 | 155 | 270 | 0 | 0.03 | 0.05 | 0.15 |
| Test Example 26 | 152 | 265 | 0 | 0.02 | 0.05 | 0.12 |
| Test Example 27 | 156 | 265 | 0.004 | 0.05 | 0.09 | 0.15 |
| Test Example 28 | 155 | 265 | 0.004 | 0.02 | 0.06 | 0.12 |
| Test Example 29 | 154 | 264 | 0.005 | 0.02 | 0.06 | 0.14 |
| Test Example 30 | 153 | 269 | 0 | 0.02 | 0.06 | 0.11 |
| Comparative Example 1 | 52 | 115 | 0.07 | 0.08 | 0.23 | 0.55 |
| Comparative Example 2 | 60 | 110 | 0.07 | 0.05 | 0.19 | 0.5 |
| Comparative Example 3 | 57 | 114 | 0.06 | 0.05 | 0.19 | 0.51 |
| Comparative Example 4 | 58 | 115 | 0.05 | 0.06 | 0.2 | 0.52 |
| Comparative Example 5 | 52 | 110 | 0.05 | 0.07 | 0.21 | 0.52 |
| Comparative Example 6 | 56 | 109 | 0.05 | 0.08 | 0.22 | 0.53 |
| Comparative Example 7 | 55 | 105 | 0.05 | 0.08 | 0.25 | 0.56 |
| Comparative Example 8 | 55 | 112 | 0.05 | 0.09 | 0.22 | 0.53 |
| Comparative Example 9 | 52 | 113 | 0.03 | 0.09 | 0.21 | 0.52 |
| Comparative Example 10 | 59 | 108 | 0.03 | 0.07 | 0.24 | 0.58 |
| Comparative Example 11 | 59 | 109 | 0.02 | 0.08 | 0.23 | 0.56 |
| Comparative Example 12 | 51 | 110 | 0.02 | 0.06 | 0.21 | 0.52 |
| Comparative Example 13 | 30 | 45 | 1.1 | 2.1 | 4.2 | 6.4 |

As can be seen from Table 6-5, the copper alloy obtained by the comparative examples beyond the parameter range of the present disclosure has a significant decrease in stability at high temperature; the rupture occurs in a relatively short period of time, and the corrosion resistance is poor.

In summary, by depositing composite bonding layer, composite ceramic layer, reflecting layer, catadioptric layer, insulating layer and carbon foam layer on the copper alloy, the service temperature of the copper alloy can be increased to 100-500° C. higher than the original melting point. The corrosion resistance can be greatly improved as well. The ultralimit copper alloy prepared by the ultralimit copper alloy preparation method of the present disclosure has a wide service temperature range and strong corrosion resistance; the effects of Test Example 1 are the best.

Embodiment 7 (Ultralimit Zirconium Alloy)

In this embodiment, the ultralimit alloy is an ultralimit zirconium alloy, that is, the alloy matrix is a zirconium alloy matrix.

Figure 4:
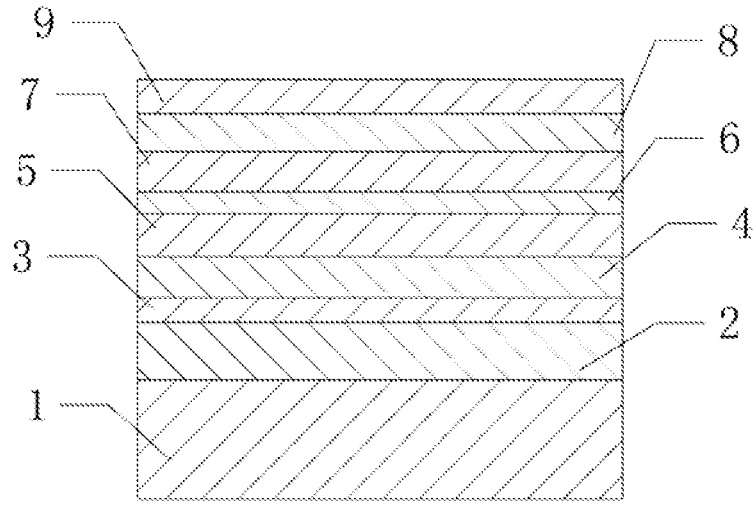
FIG. 4 is a schematic diagram of the ultralimit zirconium alloy (Embodiment 7) of the present disclosure.

The reference signs in FIG. 4 include: zirconium alloy matrix 1, bonding layer 2, precious metal layer 3, ceramic A layer 4, ceramic B layer 5, seal coating layer 6, reflecting layer 7, catadioptric layer 8, and electrically insulating layer 9.

As shown in FIG. 4, the present disclosure provides an ultralimit zirconium alloy, including an zirconium alloy matrix 1. The surface of the zirconium alloy matrix 1 is successively deposited with a bonding layer 2 with a thickness of 50-150 µm, a precious metal layer 3 with a thickness of 10-20 µm, a ceramic A layer 4 with a thickness of 50-80 µm, a ceramic B layer 5 with a thickness of 50-80 µm, a seal coating layer 6 with a thickness of 5-10 µm, a reflecting layer 7 with a thickness of 10-15 µm, a catadioptric layer 8 with a thickness of 10-15 µm, and an electrically insulating layer 9 with a thickness of 15-20 µm; the zirconium alloy matrix 1 is a zirconium alloy added with one or more elements of zinc, aluminum, copper, tin, niobium, iron, chromium, and nickel. The composition of the bonding layer 2 is MCrAlY, and the MCrAlY is CoCrAlY, NiCoCrAlY or CoNiCrAlY. The composition of the precious metal layer 3 is one of or an alloy of more of Pt, Ru, Rh, Pd, Ir, and Os. The composition of the ceramic A layer 4 is one or more of $Y_2O_3$—$ZrO_2$, $Y_2O_3$—$CeO_2$, $Y_2O_3$—$TiO_2$, $Y_2O_3$—$CeO_2$, $Y_2O_3$—$Yb_2O_3$, $Y_2O_3$—$Er_2O_3$, $Y_2O_3$—$Dy_2O_3$, and $Y_2O_3$—$HfO_2$. The composition of the ceramic B layer 5 is $RETaO_4$ (RE=Y, Nd, Eu, Gd, Dy, Er or Yb), and $RETaO_4$ is spherical in shape and has a particle size of 10-70 µm. The composition of the seal coating layer 6 is one or more of $REVO_4$, $REPO_4$ (RE=Nd, Eu, Gd, Dy, Er, Y or Yb) and BN. The composition of the reflecting layer 7 is one or more of $REVO_4$, $RETaO_4$ and $Y_2O_3$, and RE=Y, Nd, Eu, Gd, Dy, Er or Yb. The composition of the catadioptric layer 8 is graphene, and the spatial distribution of the graphene is in a disorderly arranged state. The composition of the electrically insulating layer 9 is one or more of polytetrafluoroethylene, polyimide, polyphenyl ether, polyphenylene sulfide, polyether ether ketone, bismaleimide, furan resin, cyanate ester resin and polyarylacetylene.

The present disclosure uses $RETaO_4$ as the ceramic B layer, which has the effects of low thermal conductivity and high expansion rate, and can reduce heat conduction. The $RETaO_4$ prepared by the following method can meet the requirements of APS spraying technology.

$RETaO_4$ is prepared by the following method, including the following operations:

Operation (1): pre-drying rare earth oxide ($RE_2O_3$) powder and tantalum pentoxide ($Ta_2O_5$) powder, the pre-drying temperature is 600° C., and the pre-drying time is 8 hours; weighing the pre-dried rare earth oxide powder ($RE_2O_3$) and tantalum oxide ($Ta_2O_5$) powder according to a molar ratio of 1:1; adding the pre-dried powders into the ethanol solvent to obtain a mixed solution, so that the molar ratio of RE:Ta in the mixed solution is 1:1; ball-milling the mixed solution using a ball mill for 10 hours, and the speed of the ball mill is 300 r/min;

drying the slurry obtained after ball milling using a rotary evaporator (model: N-1200B), the drying temperature is 60° C., and the drying time is 2 hours; sieving the dried powder through a 300-mesh sieve to obtain powder A.

Operation (2): preparing powder B with a composition of $RETaO_4$ from the powder A obtained in operation (1) by a high-temperature solid-phase reaction method, the reaction temperature is 1700° C. and the reaction time is 10 hours; sieving the powder B with a 300-mesh sieve;

Operation (3): mixing the powder B sieved in operation (2) with deionized water solvent and an organic bonding agent to obtain slurry C, the mass percentage of powder B in slurry C is 25%, the mass percentage of organic bonding agent in slurry C is 2%, and the rest is the solvent; the organic bonding agent is polyvinyl alcohol or gum arabic; drying the slurry C by the centrifugal atomization method to obtain dried granules D, the temperature during drying is 600° C., and the centrifugal speed is 8500 r/min;

Operation (4): sintering the granules D obtained in operation (3) at 1200° C. for 8 hours, sieving the sintered granules D with a 300-mesh sieve to obtain $RETaO_4$ ceramic powder having a particle size of 10-70 µm and a spherical shape.

Based on extensive experiments, the inventors conclude that the ultralimit zirconium alloys prepared based on parameters within the scope of the present disclosure have high service temperature and good corrosion resistance. In the present disclosure, 20 of them are listed for description.

The parameters of Test Examples 1-20 of an ultralimit zirconium alloy and its preparation method according to the present disclosure are shown in Table 7-1 and Table 7-2 (thickness unit: µm):

TABLE 7-1

Composition and thickness of each coating layer in Test Examples 1-10 of an ultralimit zirconium alloy and its preparation method

| Test Example | | | 1 | 2 | 3 | 4 | 5 | 6 | 7 | 8 | 9 | 10 |
|---|---|---|---|---|---|---|---|---|---|---|---|---|
| Composition and thickness of bonding layer | | CoCrAlY | 75 | — | — | 70 | — | — | — | 110 | — | — |
| | | NiCoCrAlY | — | 93 | — | — | 90 | — | — | — | 80 | 75 |
| | | CoNiCrAlY | — | — | 90 | — | — | 100 | 120 | — | — | — |
| Composition and thickness of precious layer | | Pt | 10 | — | — | — | — | — | — | — | — | — |
| | | Ru | — | — | — | — | — | — | — | — | 15 | — |
| | | Rh | — | 10 | — | — | — | — | — | — | — | — |
| | | Pd | — | — | 10 | — | — | — | — | — | — | — |
| | | Ir | — | — | — | — | 20 | — | — | — | — | — |
| | | Os | — | — | — | 15 | — | — | — | — | — | — |
| | | PtRh alloy | — | — | — | — | — | 10 | — | — | — | — |
| | | PdRh alloy | — | — | — | — | — | — | — | — | — | 10 |
| | | PtRu alloy | — | — | — | — | — | — | — | 15 | — | — |
| Composition and thickness of ceramic A layer | | YSZ | — | 50 | 50 | — | — | — | — | — | — | — |
| | | $Y_2O_3$—$ZrO_2$ | — | — | — | 60 | — | — | — | — | — | — |
| | | $Y_2O_3$—$CeO_2$ | — | — | — | — | 65 | — | — | — | — | — |
| | | $Y_2O_3$—$TiO_2$ | — | — | — | — | — | 80 | — | — | — | — |
| | | $Y_2O_3$—$CeO_2$ | — | — | — | — | — | — | 70 | — | — | — |
| | | $Y_2O_3$—$Yb_2O_3$ | 50 | — | — | — | — | — | — | 75 | — | — |
| | | $Y_2O_3$—$Er_2O_3$ | — | — | — | — | — | — | — | — | 60 | — |
| | | $Y_2O_3$—$Dy_2O_3$ | — | — | — | — | — | — | — | — | — | 55 |
| | | $Y_2O_3$—$HfO_2$ | — | — | — | — | — | — | — | — | — | — |
| Composition and thickness of ceramic B layer | | $YTaO_4$ | 50 | — | — | — | — | — | — | — | — | — |
| | | $YbTaO_4$ | — | 50 | 50 | — | — | — | — | — | — | — |
| | | $EuTaO_4$ | — | — | — | — | — | — | — | 50 | — | — |
| | | $DyTaO_4$ | — | — | — | — | 60 | — | — | — | — | 60 |
| | | $ErTaO_4$ | — | — | — | — | — | 80 | — | — | — | — |
| | | $NdTaO_4$ | — | — | — | 70 | — | — | — | — | 70 | — |
| | | $GdTaO_4$ | — | — | — | — | — | — | 80 | — | — | — |
| Composition and thickness of seal coating layer | | $Ti_3SiC$ | 5 | — | 6 | — | — | — | — | — | — | — |
| | | BN | — | 5 | — | — | — | — | — | — | — | — |
| | | $NdPO_4$ | — | — | — | 5 | — | — | — | — | — | — |
| | | $EuPO_4$ | — | — | — | — | 8 | — | — | — | — | — |
| | | $GdPO_4$ | — | — | — | — | — | 7 | — | — | — | — |
| | | DyPO4 | — | — | — | — | — | — | 6 | — | — | — |
| | | $ErPO_4$ | — | — | — | — | — | — | — | 5 | — | — |
| | | $YbPO_4$ | — | — | — | — | — | — | — | — | 9 | — |
| | | $YPO_4$ | — | — | — | — | — | — | — | — | — | 10 |
| | | $Ti_3SiC$ and BN | — | — | — | — | — | — | — | — | — | — |
| | | $Ti_3SiC$ and $YPO_4$ | — | — | — | — | — | — | — | — | — | — |
| | | $Ti_3SiC$ and $GdPO_4$ | — | — | — | — | — | — | — | — | — | — |
| | | BN and $NdPO_4$ | — | — | — | — | — | — | — | — | — | — |
| | | BN and $DyPO_4$ | — | — | — | — | — | — | — | — | — | — |
| Composition and thickness of reflecting layer | $Y_2O_3$ | | — | — | — | 10 | — | — | — | — | — | — |
| | $REVO_4$ | $YVO_4$ | 10 | — | — | — | — | — | — | — | — | — |
| | | $NdVO_4$ | — | — | — | — | — | 15 | — | — | — | — |
| | | $EuVO_4$ | — | — | — | — | 10 | — | — | — | — | — |
| | | $GdVO_4$ | — | — | 10 | — | — | — | — | — | — | — |
| | | $DyVO_4$ | — | 10 | — | — | — | — | — | — | — | — |
| | | $ErVO_4$ | — | — | — | — | — | — | — | 15 | — | — |
| | | $YbVO_4$ | — | — | — | — | — | — | 10 | — | — | — |
| | $RETaO_4$ | $NdTaO_4$ | — | — | — | — | — | — | — | — | 10 | — |
| | | $EuTaO_4$ | — | — | — | — | — | — | — | — | — | 15 |
| | | $GdTaO_4$ | — | — | — | — | — | — | — | — | — | — |
| | | $DyTaO_4$ | — | — | — | — | — | — | — | — | — | — |
| | | $ErTaO_4$ | — | — | — | — | — | — | — | — | — | — |
| | | $YbTaO_4$ | — | — | — | — | — | — | — | — | — | — |
| | | $YTaO_4$ | — | — | — | — | — | — | — | — | — | — |
| | $Y_2O_3$ and $DyVO_4$ | | — | — | — | — | — | — | — | — | — | — |
| | $Y_2O_3$ and $EuTaO_4$ | | — | — | — | — | — | — | — | — | — | — |
| | $YVO_4$ and $GdTaO_4$ | | — | — | — | — | — | — | — | — | — | — |
| | $EuVO_4$ and $NdTaO_4$ | | — | — | — | — | — | — | — | — | — | — |
| | $Y_2O_3$, $YVO_4$ and $YTaO_4$ | | — | — | — | — | — | — | — | — | — | — |
| Thickness of catadioptric layer | | Graphene | 13 | 10 | 15 | 15 | 10 | 12 | 15 | 12 | 13 | 10 |
| Composition and thickness of electrically insulating layer | | Polytetrafluoroethylene | — | 15 | — | 18 | — | — | — | — | — | — |
| | | Polyimide | — | — | 20 | — | — | 20 | — | — | — | — |
| | | Polyphenyl ether | 15 | — | — | — | 15 | — | — | — | — | — |
| | | Polyphenylene sulfide | — | — | — | — | — | — | — | 17 | — | — |
| | | Polyether ether ketone | — | — | — | — | — | — | — | — | — | 15 |
| | | Bismaleimide | — | — | — | — | — | — | — | — | — | — |
| | | Furan resin | — | — | — | — | — | — | — | — | — | — |
| | | Cyanate ester resin | — | — | — | — | — | — | 18 | — | — | — |
| | | Polyarylacetylene | — | — | — | — | — | — | — | — | 20 | — |

TABLE 7-2

Composition and thickness of each coating layer in Test Examples
21-20 of an ultralimit zirconium alloy and its preparation method

| | Test Example | 11 | 12 | 13 | 14 | 15 | 16 | 17 | 18 | 19 | 20 |
|---|---|---|---|---|---|---|---|---|---|---|---|
| Composition and thickness of bonding layer | CoCrAlY | 130 | — | — | — | — | 85 | — | — | 120 | — |
| | NiCoCrAlY | — | 120 | 130 | — | 70 | — | — | 110 | — | — |
| | CoNiCrAlY | — | — | — | 125 | — | — | 95 | — | — | 100 |
| Composition and thickness of precious layer | Pt | 15 | — | — | — | — | — | — | — | — | — |
| | Ru | — | 20 | — | — | — | — | — | — | 10 | — |
| | Rh | — | — | 10 | — | — | — | — | — | — | — |
| | Pd | — | — | — | — | — | 10 | — | — | — | — |
| | Ir | — | — | — | — | 10 | — | — | — | — | — |
| | Os | — | — | — | 15 | — | — | — | — | — | — |
| | PtRh alloy | — | — | — | — | — | — | 15 | — | — | — |
| | PdRh alloy | — | — | — | — | — | — | — | — | — | 10 |
| | PtRu alloy | — | — | — | — | — | — | — | 15 | — | — |
| Composition and thickness of ceramic A layer | $Y_2O_3$—$ZrO_2$ | — | — | — | — | 65 | — | — | — | — | — |
| | $Y_2O_3$—$CeO_2$ | — | — | — | — | — | 60 | — | — | — | — |
| | $Y_2O_3$—$TiO_2$ | — | — | — | — | — | — | — | 70 | — | — |
| | $Y_2O_3$—$CeO_2$ | — | — | — | 50 | — | — | 80 | — | — | — |
| | $Y_2O_3$—$Yb_2O_3$ | — | — | — | — | — | — | — | — | 50 | — |
| | $Y_2O_3$—$Er_2O_3$ | — | — | 60 | — | — | — | — | — | — | — |
| | $Y_2O_3$—$Dy_2O_3$ | — | 75 | — | — | — | — | — | — | — | — |
| | $Y_2O_3$—$HfO_2$ | 80 | — | — | — | — | — | — | — | — | 60 |
| Composition and thickness of ceramic B layer | $YTaO_4$ | — | — | 50 | — | — | — | — | — | — | — |
| | $YbTaO_4$ | — | 70 | — | — | — | — | — | — | 60 | — |
| | $EuTaO_4$ | — | — | — | — | — | 55 | — | — | — | — |
| | $DyTaO_4$ | 75 | — | — | — | 65 | — | — | — | — | — |
| | $ErTaO_4$ | — | — | — | — | — | — | — | — | — | 80 |
| | $NdTaO_4$ | — | — | — | 60 | — | — | — | 75 | — | — |
| | $GdTaO_4$ | — | — | — | — | — | — | 65 | — | — | — |
| Composition and thickness of seal coating layer | $Ti_3SiC$ | — | — | — | — | — | — | — | — | — | — |
| | BN | — | — | — | — | — | — | — | — | — | — |
| | $NdPO_4$ | — | — | — | — | — | — | — | — | — | — |
| | $EuPO_4$ | — | — | — | — | — | — | 10 | — | — | — |
| | $GdPO_4$ | — | — | — | — | — | — | — | — | — | — |
| | $DyPO_4$ | — | — | — | — | — | — | — | — | — | — |
| | $ErPO_4$ | — | — | — | — | — | — | — | — | 10 | — |
| | $YbPO_4$ | — | — | — | — | — | — | — | 5 | — | — |
| | $YPO_4$ | — | — | — | — | — | — | — | — | — | 10 |
| | $Ti_3SiC$ and BN | — | 5 | — | — | — | — | — | — | — | — |
| | $Ti_3SiC$ and $YPO_4$ | — | — | — | — | 10 | — | — | — | — | — |
| | $Ti_3SiC$ and $GdPO_4$ | 10 | — | 8 | — | — | — | — | — | — | — |
| | BN and $NdPO_4$ | — | — | — | — | — | 10 | — | — | — | — |
| | BN and $DyPO_4$ | — | — | — | 5 | — | — | — | — | — | — |
| Composition and thickness of reflecting layer | $Y_2O_3$ | — | — | — | — | — | — | — | — | — | — |
| | $REVO_4$ YVO_4 | — | — | — | — | — | — | — | — | — | — |
| | $NdVO_4$ | — | — | — | — | — | — | — | — | — | — |
| | $EuVO_4$ | — | — | — | — | — | — | — | — | — | — |
| | $GdVO_4$ | — | — | — | — | — | — | — | — | — | — |
| | $DyVO_4$ | — | — | — | — | — | — | — | — | — | — |
| | $ErVO_4$ | — | — | — | — | — | — | — | — | — | — |
| | $YbVO_4$ | — | — | — | — | — | — | — | — | — | — |
| | $RETaO_4$ $NdTaO_4$ | — | — | — | — | — | — | — | — | — | — |
| | $EuTaO_4$ | — | — | — | — | — | — | — | — | — | — |
| | $GdTaO_4$ | 15 | — | — | — | — | — | — | — | — | — |
| | $DyTaO_4$ | — | 10 | — | — | — | — | — | — | — | — |
| | $ErTaO_4$ | — | — | 13 | — | — | — | — | — | — | — |
| | $YbTaO_4$ | — | — | — | 12 | — | — | — | — | — | — |
| | $YTaO_4$ | — | — | — | — | 15 | — | — | — | — | — |
| | $Y_2O_3$ and $DyVO_4$ | — | — | — | — | — | 10 | — | — | — | — |
| | $Y_2O_3$ and $EuTaO_4$ | — | — | — | — | — | — | 13 | — | — | — |
| | $YVO_4$ and $GdTaO_4$ | — | — | — | — | — | — | — | 10 | — | — |
| | $EuVO_4$ and $NdTaO_4$ | — | — | — | — | — | — | — | — | 12 | — |
| | $Y_2O_3$, $YVO_4$ and $YTaO_4$ | — | — | — | — | — | — | — | — | — | 13 |
| Thickness of catadioptric layer | Graphene | 15 | 10 | 15 | 12 | 13 | 5 | 13 | 10 | 13 | 10 |
| Composition and thickness of electrically insulating layer | Polytetrafluoroethylene | — | — | — | 18 | — | — | — | — | — | — |
| | Polyimide | — | — | — | — | — | 20 | — | — | — | — |
| | Polyphenyl ether | — | — | — | — | 17 | — | — | — | — | — |
| | Polyphenylene sulfide | — | — | — | — | — | — | — | 18 | — | — |
| | Polyether ether ketone | — | 17 | — | — | — | — | — | — | — | 15 |
| | Bismaleimide | 20 | — | — | — | — | — | — | — | — | — |
| | Furan resin | — | — | 15 | — | — | — | — | — | — | — |
| | Cyanate ester resin | — | — | — | — | — | — | 15 | — | — | — |
| | Polyarylacetylene | — | — | — | — | — | — | — | — | 20 | — |

Take Test Example 1 of Embodiment 7 as an example to illustrate another technical solution of the present disclosure, that is, a method for preparing an ultralimit zirconium alloy. A method for preparing an ultralimit zirconium alloy, including the following operations:

Operation 1: in this test example, Zr-1Nb zirconium alloy serves as the zirconium alloy matrix, and the oil stains and impurities on the surface of zirconium alloy matrix are removed by a soaking method. First, the zirconium alloy matrix is soaked in an alkali solution or an emulsified detergent; the main components of the emulsified detergent are ethanol and surfactant, and the main components of the alkali solution are sodium hydroxide, trisodium phosphate, sodium carbonate and sodium silicate; in this test example, the zirconium alloy matrix is soaked in the alkali solution. The pH value of the alkali solution is adjusted to between 10-11, and then the zirconium alloy matrix is soaked in the alkali solution for 0.5-1.5 h and then taken out. In this test example, the soaking time is 1 hour. Then, the zirconium alloy matrix is rinsed with clean water and dried. The surface of the zirconium alloy matrix is sandblasted by a sand-blasting machine. The sand-blasting machine used is a JCK-SS500-6A automatic transmission sand-blasting machine. The sandblasting material used is 23-mesh quartz sand. The surface roughness of the zirconium alloy matrix after sand blasting is 60-100 μm. In this test example, the surface roughness of the zirconium alloy matrix is 80 μm, which facilitates the bonding of the coating layer to the zirconium alloy matrix.

Operation 2: a bonding layer is deposited on the surface of the sandblasted Zr-1Nb zirconium alloy. First, a layer of CoCrAlY with a thickness of 75 μm is sprayed on the surface of the zirconium alloy matrix as a bonding layer by a high velocity oxygen fuel (HVOF) method. The process parameters of the HVOF method during spraying are as follows: the pressure of oxygen is 0.4 MPa, and the flow rate of oxygen is 250 L/min; the pressure and flow rate of $C_2H_4$ are 0.4 MPa and 55 L/min, respectively; the nozzle of the spray gun has a length of 100 mm, and the spraying distance is 100 mm.

Operation 3: a layer of Pt with a thickness of 10 μm is deposited on the CoCrAlY as a precious metal layer by the HVOF method, and the process parameters of the HVOF method during spraying are the same as those in operation 1.

Operation 4: a layer of $Y_2O_3$—$Yb_2O_3$ with a thickness of 50 μm is sprayed on the surface of the precious metal layer as a ceramic A layer by a plasma-spraying technology. The process parameters of ion spraying technology during spraying are as follows: the flow rate of argon is 40 L/min; the flow rate of hydrogen is 5 L/min, the power is 30 kW, the powder feed rate is 20 g/min, and the spraying distance is 100 mm.

Operation 5: a layer of $YTaO_4$ with a thickness of 50 μm is sprayed on the surface of the ceramic A layer as a ceramic B layer by a plasma-spraying technology. The spraying process parameters are the same as those in operation 4.

Operation 6: a layer of $Ti_3SiC$ with a thickness of 5 μm is sprayed on the surface of the ceramic B layer as a seal coating layer by an electron beam physical vapor deposition (EB-PVD) technology. The parameters of the electron beam physical vapor deposition technology during spraying are as follows: the argon pressure is 0.2 Mpa, the power is 2 kW, and the matrix temperature is 250° C.

Operation 7: a layer of $REVO_4$ reflecting layer with a thickness of 10 μm is sprayed on the seal coating layer by the electron beam physical vapor deposition (EB-PVD) technology, and the spraying process parameters are the same as those in operation 6.

Operation 8: graphene and micron-sized carbon powder material are uniformly mixed with each other, and then the mixed powder is introduced into a solution for ultrasonic vibration mixing. In this test example, the solution is an ethanol solution with 1% dispersant. The micron-sized carbon powder is separated from the mixed solution by a filter paper. The solution mixed with graphene is brushed on the surface of the reflecting layer as a catadioptric layer. Then, the zirconium alloy brushed with the graphene catadioptric layer is placed in a drying oven and dried at 60° C. for 2 hours. The thickness of the brushed catadioptric layer is 13 μm.

Operation 9: the polyphenyl ether is adhered to wool or sponge. In this test example, sponge is used. The sponge adhered with the polyphenyl ether is attached to the catadioptric layer. The sponge is vibrated and rubbed at high speed by a vibrating polishing machine so that the polyphenyl ether is permeated into the surface of the catadioptric layer, to form an electrically insulating layer with a thickness of 15 μm.

Operation 10: the zirconium alloy sprayed with the bonding layer, precious metal layer, ceramic A layer, ceramic B layer, seal coating layer, reflecting layer, catadioptric layer, and electrically insulating layer is subjected to aging treatment for 5-10 h at 50-80° C. In this test example, the temperature is 60° C., and the time is 8 h, so as to release the internal stress of the coating layers to improve the bonding performance of the coating layers, and to finally obtain the ultralimit zirconium alloy. The only difference between Test Examples 2-20 and Test Example 1 is that the parameters as shown in Table 7-1 are different.

Experiments:

9 groups of Comparative Examples are provided to perform comparative experiments with Test Examples 1-20. The parameters of Comparative Examples 1-9 are shown in Table 7-3 (thickness unit: μm):

TABLE 7-3

| Composition and thickness of each coating layer in Comparative Examples 1-9 | | | | | | | | | | |
|---|---|---|---|---|---|---|---|---|---|---|
| Comparative Example | | 1 | 2 | 3 | 4 | 5 | 6 | 7 | 8 | 9 |
| Composition and thickness of bonding layer | CoCrAlY | 35 | — | — | 45 | 35 | — | — | 160 | — |
| | NiCoCrAlY | — | 30 | — | — | — | 40 | — | — | 180 |
| | CoNiCrAlY | — | — | 40 | — | — | — | 170 | — | — |
| Composition and thickness of precious layer | Pt | 8 | — | — | — | — | — | — | — | — |
| | Ru | — | — | — | — | — | — | — | — | 30 |
| | Rh | — | 5 | — | — | — | — | — | — | — |
| | Pd | — | — | 5 | — | — | — | — | — | — |
| | Ir | — | — | — | 25 | — | — | — | — | — |
| | Os | — | — | — | — | 7 | — | — | — | — |

TABLE 7-3-continued

Composition and thickness of each coating layer in Comparative Examples 1-9

| | Comparative Example | 1 | 2 | 3 | 4 | 5 | 6 | 7 | 8 | 9 |
|---|---|---|---|---|---|---|---|---|---|---|
| | PtRh alloy | — | — | — | — | — | 30 | — | — | — |
| | PdRh alloy | — | — | — | — | — | — | 28 | — | — |
| | PtRu alloy | — | — | — | — | — | — | — | 25 | — |
| Composition and thickness of ceramic A layer | YSZ | — | — | 50 | — | — | — | — | — | — |
| | $Y_2O_3$—$ZrO_2$ | — | — | — | 60 | — | — | — | — | — |
| | $Y_2O_3$—$CeO_2$ | — | — | — | — | 65 | — | — | — | — |
| | $Y_2O_3$—$TiO_2$ | — | — | — | — | — | 80 | — | — | — |
| | $Y_2O_3$—$CeO_2$ | — | — | — | — | — | — | 70 | — | — |
| | $Y_2O_3$—$Yb_2O_3$ | — | — | — | — | — | — | — | 75 | — |
| | $Y_2O_3$—$Er_2O_3$ | — | — | — | — | — | — | — | — | 60 |
| Composition and thickness of ceramic B layer | $YTaO_4$ | — | — | — | — | — | — | — | — | 90 |
| | $YbTaO_4$ | — | — | 30 | — | — | — | — | — | — |
| | $EuTaO_4$ | — | — | — | — | — | — | — | 95 | — |
| | $DyTaO_4$ | — | — | — | — | 35 | — | — | — | — |
| | $ErTaO_4$ | — | — | — | — | — | 85 | — | — | — |
| | $NdTaO_4$ | — | — | — | 25 | — | — | — | — | — |
| | $GdTaO_4$ | — | — | — | — | — | — | 85 | — | — |
| Composition and thickness of seal coating layer | $Ti_3SiC$ | 3 | — | 3 | — | — | — | — | — | — |
| | BN | — | 2 | — | — | — | — | — | — | — |
| | $GdPO_4$ | — | — | — | 13 | 15 | — | — | — | — |
| | $YPO_4$ | — | — | — | — | — | 18 | — | — | — |
| | $Ti_3SiC$ and BN | — | — | — | — | — | — | — | — | — |
| | $Ti_3SiC$ and $YPO_4$ | — | — | — | — | — | — | — | — | — |
| | $Ti_3SiC$ and $GdPO_4$ | — | — | — | — | — | — | — | — | — |
| Composition and thickness of reflecting layer | $Y_2O_3$ | 5 | — | — | — | — | — | — | — | — |
| | $REVO_4$  $YVO_4$ | — | 7 | — | — | — | — | — | — | — |
| | $GdVO_4$ | — | — | 5 | — | — | — | — | — | — |
| | $YbTaO_4$ | — | — | — | 25 | — | — | — | — | — |
| | $YTaO_4$ | — | — | — | — | 28 | — | — | — | — |
| | $GdTaO_4$ | — | — | — | — | — | — | — | — | — |
| | $Y_2O_3$ and $YVO_4$ | — | — | — | — | — | 30 | — | — | — |
| | $YVO_4$ and $GdTaO_4$ | — | — | — | — | — | — | 25 | — | — |
| | $Y_2O_3$, $YVO_4$ and $YTaO_4$ | — | — | — | — | — | — | — | 5 | — |
| Thickness of catadioptric layer | Graphene | 8 | 5 | 7 | 8 | 18 | 30 | 2 | 17 | 23 |
| Composition and thickness of electrically insulating layer | Polytetrafluoro ethylene | — | 10 | — | 8 | — | — | — | — | — |
| | Polyimide | — | — | 8 | — | 25 | — | — | — | — |
| | Polyphenyl ether | 10 | — | — | — | 25 | — | — | — | — |
| | Polyphenylene sulfide | — | — | — | — | — | — | — | 10 | — |
| | Polyether ether ketone | — | — | — | — | — | — | — | — | — |
| | Bismaleimide | — | — | — | — | — | — | — | — | — |
| | Furan resin | — | — | — | — | — | — | — | — | — |
| | Cyanate ester resin | — | — | — | — | — | — | 10 | — | — |
| | Polyarylacetyl ene | — | — | — | — | — | — | — | — | 25 |

The only difference between Comparative Examples 1-9 and Test Example 1 is that the parameters as shown in Table 7-3 are different; the Comparative Example 10 is Zr-1Nb zirconium alloy.

The following experiments are performed using the zirconium alloys provided in Test Examples 1-20 and Comparative Examples 1-10:

High Temperature Creep Test:

The zirconium alloys provided in Test Examples 1-20 and Comparative Examples 1-10 are processed into columnar test pieces with a length of 187 mm and a diameter of 16 mm. The high temperature creep test is carried out with an electronic high temperature creep rupture strength test machine (model: RMT-D5).

Figure 5:
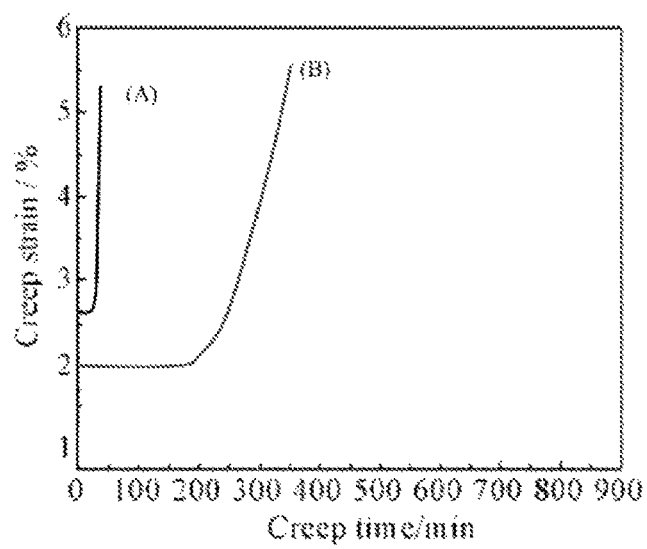
FIG. 5 shows high temperature creep test curves of Test Example 1 and Comparative Example 10 at 50 MPa and 2000° C. according to Embodiment 7 (ultralimit zirconium alloy) of the present disclosure.

The test pieces of Test Examples 1-20 and Comparative Examples 1-10 are placed into the electronic high temperature creep rupture strength test machine, and the test machine is started to heat up the test machine. During the heating process, the test pieces are in a stress-free state (in a stress-free state, the test pieces can expand freely; the high-temperature creep is that the deformation increases with time under the combined action of temperature and stress, therefore, the heating rate has no influence on the creep). When the temperature of the test machine reaches 2000° C., the stress of the test machine is adjusted to 50 MPa, and the high temperature creep test is carried out. Take Test Example 1 and Comparative Example 10 as examples, the experimental results are shown in FIG. 5 (in FIG. 5, (A) represents Comparative Example 10, and (B) represents Test Example 1). The specific experimental results of Test Examples 1-20 and Comparative Examples 1-10 are shown in Table 7-4.

It can be observed from FIG. 5 that there are three stages of creep in both test pieces (A) and (B). However, when the temperature exceeds the melting point of ZR-1NB zirconium alloy, the creep rupture of test piece (A) occurs within a very short period of time. Therefore, it can be concluded that ZR-1NB zirconium alloy can hardly carry loads at a temperature higher than its melting point. Compared with test piece (A), the creep resistance of test piece (B) is significantly improved. The steady-state creep time of the test piece (B) is longer. It can be observed that after a long steady-state creep stage, the creep curve enters an accelerated creep stage, and the creep rupture occurs. Therefore, it can be concluded that, compared with the original ZR-1NB zirconium alloy, the ultralimit zirconium alloy provided by the present disclosure maintains good mechanical properties without rupturing at a temperature exceeding the melting point of ZR-1NB zirconium alloy, and has excellent high-temperature resistance.

Figure 6:
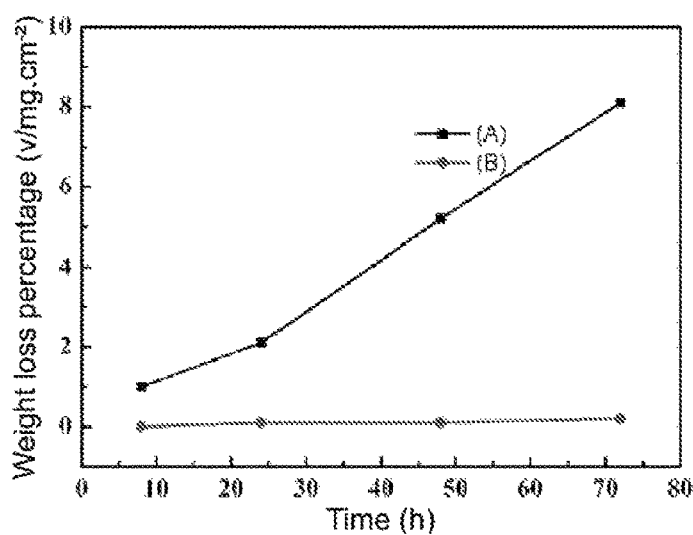
FIG. 6 shows experimental curves of the salt-spray corrosion test of Test Example 1 and Comparative Example 10 according to Embodiment 7 (ultralimit zirconium alloy) of the present disclosure.

Salt-Spray Corrosion Test:

The zirconium alloys provided in Test Examples 1-20 and Comparative Examples 1-10 are processed into test pieces of 50 mm×25 mm×2 mm, and then subjected to degreasing, rust removal, cleaning and drying. YWX/Q-250B salt-spray corrosion tester serves as the test equipment, and an atmospheric corrosive environment of GB/T2967.3-2008 is simulated. The test pieces provided by Test Examples 1-20 and Comparative Examples 1-10 are hung in the test equipment, the test equipment is adjusted to a temperature of 50±1° C. and pH of 3.0-3.1, and then the test pieces are continuously sprayed with NaCl solution with a concentration of 5±0.5%. Taking Test Example 1 and Comparative Example 10 as examples, after continuously spraying a 5±0.5% NaCl solution on the test pieces for 8 h, 24 h, 48 h and 72 h, the weight loss of the test pieces is shown in FIG. 6 (in FIG. 6, (A) represents Comparative Example 10, and (B) represents Test Example 1). The specific experimental results of Test Examples 1-20 and Comparative Examples 1-10 are shown in Table 7-4.

It can be concluded from FIG. 6 that test pieces (A) and (B) have obviously different corrosion patterns. For test piece (A), the corrosion weight loss value tends to increase as the corrosion time extends. In the early stage of corrosion (8-24 h), there is an oxidation film on the surface of the test piece, which prevents the zirconium alloy matrix from contacting the solution; the corrosion rate is low. In the middle stage of corrosion (24-48 h), the Cl⁻ in the solution has penetrated the oxidation film, and a large amount of Cl⁻ is adsorbed on the matrix, which increases the corrosion pit points and deepens the original corrosion pit points; the corrosion rate is obviously accelerated. After 48 hours of continuous spraying, the corrosion products are evenly distributed and the thickness increases, covering almost the entire surface of the test piece. Cl⁻ needs to pass through the corrosion products to contact the zirconium alloy matrix, which reduces the amount of Cl⁻ adsorbed on the matrix surface and reduces the corrosion rate. In general, the corrosion loss weight of test piece (A) is much higher than that of test piece (B). Basically, the test piece (B) has no corrosion due to the existence of the coating layers, and the mass of the test piece (B) has hardly changed. Therefore, the ultralimit zirconium alloy provided by the present disclosure has good corrosion resistance.

The experimental results are shown in Table 7-4: (A. the steady creep time of the test pieces under 50 Mpa and 2000° C. (min); B. the time when creep rupture of the test pieces happens under 50 Mpa and 2000° C. (min); C. the weight loss (v/mg·cm²) of the test pieces after continuously spraying NaCl solution on the test pieces for 8 hours; D. the weight loss (v/mg·cm²) of the test pieces after continuously spraying NaCl solution on the test pieces for 24 hours; E. the weight loss (v/mg·cm²) of the test pieces after continuously spraying NaCl solution on the test pieces for 48 hours; F. the weight loss (v/mg·cm²) of the test pieces after continuously spraying NaCl solution on the test pieces for 72 hours)

TABLE 7-4

Experimental results of high temperature creep test and salt-spray test

|  | A | B | C | D | E | F |
|---|---|---|---|---|---|---|
| Test Example 1 | 170 | 360 | 0 | 0.05 | 0.06 | 0.1 |
| Test Example 2 | 165 | 355 | 0 | 0.06 | 0.08 | 0.11 |
| Test Example 3 | 150 | 350 | 0 | 0.06 | 0.08 | 0.11 |
| Test Example 4 | 160 | 355 | 0 | 0.07 | 0.09 | 0.11 |
| Test Example 5 | 145 | 345 | 0 | 0.06 | 0.09 | 0.12 |
| Test Example 6 | 140 | 330 | 0.002 | 0.06 | 0.08 | 0.1 |
| Test Example 7 | 165 | 345 | 0 | 0.07 | 0.09 | 0.11 |
| Test Example 8 | 165 | 345 | 0 | 0.06 | 0.09 | 0.13 |
| Test Example 9 | 160 | 350 | 0.001 | 0.07 | 0.08 | 0.13 |
| Test Example 10 | 160 | 355 | 0.002 | 0.08 | 0.08 | 0.12 |
| Test Example 11 | 165 | 355 | 0.001 | 0.08 | 0.09 | 0.12 |
| Test Example 12 | 145 | 345 | 0 | 0.07 | 0.09 | 0.11 |
| Test Example 13 | 155 | 350 | 0 | 0.06 | 0.08 | 0.12 |
| Test Example 14 | 150 | 350 | 0 | 0.07 | 0.09 | 0.12 |
| Test Example 15 | 160 | 340 | 0 | 0.07 | 0.08 | 0.12 |
| Test Example 16 | 160 | 340 | 0 | 0.07 | 0.09 | 0.13 |
| Test Example 17 | 165 | 340 | 0 | 0.08 | 0.08 | 0.13 |
| Test Example 18 | 165 | 350 | 0 | 0.07 | 0.09 | 0.12 |
| Test Example 19 | 150 | 345 | 0 | 0.07 | 0.09 | 0.13 |
| Test Example 20 | 155 | 345 | 0 | 0.07 | 0.08 | 0.13 |
| Comparative Example 1 | 120 | 305 | 0.01 | 0.15 | 0.25 | 0.28 |
| Comparative Example 2 | 120 | 315 | 0.01 | 0.15 | 0.24 | 0.31 |
| Comparative Example 3 | 135 | 325 | 0.002 | 0.08 | 0.19 | 0.28 |
| Comparative Example 4 | 135 | 320 | 0.003 | 0.12 | 0.2 | 0.26 |
| Comparative Example 5 | 140 | 320 | 0.003 | 0.11 | 0.22 | 0.27 |
| Comparative Example 6 | 145 | 325 | 0.002 | 0.11 | 0.2 | 0.26 |
| Comparative Example 7 | 130 | 315 | 0.005 | 0.13 | 0.21 | 0.25 |
| Comparative Example 8 | 130 | 315 | 0.005 | 0.14 | 0.18 | 0.25 |
| Comparative Example 9 | 125 | 310 | 0.006 | 0.15 | 0.18 | 0.27 |
| Comparative Example 10 | 20 | 50 | 1 | 2.1 | 5.50 | 8.1 |

In summary, the ultralimit zirconium alloy prepared by the ultralimit zirconium alloy preparation method of the present disclosure has a wide service temperature range and strong corrosion resistance; the effects of Test Example 1 are the best. Compared with the ultralimit zirconium alloy provided by the present disclosure, the zirconium alloy with parameters beyond the range provided in the test examples of the present embodiment has a much lower maximum service temperature and poorer corrosion resistance.

Embodiment 8 (Ultralimit Tin Alloy)

In this embodiment, the ultralimit alloy is an ultralimit tin alloy, that is, the alloy matrix is a tin alloy matrix.

Figure 7:
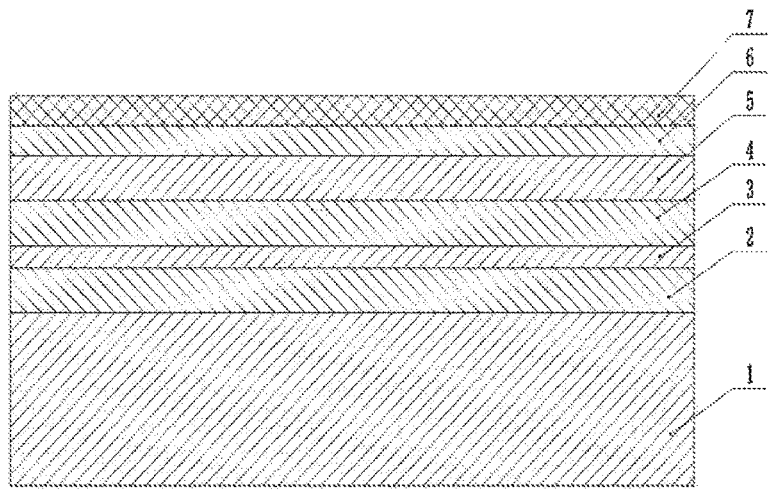
FIG. 7 is a schematic diagram of the ultralimit tin alloy weld material according to Embodiment 8 of the present disclosure.

The reference signs in FIG. 7 include: tin alloy matrix 1, bonding layer 2, ceramic layer 3, seal coating layer 4, reflecting layer 5, catadioptric layer 6, insulating layer 7, welding parent material 8, and weld 9.

As shown in FIG. 7, the present disclosure provides an ultralimit tin alloy, including an tin alloy matrix 1. The surface of the tin alloy matrix 1 is successively deposited with a bonding layer 2 with a thickness of 50-180 μm, a ceramic layer 3 with a thickness of 50-80 μm, a seal coating layer 4 with a thickness of 5-15 μm, a reflecting layer 5 with a thickness of 5-15 μm, a catadioptric layer 6 with a thickness of 5-15 μm, and an insulating layer 7 with a thickness of 10-25 μm.

The composition of the bonding layer 2 is one of or an alloy of more of platinum (Pt), palladium (Pd), rhodium (Rh), ruthenium (Ru), iridium (Ir), and osmium (Os). The composition of the ceramic layer 3 is RETaO₄ (RE=Nd, Eu, Gd, Dy, Er, Y or Yb). The composition of the seal coating layer 4 is one or more of Ti₃SiC, REPO₄ (RE=Nd, Eu, Gd, Dy, Er, Y or Yb) and boron nitride (BN). The composition of the reflecting layer 5 is one or more of REVO₄, RETaO₄ and Y₂O₃, and RE=Nd, Eu, Gd, Dy, Er, Y or Yb. The catadioptric layer 6 is one or two of graphene and boron carbide, and the spatial distribution of the graphene and boron carbide are in a disorderly arranged state. The insulating layer 7 is an organic coating layer including one or more of polytetrafluoroethylene, polyimide (PI), polyphenyl ether (PPO/PPE), polyphenylene sulfide (PPS), polyether ether ketone (PEEK), bismaleimide (BMI), furan resin, cyanate ester (CE) resin and polyarylacetylene (PAA).

RETaO$_4$ powder is prepared by the following method, including the following operations:

Operation (1): pre-drying rare earth oxide (RE$_2$O$_3$) powder and tantalum pentoxide (Ta$_2$O$_5$) powder, the pre-drying temperature is 600° C., and the pre-drying time is 8 hours; weighing the pre-dried rare earth oxide powder (RE$_2$O$_3$) and tantalum oxide (Ta$_2$O$_5$) powder according to the molar ratio of RETaO$_4$; adding the pre-dried powders into the ethanol solvent to obtain a mixed solution, so that the molar ratio of RE:Ta in the mixed solution is 1:1; ball-milling the mixed solution using a ball mill for 10 hours, and the speed of the ball mill is 300 r/min;

drying the slurry obtained after ball milling using a rotary evaporator (model: N-1200B), the drying temperature is 60° C., and the drying time is 2 hours; sieving the dried powder through a 300-mesh sieve to obtain powder A;

Operation (2): preparing powder B with a composition of RETaO$_4$ from the powder A obtained in operation (1) by a high-temperature solid-phase reaction method, the reaction temperature is 1700° C. and the reaction time is 10 hours; sieving the powder B with a 300-mesh sieve;

Operation (3): mixing the powder B sieved in operation (2) with deionized water solvent and an organic bonding agent to obtain slurry C, the mass percentage of powder B in slurry C is 25%, the mass percentage of organic bonding agent in slurry C is 2%, and the rest is the solvent; the organic bonding agent is polyvinyl alcohol or gum arabic; drying the slurry C by a high-temperature spray pyrolysis method to obtain dried granules D, the temperature during drying is 1000° C., and the drying time is 60 min;

Operation (4): sintering the granules D obtained in operation (3) at 1200° C. for 8 hours, sieving the sintered granules D with a 300-mesh sieve to obtain RETaO$_4$ ceramic powder having a particle size of 10-50 μm and a spherical morphology.

The present disclosure uses RETaO$_4$ as the ceramic B layer, which has the effects of low thermal conductivity and high expansion rate, and can reduce heat conduction; The RETaO$_4$ prepared by the above method can meet the requirements of APS spraying technology on particle size and shape of the powder.

Based on extensive experiments, the inventors obtain ultralimit tin alloy weld materials with the largest increase in service temperature, small increase in weight of the ultralimit tin alloy weld material and the best composition and thickness of the coating layers within the parameter scope of the present disclosure. In the present disclosure, 20 of them are listed for description.

The parameters of Test Examples 1-20 of an ultralimit tin alloy and its preparation method according to the present disclosure are shown in Table 8-1 and Table 8-2 (thickness unit: μm):

TABLE 8-1

Composition and thickness of each coating layer in Test Examples 1-10 of an ultralimit tin alloy and its preparation method

| | Test Example | 1 | 2 | 3 | 4 | 5 | 6 | 7 | 8 | 9 | 10 |
|---|---|---|---|---|---|---|---|---|---|---|---|
| Composition and thickness of bonding layer | PtRh alloy | 75 | — | — | — | — | — | — | — | — | — |
| | PdRh alloy | — | 110 | — | — | — | — | — | — | 60 | — |
| | PtRu alloy | — | — | 125 | — | — | — | — | — | — | — |
| | Pd | — | — | — | — | — | 150 | — | — | — | — |
| Composition and thickness of ceramic layer | Ir | — | — | — | — | 165 | — | — | — | — | — |
| | Os | — | — | — | 170 | — | — | — | — | — | — |
| | Ru | — | — | — | — | — | — | 175 | — | — | — |
| | Rh | — | — | — | — | — | — | — | — | — | 50 |
| | Pt | — | — | — | — | — | — | — | 180 | — | — |
| | YTaO$_4$ | 50 | — | — | — | — | — | — | 50 | — | — |
| | YbTaO$_4$ | — | 50 | — | — | — | — | — | — | — | — |
| | EuTaO$_4$ | — | — | 50 | — | — | — | — | — | — | — |
| | DyTaO$_4$ | — | — | — | — | — | 60 | — | — | — | 60 |
| | ErTaO$_4$ | — | — | — | — | — | — | 80 | — | — | — |
| | NdTaO$_4$ | — | — | — | 70 | — | — | — | — | 70 | — |
| | GdTaO$_4$ | — | — | — | — | — | — | — | 80 | — | — |
| Composition and thickness of seal coating layer | Ti$_3$SiC | — | — | 10 | — | — | — | — | — | — | — |
| | BN | — | 15 | — | — | — | — | — | — | — | — |
| | NdPO$_4$ | 10 | — | — | — | — | — | — | — | — | — |
| | EuPO$_4$ | — | — | — | — | — | — | — | 15 | — | — |
| | GdPO$_4$ | — | — | — | — | — | — | — | — | — | — |
| | DyPO$_4$ | — | — | — | — | — | — | — | — | — | — |
| | ErPO$_4$ | — | — | — | — | — | — | — | — | 10 | — |
| | YbPO$_4$ | — | — | — | — | — | — | — | 5 | — | — |
| | YPO$_4$ | — | — | — | — | — | — | — | — | — | 15 |
| | Ti$_3$SiC and BN | — | — | — | — | — | — | — | — | — | — |
| | Ti$_3$SiC and YPO$_4$ | — | — | — | — | 10 | — | — | — | — | — |
| | Ti$_3$SiC and GdPO$_4$ | — | — | — | — | — | — | — | — | — | — |
| | BN and NdPO$_4$ | — | — | — | — | — | 15 | — | — | — | — |
| | BN and DyPO$_4$ | — | — | — | 5 | — | — | — | — | — | — |
| Thickness of reflecting layer | Y$_2$O$_3$ | — | — | — | 10 | — | — | — | — | — | — |
| | REVO$_4$ YVO$_4$ | 10 | — | — | — | — | — | — | — | — | — |
| | NdVO$_4$ | — | — | — | — | — | — | — | — | — | 10 |
| | EuVO$_4$ | — | — | — | — | 10 | — | — | — | — | — |
| | GdVO$_4$ | — | — | 10 | — | — | — | — | — | — | — |
| | DyVO$_4$ | — | 15 | — | — | — | — | — | — | — | — |

TABLE 8-1-continued

Composition and thickness of each coating layer in Test Examples 1-10 of an ultralimit tin alloy and its preparation method

| | Test Example | | 1 | 2 | 3 | 4 | 5 | 6 | 7 | 8 | 9 | 10 |
|---|---|---|---|---|---|---|---|---|---|---|---|---|
| | RETaO$_4$ | ErVO$_4$ | — | — | — | — | — | — | — | — | — | — |
| | | YbVO$_4$ | — | — | — | — | — | — | 10 | — | — | — |
| | | NdTaO$_4$ | — | — | — | — | — | — | — | — | — | — |
| | | EuTaO$_4$ | — | — | — | — | — | — | — | — | — | — |
| | | GdTaO$_4$ | — | — | — | — | — | — | — | — | — | — |
| | | DyTaO$_4$ | — | — | — | — | — | 5 | — | — | — | — |
| | | ErTaO$_4$ | — | — | — | — | — | — | — | 10 | — | — |
| | | YbTaO$_4$ | — | — | — | — | — | — | — | — | — | — |
| | | YTaO$_4$ | — | — | — | — | — | — | — | — | 15 | — |
| | Y$_2$O$_3$ and DyVO$_4$ | | — | — | — | — | — | — | — | — | — | — |
| | Y$_2$O$_3$ and EuTaO$_4$ | | — | — | — | — | — | — | — | — | — | — |
| | YVO$_4$ and GdTaO$_4$ | | — | — | — | — | — | — | — | — | — | — |
| | EuVO$_4$ and NdTaO$_4$ | | — | — | — | — | — | — | — | — | — | — |
| | Y$_2$O$_3$, YVO$_4$ and YTaO$_4$ | | — | — | — | — | — | — | — | — | — | — |
| Composition and thickness of catadioptric layer | Graphene | | 15 | 10 | 15 | 5 | 10 | — | — | — | — | — |
| | Boron carbide | | — | — | — | — | — | 5 | 15 | 15 | 15 | 10 |
| Composition and thickness of insulating layer | Polytetrafluoroethylene | | — | — | — | 10 | — | — | — | — | — | — |
| | Polyimide | | — | — | — | — | — | 20 | — | — | — | — |
| | Polyphenyl ether | | — | — | — | — | 15 | — | — | — | — | — |
| | Polyphenylene sulfide | | — | — | — | — | — | — | — | 12 | — | — |
| | Polyether ether ketone | | — | 12 | — | — | — | — | — | — | — | 15 |
| | Bismaleimide | | 22 | — | — | — | — | — | — | — | — | — |
| | Furan resin | | — | — | 23 | — | — | — | — | — | — | — |
| | Cyanate ester resin | | — | — | — | — | — | — | 10 | — | — | — |
| | Polyarylacetylene | | — | — | — | — | — | — | — | — | 25 | — |

TABLE 8-2

Composition and thickness of each coating layer in Test Examples 11-20 of an ultralimit tin alloy and its preparation method

| | Test Example | | 11 | 12 | 13 | 14 | 15 | 16 | 17 | 18 | 19 | 20 |
|---|---|---|---|---|---|---|---|---|---|---|---|---|
| Composition and thickness of bonding layer | PtRh alloy | | 75 | — | — | — | — | — | — | — | — | — |
| | PdRh alloy | | — | 110 | — | — | — | — | — | — | 60 | — |
| | PtRu alloy | | — | — | 125 | — | — | — | — | — | — | — |
| | Pd | | — | — | — | — | — | 150 | — | — | — | — |
| | Ir | | — | — | — | — | 165 | — | — | — | — | — |
| | Os | | — | — | — | 170 | — | — | — | — | — | — |
| | Ru | | — | — | — | — | — | — | 175 | — | — | — |
| | Rh | | — | — | — | — | — | — | — | — | — | 50 |
| | Pt | | — | — | — | — | — | — | — | 180 | — | — |
| Composition and thickness of ceramic layer | YTaO$_4$ | | 50 | — | — | — | — | — | — | 50 | — | — |
| | YbTaO$_4$ | | — | 50 | — | — | — | — | — | — | — | — |
| | EuTaO$_4$ | | — | — | 50 | — | — | — | — | — | — | — |
| | DyTaO$_4$ | | — | — | — | — | 60 | — | — | — | — | 60 |
| | ErTaO$_4$ | | — | — | — | — | — | 80 | — | — | — | — |
| | NdTaO$_4$ | | — | — | — | 70 | — | — | — | — | 70 | — |
| | GdTaO$_4$ | | — | — | — | — | — | — | 80 | — | — | — |
| Composition and thickness of seal coating layer | Ti$_3$SiC | | — | — | — | — | — | — | — | — | — | — |
| | BN | | — | — | — | — | — | — | — | — | — | — |
| | NdPO$_4$ | | — | — | — | — | — | — | — | — | — | — |
| | EuPO$_4$ | | — | — | — | — | — | — | 15 | — | — | — |
| | GdPO$_4$ | | 10 | — | — | — | — | — | — | — | — | — |
| | DyPO$_4$ | | — | 15 | — | — | — | — | — | — | — | — |
| | ErPO$_4$ | | — | — | — | — | — | — | — | 10 | — | — |
| | YbPO$_4$ | | — | — | — | 5 | — | — | — | — | — | — |
| | YPO$_4$ | | — | — | — | — | — | — | — | — | 15 | — |
| | Ti$_3$SiC and BN | | — | — | 10 | — | — | — | — | — | — | — |
| | Ti$_3$SiC and YPO$_4$ | | — | — | — | — | 10 | — | — | — | — | — |
| | Ti$_3$SiC and GdPO$_4$ | | — | — | — | — | — | — | — | 10 | — | — |
| | BN and NdPO$_4$ | | — | — | — | — | — | 15 | — | — | — | — |
| | BN and DyPO$_4$ | | — | — | — | 5 | — | — | — | — | — | — |
| Composition and thickness of reflecting layer | Y$_2$O$_3$ | | — | — | — | 10 | — | — | — | — | — | — |
| | REVO$_4$ | YVO$_4$ | — | — | — | — | — | — | — | — | — | — |
| | | NdVO$_4$ | — | — | — | — | — | — | — | — | — | — |
| | | EuVO$_4$ | — | — | — | — | — | — | — | — | — | — |
| | | GdVO$_4$ | — | — | — | — | — | — | — | — | — | — |
| | | DyVO$_4$ | — | — | — | — | — | — | — | — | — | — |
| | | ErVO$_4$ | 10 | — | — | — | — | — | — | — | — | — |
| | | YbVO$_4$ | — | — | — | — | — | — | — | — | — | — |

TABLE 8-2-continued

Composition and thickness of each coating layer in Test Examples 11-20 of an ultralimit tin alloy and its preparation method

| Test Example | | 11 | 12 | 13 | 14 | 15 | 16 | 17 | 18 | 19 | 20 |
|---|---|---|---|---|---|---|---|---|---|---|---|
| | RETaO$_4$  NdTaO$_4$ | — | 15 | — | — | — | — | — | — | — | — |
| | EuTaO$_4$ | — | — | — | — | 10 | — | — | — | — | — |
| | GdTaO$_4$ | — | — | — | 10 | — | — | — | — | — | — |
| | DyTaO$_4$ | — | — | — | — | — | — | — | — | — | — |
| | ErTaO$_4$ | — | — | — | — | — | — | — | — | — | — |
| | YbTaO$_4$ | — | — | — | — | — | — | — | — | 10 | — |
| | YTaO$_4$ | — | — | — | — | — | — | — | — | — | — |
| | Y$_2$O$_3$ and DyVO$_4$ | — | — | 5 | — | — | — | — | — | — | — |
| | Y$_2$O$_3$ and EuTaO$_4$ | — | — | — | — | — | 12 | — | — | — | — |
| | YVO$_4$ and GdTaO$_4$ | — | — | — | — | — | — | 10 | — | — | — |
| | EuVO$_4$ and NdTaO$_4$ | — | — | — | — | — | — | — | 10 | — | — |
| | Y$_2$O$_3$, YVO$_4$ and YTaO$_4$ | — | — | — | — | — | — | — | — | — | 15 |
| Composition and thickness of catadioptric layer | Graphene | 15 | 10 | 15 | 5 | 10 | — | — | — | — | — |
| | Boron carbide | — | — | — | — | — | 5 | 15 | 15 | 15 | 10 |
| Composition and thickness of insulating layer | Polytetrafluoroethylene | — | — | — | 10 | — | — | — | — | — | — |
| | Polyimide | — | — | — | — | — | 20 | — | — | — | — |
| | Polyphenyl ether | — | — | — | — | 15 | — | — | — | — | — |
| | Polyphenylene sulfide | — | — | — | — | — | — | — | 12 | — | — |
| | Polyether ether ketone | — | 12 | — | — | — | — | — | — | — | 15 |
| | Bismaleimide | 22 | — | — | — | — | — | — | — | — | — |
| | Furan resin | — | — | 23 | — | — | — | — | — | — | — |
| | Cyanate ester resin | — | — | — | — | — | — | 10 | — | — | — |
| | Polyarylacetylene and | — | — | — | — | — | — | — | — | 25 | — |

Take Test Example 1 of Embodiment 8 as an example to illustrate another technical solution of the present disclosure, that is, a method for preparing an ultralimit tin alloy. A method for preparing an ultralimit tin alloy, including the following operations:

Operation 1: a tin alloy matrix is prepared. Two pieces of Q235 steel plate are selected as the welding parent materials. An S221 tin alloy welding wire is selected to weld the two parent material, and the diameter of the welding wire is 2.5 mm. The welding equipments are MZ-1000 automatic submerged-arc welding machine and MZ-1000 time submerged-arc welding power source. The parameters of the welding process are as follows: the voltage is 30V, the current is 530-570A, and the welding speed is 55 m/h. The tin alloy matrix is prepared by using the welding equipments.

Operation 2: the surface of the tin alloy matrix obtained in operation 1 is sandblasted by a sand-blasting machine. The sand-blasting machine used is a JCK-SS500-6A automatic transmission sand-blasting machine. The sandblasting material used is 15-20 mesh quartz sand. In this test example, the quartz sand is 20-mesh. After sandblasting, the dust on the surface of the tin alloy matrix is removed by an air compressor.

Operation 3: a Pt—Rh bonding layer is sprayed on a surface of the tin alloy matrix subjected to the surface treatment in operation 2 by a high velocity oxygen fuel (HVOF) method, and the thickness of the bonding layer is 75 μm. The process parameters of the high velocity oxygen fuel method are as follows: the pressure and flow rate of oxygen are 0.4 MPa and 250 L/min, respectively; the pressure and flow rate of C$_2$H$_4$ are 0.4 MPa and 55 L/min, respectively; the nozzle of the spray gun has a length of 100 mm, and the spraying distance is 100 mm.

Operation 4: a layer of ceramic layer with a composition of YTaO$_4$ is prepared on the surface of the Pt—Rh bonding layer obtained in operation 3 by an air plasma-spraying technology. The thickness of the YTaO$_4$ ceramic layer is 50 μm. The process parameters of the air plasma-spraying technology are as follows: the flow rate of argon is 40 L/min; the flow rate of hydrogen is 5 L/min, the power is 30 kW, the powder feed rate is 20 g/min, and the spraying distance is 100 mm.

Operation 5: a layer of seal coating layer with a composition of NdPO$_4$ is prepared on the surface of the YTaO$_4$ ceramic layer obtained in operation 4 by the electron beam physical vapor deposition (EB-PVD) technology. The thickness of the NdPO$_4$ seal coating layer is 10 μm. The process parameters of the electron beam physical vapor deposition technology are as follows: the argon pressure is 0.22 Mpa, the power is 2 kW, and the matrix temperature is 400° C.

Operation 6: a reflecting layer with a composition of YVO$_4$ is prepared on the surface of the NdPO$_4$ seal coating layer obtained in operation 5 by the electron beam physical vapor deposition (EB-PVD) technology. The thickness of the YVO$_4$ reflecting layer is 10 μm. The process parameters of the electron beam physical vapor deposition technology are as follows: the argon pressure is 0.22 Mpa, the power is 2 kW, and the matrix temperature is 400° C.

Operation 7: a layer of graphene catadioptric layer is prepared on the surface of the YVO$_4$ reflecting layer obtained in operation 6 by a brushing method, and the thickness of the graphene catadioptric layer is 15 μm. Graphene has a high specific surface area and is extremely difficult to be dissolved in solution. Therefore, ultrasonic dispersion and solid-liquid separation of graphene are required before coating. That is, first, graphene and micron-sized carbon powder material are uniformly mixed with each other, and then the mixed powder is introduced into a solution for ultrasonic vibration mixing. In this test example, the solution is an ethanol solution with 1% dispersant. The micron-sized carbon powder is separated from the mixed solution by a filter paper. The solution mixed with graphene is coated on the surface of the reflecting layer. Then, the tin alloy weld material coated with the graphene catadioptric layer is placed in a drying oven and dried at 60° C. for 2 hours.

In addition, after the graphene is ultrasonically dispersed, the spatial distribution of the graphene is rearranged in all directions, so that the spatial distribution of the graphene is in a disorderly arranged state. In this way, even though graphene has a high refractive index, when the incident light is irradiated on the graphene catadioptric layer, the disorderly arranged graphene can enhance the refraction of the light in all directions, so as to avoid the incident light from being refracted in the same direction and achieve the effect of dispersed refraction. In this way, the intensity of incident light entering into the coating layers can be reduced.

the graphene coating layer utilizing the unique permeability and adhesion of the graphene coating layer.

Operation 9: the tin alloy weld material prepared by operations 1-8 is allowed to stand for 5-10 hours at 50-80° C. for the aging treatment. In this test example, the aging temperature is 60° C., and the aging time is 8 hours.

The only difference between the preparation methods of Test Examples 2-20 and that of Test Example 1 is that the parameters as shown in Table 8-1 are different.

11 groups of Comparative Examples are provided to perform comparative experiments with Test Examples 1-20, as shown in Table 8-3 (thickness unit: μm):

TABLE 8-3

Composition and thickness of each coating layer in Comparative Examples 1-10

| Comparative Example | | 1 | 2 | 3 | 4 | 5 | 6 | 7 | 8 | 9 | 10 |
|---|---|---|---|---|---|---|---|---|---|---|---|
| Composition and thickness of bonding layer | PtRh alloy | 20 | — | — | — | — | — | — | — | — | — |
| | PdRh alloy | — | 25 | — | — | — | — | — | — | 190 | — |
| | PtRu alloy | — | — | 30 | — | — | — | — | — | — | — |
| | Pd | — | — | — | — | — | 190 | — | — | — | — |
| | Ir | — | — | — | — | 40 | — | — | — | — | — |
| | Os | — | — | — | 185 | — | — | — | — | — | — |
| | Ru | — | — | — | — | — | — | 188 | — | — | — |
| | Rh | — | — | — | — | — | — | — | — | — | 195 |
| | Pt | — | — | — | — | — | — | — | 45 | — | — |
| Composition and thickness of ceramic layer | $YTaO_4$ | 20 | — | — | — | — | — | — | 10 | — | — |
| | $YbTaO_4$ | — | 20 | — | — | — | — | — | — | — | — |
| | $EuTaO_4$ | — | — | 30 | — | — | — | — | — | — | — |
| | $DyTaO_4$ | — | — | — | — | 35 | — | — | — | — | 10 |
| | $ErTaO_4$ | — | — | — | — | — | 95 | — | — | — | — |
| | $NdTaO_4$ | — | — | — | 100 | — | — | — | — | 15 | — |
| | $GdTaO_4$ | — | — | — | — | — | — | 95 | — | — | — |
| Composition and thickness of seal coating layer | $Ti_3SiC$ | — | — | 3 | — | — | — | — | — | — | — |
| | BN | — | 1 | — | — | — | — | — | — | — | — |
| | $NdPO_4$ | 2 | — | — | — | — | — | — | — | — | — |
| | $EuPO_4$ | — | — | — | — | 25 | — | 2 | — | — | — |
| | $ErPO_4$ | — | — | — | — | — | — | — | — | 1 | — |
| | $YbPO_4$ | — | — | — | — | — | — | — | 22 | — | — |
| | $YPO_4$ | — | — | — | — | — | — | — | — | — | 1 |
| | $Ti_3SiC$ and BN | — | — | — | — | — | 30 | — | — | — | — |
| Composition and thickness of reflecting layer | $Y_2O_3$ | — | — | — | 1 | — | — | — | — | — | — |
| | $REVO_4$ $YVO_4$ | 2 | — | — | — | — | — | — | — | — | — |
| | $EuVO_4$ | — | — | — | — | 3 | — | — | — | — | — |
| | $ErVO_4$ | — | — | 28 | — | — | — | — | — | — | — |
| | $YbVO_4$ | — | — | — | — | — | — | 30 | — | — | — |
| | $RETaO_4$ $NdTaO_4$ | — | 25 | — | — | — | — | — | — | — | — |
| | $DyTaO_4$ | — | — | — | — | — | 2 | — | — | — | — |
| | $ErTaO_4$ | — | — | — | — | — | — | — | 10 | — | — |
| | $YTaO_4$ | — | — | — | — | — | — | — | — | 15 | — |
| | $Y_2O_3$ and $EuTaO_4$ | — | — | — | — | — | — | — | — | — | 1 |
| Composition and thickness of catadioptric layer | Graphene | 2 | 2 | 3 | 20 | 4 | — | — | — | — | — |
| | Boron carbide | — | — | — | — | — | 3 | 3 | 2 | 25 | 2 |
| Composition and thickness of insulating layer | Polytetrafluoroethylene | — | — | — | 6 | — | — | — | — | — | — |
| | Polyimide | — | — | — | — | — | 35 | — | — | — | — |
| | Polyphenyl ether | — | — | — | — | 30 | — | — | — | — | — |
| | Polyphenylene sulfide | — | — | — | — | — | — | — | 7 | — | — |
| | Polyether ether ketone | — | 5 | — | — | — | — | — | — | — | 5 |
| | Bismaleimide | 2 | — | — | — | — | — | — | — | — | — |
| | Furan resin | — | — | 3 | — | — | — | — | — | — | — |
| | Cyanate ester resin | — | — | — | — | — | — | 2 | — | — | — |
| | Polyarylacetylene | — | — | — | — | — | — | — | — | 5 | — |

Operation 8: an insulating layer with a composition of bismaleimide is prepared on the surface of the graphene catadioptric layer obtained in operation 7 by a sealing glaze treatment, and the thickness of the insulating layer is 22 μm.

Sealing glaze treatment is a technical means for preparing an electrically insulating layer. In the sealing glaze treatment, soft wool or sponge is vibrated and rubbed at high speed by a vibrating polishing machine, so that the bismaleimide molecule is strongly permeated into the surface of The only difference between the preparation methods of Comparative Examples 1-10 and that of Test Example 1 is that the parameters as shown in Table 8-3 are different. The Comparative Example 11 uses the tin alloy weld material prepared in operation 1, that is, no coating layer is deposited on the surface of the tin alloy matrix.

The following experiments are performed using the tin alloy welds provided in Test Examples 1-20 and Comparative Examples 1-11:

1 High-Temperature Bonding Strength Test of Tin Alloy Welds:

1.1 Preparation of Tin Alloy Weld Materials

Figure 8:
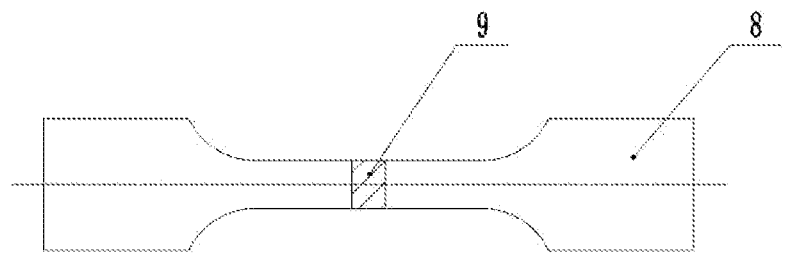
FIG. 8 is a schematic diagram of a tin alloy weld material test piece in an experiment of Embodiment 8 of the present disclosure.

As shown in FIG. 8, tensile test pieces are prepared. Two pieces of welding parent materials 8 are welded together using a welding equipment to form a tin alloy matrix 9. The coating layers are prepared on the surface of the tin alloy matrix 9 using the parameters provided in Test Examples 1-20 and Comparative Examples 1-10. Comparative Example 11 uses a tin alloy matrix without deposited coating layers.

The tensile test pieces are subjected to high temperature creep test by an electronic high temperature creep rupture strength test machine (model: RMT-D5). The maximum test load of the RMT-D5 electronic high temperature creep rupture strength test machine is 50 KN, the test load control accuracy is within ±5%, the deformation measuring range is 0-10 mm, the speed adjustment range is 0-50 mm/min-1, the deformation resolution is 0.001 mm, the temperature control range of high temperature furnace is 900-1200° C., and the uniform temperature zone length is 150 mm.

2.2 High-Temperature Tensile Strength Testing of Tin Alloy Welds

The tin alloy weld material test pieces prepared in test Examples 1-20 and Comparative Examples 1-11 are placed into the above test machine, and the test pieces are in a stress-free state (in a stress-free state, the test pieces can expand freely; the high-temperature creep means that the deformation increases with time under the combined action of temperature and stress, therefore, the heating rate has no influence on the creep). The test machine is adjusted to a temperature of 350° C., each test piece is tested for 5 times, and the tensile strength obtained each time is recorded, as shown in Table 8-4. In Table 8-4, a represents the average tensile strength (Mpa) of the test piece.

Figure 9:
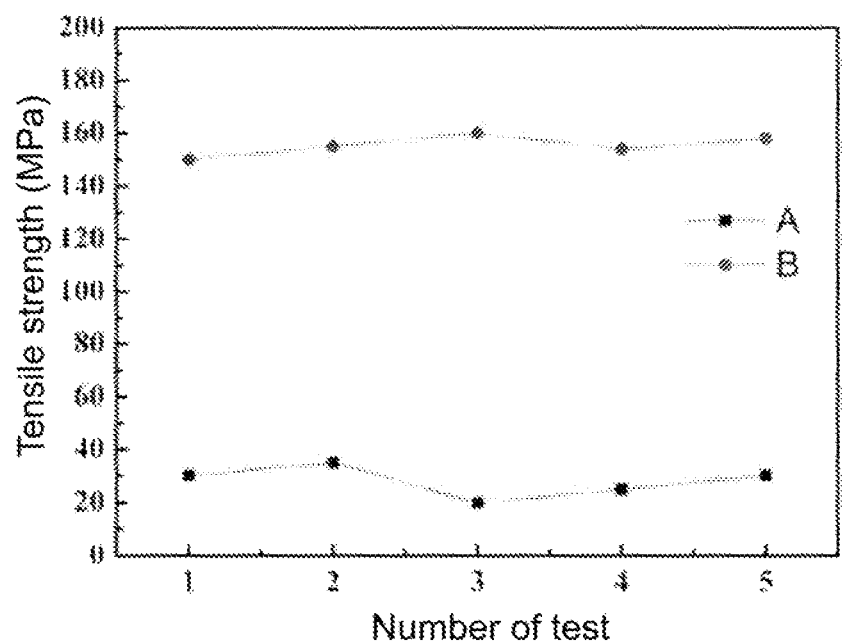
FIG. 9 shows high temperature tensile strength curves of Test Example 1 and Comparative Example 11 at 350° C. according to Embodiment 8 (ultralimit tin alloy weld material) of the present disclosure.

Take the tin alloy weld material test pieces prepared in Test Example 1 and Comparative Example 11 as examples. FIG. 9 shows the tensile strength curves of the tin alloy weld materials of Test Example 1 and Comparative Example 11. In FIG. 9, (A) represents the tin alloy matrix without deposited coating layers in Comparative Example 11, and (B) represents the tin alloy weld material with composite coating layers deposited on the surface using the parameters in Test Example 1. Mechanical performances of tin alloy weld materials under extreme temperature conditions are tested. Based on relevant literatures, the melting point temperature of S221 tin alloy is 220° C. Therefore, the test temperature is set to 350° C. The test results are as follows:

It can be seen from FIG. 9 that under the condition of 350° C., test piece (A) has very low tensile strength, and the tin alloy matrix without the coating layers deposited can hardly bear the load; the rupture of tin alloy matrix occurs when the load is less than 40 MPa. As for test piece (B), test piece (B) can maintain good mechanical properties under the condition of 350° C. and has excellent high-temperature resistance.

2. Salt-Spray Corrosion Test:

The tin alloy weld material test pieces prepared in Test Examples 1-20 and Comparative Examples 1-11 are processed into test pieces of 50 mm×25 mm×2 mm, and then subjected to degreasing, rust removal, cleaning and drying. YWX/Q-250B salt-spray corrosion tester serves as the test equipment, and an atmospheric corrosive environment of GB/T2967.3-2008 is simulated.

The test pieces provided by Test Examples 1-20 and Comparative Examples 1-11 are hung in the test equipment, the test equipment is adjusted to a temperature of 50±1° C. and pH of 3.0-3.1, and then the test pieces are continuously sprayed with NaCl solution with a concentration of 5±0.5%. The weight loss rate of the test pieces is recorded in Table 8-4 after a certain period of time (8, 24, 48, 72 h).

Figure 10:
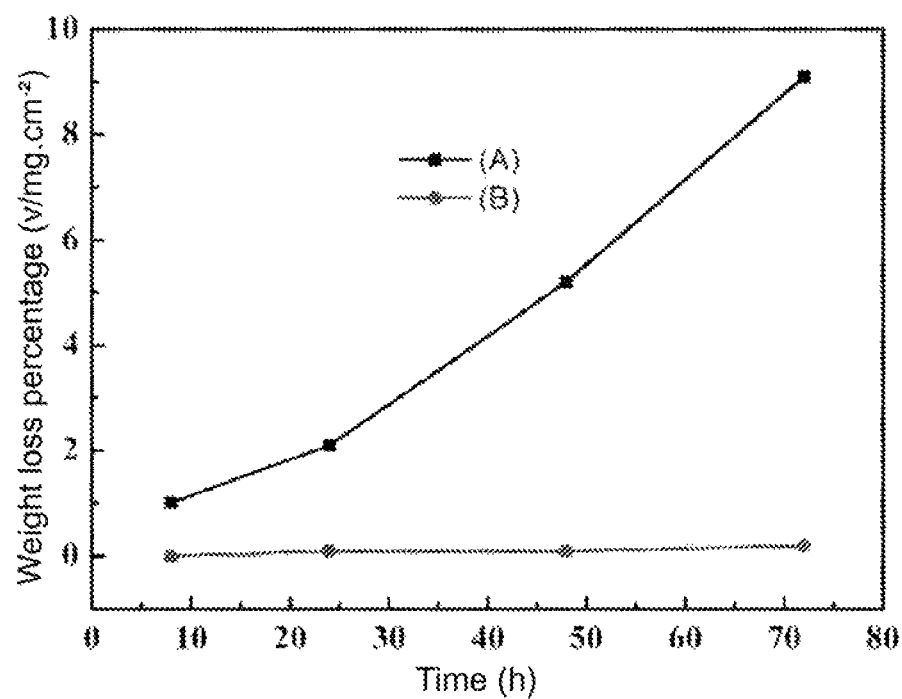
FIG. 10 shows experimental curves of the salt-spray corrosion test of Test Example 1 and Comparative Example 11 according to Embodiment 8 (ultralimit tin alloy weld material) of the present disclosure.

FIG. 10 shows the relationship curves between salt-spray corrosion weight loss and corrosion time of Test Example 1 and Comparative Example 11. In FIG. 10, (A) represents the tin alloy matrix without deposited coating layers in Comparative Example 11, and (B) represents the tin alloy weld material with deposited composite coating layers using the parameters in Test Example 1.

It can be seen from FIG. 3 that the two tin alloy weld materials have obviously different corrosion patterns. For test piece (A), the corrosion weight loss value tends to increase as the corrosion time extends. In the early stage of corrosion (8-24 h), there is an oxidation film on the surface of the test piece, which prevents the tin alloy weld material from contacting the solution; the corrosion rate is low. In the middle stage of corrosion (24-48 h), the Cl⁻ (chloridion) in the solution has penetrated the oxidation film, and a large amount of Cl⁻ is adsorbed on the matrix, which increases the corrosion pit points and deepens the original corrosion pit points; the corrosion rate is obviously accelerated. After 48 hours of continuous spraying, the corrosion products are evenly distributed and the thickness increases, covering almost the entire surface of the test piece. Cl⁻ needs to pass through the corrosion products to contact the tin alloy weld material, which reduces the amount of Cl⁻ adsorbed on the matrix surface and reduces the corrosion rate. Generally speaking, the corrosion weight loss of tin alloy matrix without deposited coating layers is much higher than that of tin alloy weld material with coating layers deposited on the surface. Basically, the tin alloy weld material has no corrosion due to the existence of the coating layers, and the mass of the tin alloy weld material has hardly changed.

In Table 8-4, a represents the average tensile strength (MPa) of the test piece;

b represents the weight loss (v/mg·cm²) of the test pieces after continuously spraying NaCl solution on the test pieces for 8 hours;

c represents the weight loss (v/mg·cm²) of the test pieces after continuously spraying NaCl solution on the test pieces for 24 hours; d represents the weight loss (v/mg·cm²) of the test pieces after continuously spraying NaCl solution on the test pieces for 48 hours; e represents the weight loss (v/mg·cm²) of the test pieces after continuously spraying NaCl solution on the test pieces for 72 hours.

TABLE 8-4

Experimental results of high-temperature tensile strength test and salt-spray test

|  | a | b | c | d | e |
| --- | --- | --- | --- | --- | --- |
| Test Example 1 | 155 | 0.01 | 0.03 | 0.06 | 0.1 |
| Test Example 2 | 152 | 0.01 | 0.03 | 0.06 | 0.1 |
| Test Example 3 | 150 | 0.01 | 0.03 | 0.06 | 0.1 |
| Test Example 4 | 142 | 0.02 | 0.032 | 0.064 | 0.12 |
| Test Example 5 | 148 | 0.01 | 0.03 | 0.06 | 0.1 |
| Test Example 6 | 150 | 0.01 | 0.03 | 0.06 | 0.1 |
| Test Example 7 | 153 | 0.01 | 0.03 | 0.06 | 0.1 |
| Test Example 8 | 154 | 0.01 | 0.03 | 0.06 | 0.1 |
| Test Example 9 | 150 | 0.01 | 0.03 | 0.06 | 0.1 |
| Test Example 10 | 155 | 0.01 | 0.03 | 0.06 | 0.1 |
| Test Example 11 | 155 | 0.01 | 0.03 | 0.06 | 0.1 |
| Test Example 12 | 149 | 0.01 | 0.03 | 0.06 | 0.1 |
| Test Example 13 | 149 | 0.01 | 0.03 | 0.06 | 0.1 |
| Test Example 14 | 145 | 0.01 | 0.03 | 0.06 | 0.1 |
| Test Example 15 | 145 | 0.01 | 0.03 | 0.06 | 0.1 |

TABLE 8-4-continued

Experimental results of high-temperature tensile strength test and salt-spray test

|  | a | b | c | d | e |
|---|---|---|---|---|---|
| Test Example 16 | 153 | 0.01 | 0.03 | 0.06 | 0.1 |
| Test Example 17 | 154 | 0.01 | 0.03 | 0.06 | 0.1 |
| Test Example 18 | 153 | 0.01 | 0.03 | 0.06 | 0.1 |
| Test Example 19 | 152 | 0.01 | 0.03 | 0.06 | 0.1 |
| Test Example 20 | 149 | 0.01 | 0.03 | 0.06 | 0.1 |
| Comparative Example 1 | 77 | 0.2 | 0.9 | 1.9 | 3.6 |
| Comparative Example 2 | 70 | 0.3 | 1 | 2 | 4.1 |
| Comparative Example 3 | 78 | 0.2 | 0.9 | 1.89 | 3.59 |
| Comparative Example 4 | 62 | 0.44 | 1.15 | 2.3 | 4.7 |
| Comparative Example 5 | 52 | 0.47 | 1.19 | 2.32 | 4.75 |
| Comparative Example 6 | 65 | 0.4 | 1.02 | 2.1 | 4.5 |
| Comparative Example 7 | 63 | 0.44 | 1.15 | 2.3 | 4.7 |
| Comparative Example 8 | 50 | 0.5 | 1.2 | 2.4 | 4.8 |
| Comparative Example 9 | 70 | 0.3 | 1 | 2 | 4.1 |
| Comparative Example 10 | 65 | 0.4 | 1.02 | 2.1 | 4.5 |
| Comparative Example 11 | 26 | 1.1 | 2.4 | 4.6 | 8.4 |

It can be seen from Table 8-4 that the tin alloy weld material obtained by the comparative examples beyond the parameter range of the present disclosure has a significant decrease in average tensile strength and has poor corrosion resistance.

In summary, by depositing a bonding layer, a ceramic layer, a seal coating layer, a reflecting layer, a catadioptric layer and an insulating layer on the tin alloy matrix, the service temperature of the tin alloy weld material can be increased to 100-500° C. higher than the original melting point. The corrosion resistance can be greatly improved as well. The ultralimit tin alloy weld material prepared by the ultralimit tin alloy preparation method of the present disclosure has a wide service temperature range and strong corrosion resistance; the effects of Test Example 1 are the best.

The descriptions above are merely embodiments of the present disclosure, and common knowledge such as specific structures and features that are well-known in the schemes will not be described in detail herein. It should be noted that for those skilled in the art, variations and improvements may be made without departing from the structure of the present disclosure, these variations and improvements are within the scope of the present disclosure, and will not affect the implementation effect or practicality of the present disclosure. The protection scope of the present disclosure is subject to the protection scope defined in claims. The specific embodiments of the present disclosure may be used to interpret the content of the claims.

The invention claimed is:

1. An ultralimit alloy, comprising an alloy matrix, wherein a composite bonding layer and a composite ceramic layer are successively deposited on a surface of the alloy matrix; the composite bonding layer includes a bonding layer deposited on the surface of the alloy matrix and a precious metal layer deposited on a surface of the bonding layer; the composite ceramic layer includes a ceramic A layer and a ceramic B layer; and the alloy matrix includes one of a magnesium alloy matrix, an aluminum alloy matrix, a nickel alloy matrix, a titanium alloy matrix, an iron alloy matrix, and a copper alloy matrix;

Wherein, a reflecting layer, a catadioptric layer, an insulating layer, and a carbon foam layer are successively deposited outside the composite ceramic layer.

2. The ultralimit alloy according to claim 1, wherein a composition of the bonding layer is one or more of MCrAlY, NiAl, NiCr—Al and Mo alloy;
MCrAlY is NiCrCoAlY, NiCoCrAlY, CoNiCrAlY or CoCrAlY; a composition of the precious metal layer is one of or an alloy of more of Au, Pt, Ru, Rh, Pd, and Ir.

3. The ultralimit alloy according to claim 1, wherein a composition of the ceramic A layer is YSZ or rare earth zirconate ($RE_2Zr_2O_7$), and a composition of the ceramic B layer is $ZrO_2$-$RETaO_4$, wherein the RE refers to a rare earth element.

4. The ultralimit alloy according to claim 1, wherein a composition of the reflecting layer is one or more of $REVO_4$, $RETaO_4$, and $Y_2O_3$ wherein the RE refers to a rare earth element.

5. The ultralimit alloy according to claim 1, wherein a composition of the catadioptric layer is one or two of graphene and boron carbide, and the spatial distribution of the graphene and boron carbide are in a disorderly arranged state.

6. The ultralimit alloy according to claim 1, wherein a composition of the insulating layer is one or more of epoxy resin, phenolic resin, and ABS resin.

7. The ultralimit alloy according to claim 1, wherein
a composition of the bonding layer is one or more of MCrAlY, NiAl, NiCr—Al and Mo alloy; MCrAlY is NiCrCoAlY, NiCoCrAlY, CoNiCrAlY or CoCrAlY; a composition of the precious metal layer is one of or an alloy of more of Au, Pt, Ru, Rh, Pd, and Ir;
a composition of the ceramic A layer is YSZ or rare earth zirconate ($RE_2Zr_2O_7$), and a composition of the ceramic B layer is $ZrO_2$-$RETaO_4$ wherein the RE refers to a rare earth element;
a composition of the reflecting layer is one or more of $REVO_4$, $RETaO_4$, and $Y_2O_3$, wherein the RE refers to a rare earth element;
a composition of the catadioptric layer is one or two of graphene and boron carbide, and the spatial distribution of the graphene and boron carbide are in a disorderly arranged state; and
a composition of the insulating layer is one or more of epoxy resin, phenolic resin, and ABS resin.

8. A method for preparing the ultralimit alloy according to claim 1, comprising the following operations:
operation 1: depositing a bonding layer on a surface of the alloy matrix; depositing a precious metal layer on a surface of the bonding layer, such that the bonding layer and the precious metal layer form a composite bonding layer;
operation 2: depositing a ceramic A layer and a ceramic B layer on a surface of the composite bonding layer obtained in operation 1, such that the ceramic A layer and the ceramic B layer form a composite ceramic layer;
operation 3: depositing a reflecting layer on a surface of the composite ceramic layer obtained in operation 2;
operation 4: depositing a catadioptric layer on a surface of the reflecting layer obtained in operation 3;
operation 5: depositing an insulating layer on a surface of the catadioptric layer obtained in operation 4;
operation 6: depositing a carbon foam layer on a surface of the insulating layer obtained in operation 5, to form the ultralimit alloy.

9. The method for preparing the ultralimit alloy according to claim 8, wherein in operation 2, the $ZrO_2$-$RETaO_4$ forming the ceramic B layer has a shape of powder, the $ZrO_2$-RETaO$_4$ powder has a particle size of 10-70 µm, and particles of the $ZrO_2$-RETaO$_4$ powder are spherical, wherein the RE refers to a rare earth element.

10. The method for preparing the ultralimit alloy according to claim 8, wherein in operation 1, before the depositing of the bonding layer, a surface of the alloy matrix is subjected to pretreatment, wherein the pretreatment includes removal of oil stains and impurities; after the surface of the alloy matrix is pretreated, the surface of the alloy matrix is shot peened, such that a surface roughness of the alloy matrix is 60-100 µm.

11. An ultralimit zirconium alloy, comprising a zirconium alloy matrix, wherein a surface of the zirconium alloy matrix is successively deposited with a bonding layer, a precious metal layer, a ceramic A layer, and a ceramic B layer;
wherein a thickness of the bonding layer is 50-150 µm, a thickness of the precious metal layer is 10-20 µm, a thickness of the ceramic A layer is 50-80 µm, and a thickness of the ceramic B layer is 50-80 µm; a surface of the ceramic B layer is successively deposited with a seal coating layer with a thickness of 5-10 µm, a reflecting layer with a thickness of 10-15 µm, a catadioptric layer with a thickness of 10-15 µm, and an electrically insulating layer with a thickness of 15-20 µm.

12. The ultralimit zirconium alloy according to claim 11, wherein a composition of the bonding layer is MCrAlY, wherein MCrAlY is CoCrAlY, NiCoCrAlY or CoNiCrAlY; a composition of the precious metal layer is one of or an alloy of more of Pt, Ru, Rh, Pd, Ir, and Os.

13. A method for preparing the ultralimit zirconium alloy according to claim 11, comprising the following operations:
operation 1: depositing a bonding layer with a thickness of 50-150 µm on a surface of the zirconium alloy matrix;
operation 2: depositing a precious metal layer with a thickness of 10-20 µm on a surface of the bonding layer;
operation 3: depositing a ceramic A layer with a thickness of 50-80 µm on a surface of the precious metal layer;
operation 4: depositing a ceramic B layer with a thickness of 50-80 µm on a surface of the ceramic A layer;
operation 5: depositing a seal coating layer with a thickness of 5-10 µm on a surface of the ceramic B layer;
operation 6: depositing a reflecting layer with a thickness of 10-15 µm on a surface of the seal coating layer;
operation 7: depositing a catadioptric layer with a thickness of 10-15 µm on a surface of the reflecting layer; and
operation 8: depositing an electrically insulating layer with a thickness of 15-20 µm on a surface of the catadioptric layer, to prepare the ultralimit zirconium alloy.

14. The method for preparing the ultralimit zirconium alloy according to claim 13, wherein in operation 1, before the depositing of the bonding layer, oil stains on a surface of the zirconium alloy matrix are removed; the surface of the zirconium alloy matrix is then sandblasted, such that a surface roughness of the zirconium alloy matrix is 60-100 µm.

15. An ultralimit tin alloy, wherein the ultralimit tin alloy is a weld material, comprising a tin alloy matrix, wherein a surface of the tin alloy matrix is successively deposited with a bonding layer, a ceramic layer, and a seal coating layer;
wherein a thickness of the bonding layer is 50-180 µm, a thickness of the ceramic layer is 50-80 µm, a thickness of the seal coating layer is 5-15 µm; the seal coating layer is successively deposited with a reflecting layer with a thickness of 5-15 µm, a catadioptric layer with a thickness of 5-15 µm, and an insulating layer with a thickness of 10-25 µm.

16. A method for preparing the ultralimit tin alloy according to claim 15, comprising the following operations:
operation 1: depositing a bonding layer on a surface of a tin alloy matrix, and a thickness of the bonding layer is 50-180 µm;
operation 2: preparing a ceramic layer on a surface of the bonding layer obtained in operation 1, and a thickness of the ceramic layer is 50-80 µm;
operation 3: preparing a seal coating layer on a surface of the ceramic layer obtained in operation 2, and a thickness of the seal coating layer is 5-15 µm;
operation 4: preparing a reflecting layer on a surface of the seal coating layer obtained in operation 3, and a thickness of the reflecting layer is 5-15 µm;
operation 5: preparing a catadioptric layer on a surface of the reflecting layer obtained in operation 4, and a thickness of the catadioptric layer is 5-15 µm; and
operation 6: preparing an insulating layer on a surface of the catadioptric layer obtained in operation 5, and a thickness of the insulating layer is 10-25 µm.

17. The method for preparing the ultralimit tin alloy according to claim 16, wherein in operation 1, before the depositing of the bonding layer, the surface of the tin alloy matrix is sandblasted, and then the surface of the tin alloy matrix after the sandblasting is subjected to a dust removal process; the tin alloy weld material deposited with a plurality of coating layers by operations 1-6 is allowed to stand for 5-10 hours at 50-80° C. for aging treatment.

\* \* \* \* \*